(12) United States Patent
Goto

(10) Patent No.: US 8,390,036 B2
(45) Date of Patent: Mar. 5, 2013

(54) IMAGE PICKUP DEVICE AND IMAGE PICKUP APPARATUS

(75) Inventor: Takashi Goto, Kanagawa (JP)

(73) Assignee: Fujifilm Corporation (JP)

( * ) Notice: Subject to any disclaimer, the term of this patent is extended or adjusted under 35 U.S.C. 154(b) by 294 days.

(21) Appl. No.: 12/872,857

(22) Filed: Aug. 31, 2010

(65) Prior Publication Data
US 2011/0049665 A1    Mar. 3, 2011

(30) Foreign Application Priority Data

Sep. 1, 2009  (JP) ................................. 2009-202087

(51) Int. Cl.
*H01L 27/146* (2006.01)
*H01L 27/148* (2006.01)

(52) U.S. Cl. .................. 257/214; 257/448; 257/E27.13; 257/E27.158; 257/E31.124

(58) Field of Classification Search ............. 257/72, 257/222, 223, 443, 444, E27.13, E27.134, 257/214, 431, 440, 448, E27.158, E31.124
See application file for complete search history.

(56) References Cited

U.S. PATENT DOCUMENTS

| | | | |
|---|---|---|---|
| 5,965,875 A | 10/1999 | Merrill | |
| 6,606,120 B1 | 8/2003 | Merrill et al. | |
| 6,630,612 B2 | 10/2003 | Allan et al. | |
| 6,689,491 B1 | 2/2004 | Nii et al. | |
| 7,564,494 B2 * | 7/2009 | Ikeda et al. | 348/311 |
| 7,675,096 B2 * | 3/2010 | Takahashi et al. | 257/292 |
| 2009/0080046 A1 * | 3/2009 | Ogikubo | 359/199 |

FOREIGN PATENT DOCUMENTS

| | | |
|---|---|---|
| JP | 2002-502120 | 1/2002 |
| JP | 2002-083946 | 3/2002 |
| JP | 2002-513145 | 5/2002 |
| JP | 4213832 B2 | 11/2008 |

\* cited by examiner

*Primary Examiner* — Evan Pert
(74) *Attorney, Agent, or Firm* — Studebaker & Brackett PC; Donald R. Studebaker

(57) ABSTRACT

An image pickup device includes a plurality of first electrodes, a second electrode, a third electrode, a photoelectric conversion layer, a plurality of signal reading portions, at least one of electric potential adjusting portions. The plurality of first electrodes is arranged on an upper side of a substrate in two dimensions with a predetermined gap interposed between one of the first electrodes and another first electrode adjacent to the one of the first electrodes. The second electrode is arranged next to the first electrodes arranged on an outermost side of the first electrodes with the predetermined gap interposed between the first electrodes arranged on the outermost side and the second electrode. The third electrode faces both of the plurality of first electrodes and the second electrode. The photoelectric conversion layer is disposed between the plurality of first electrodes and the second electrode and the third electrode.

10 Claims, 29 Drawing Sheets

1 FORMATION OF PERIPHERAL LIGHT SHIELDING LAYER

2 FORMATION OF PHOTO RESIST

3 BACK EXPOSURE/DEVELOPMENT/POST-BACKING

4 DRY ETCHING

5 DELAMINATION OF PHOTO RESIST

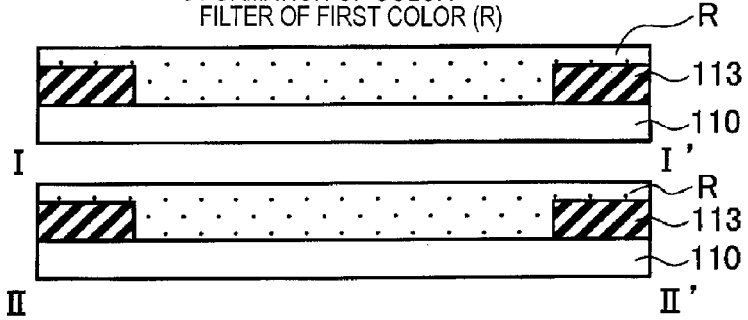
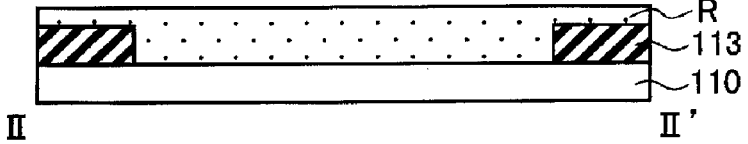
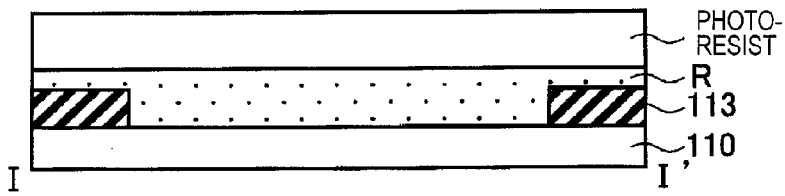
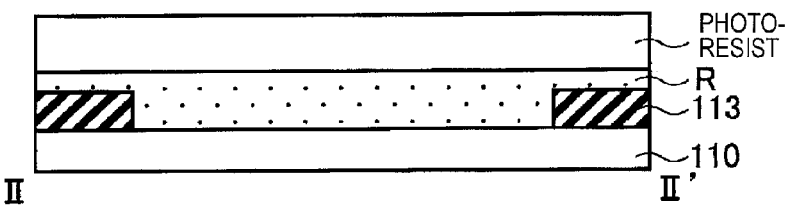
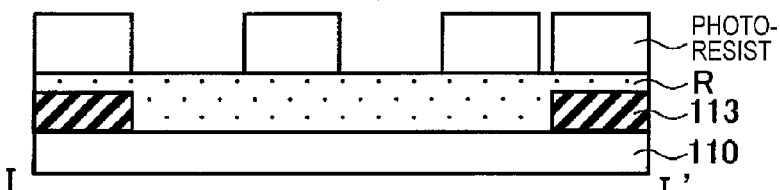
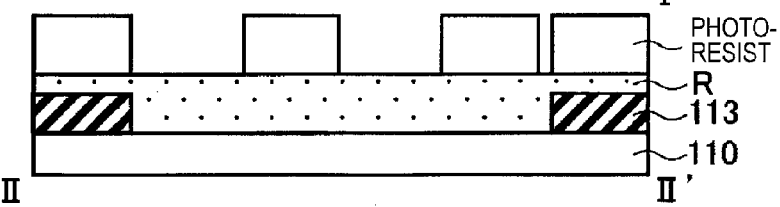

9 DRY ETCHING

10 DELAMINATION OF PHOTO RESIST

11 FORMATION OF COLOR FILTER OF SECOND COLOR (B)

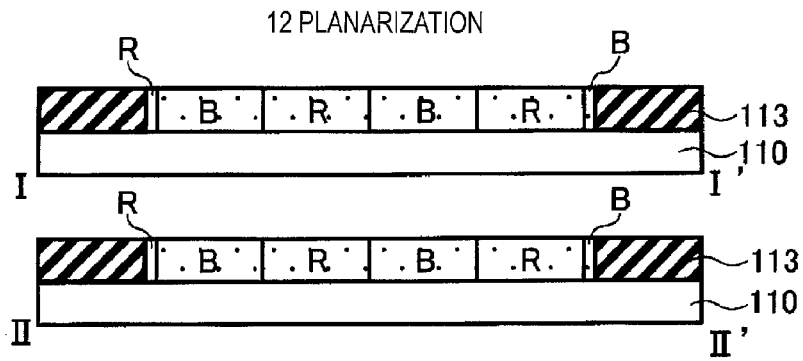
FIG. 47A
FIG. 47B
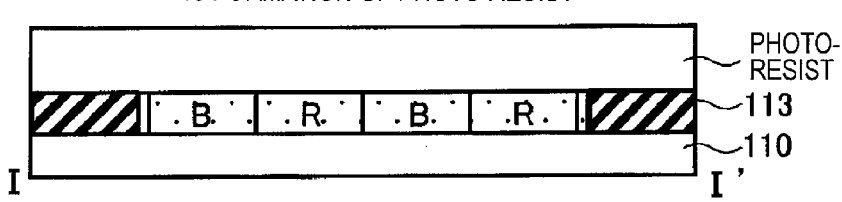
FIG. 48A
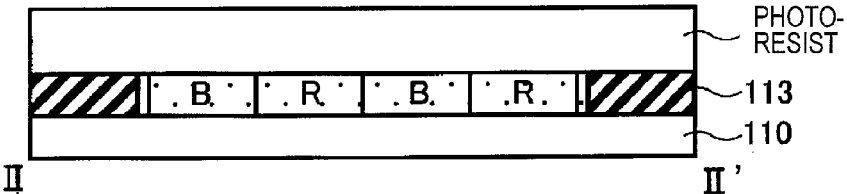
FIG. 48B
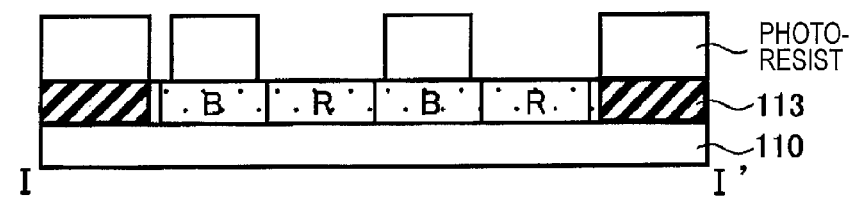
FIG. 49A
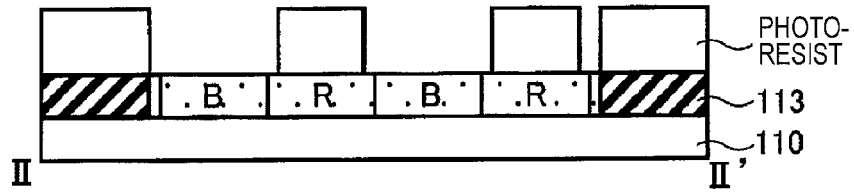
FIG. 49B

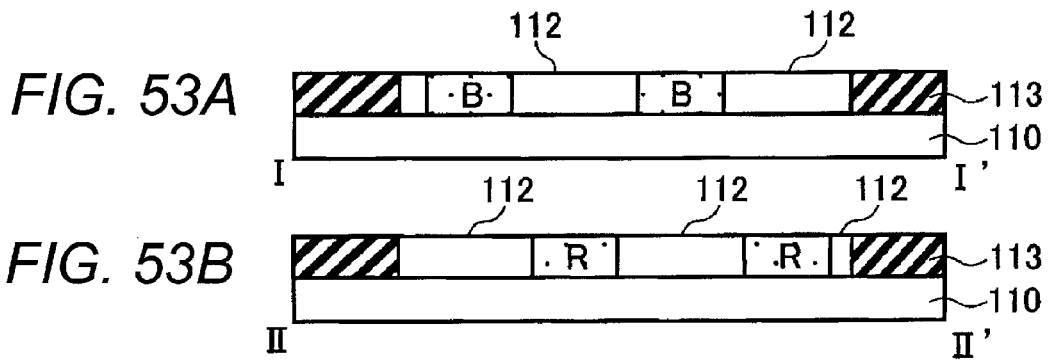
FIG. 53A
FIG. 53B
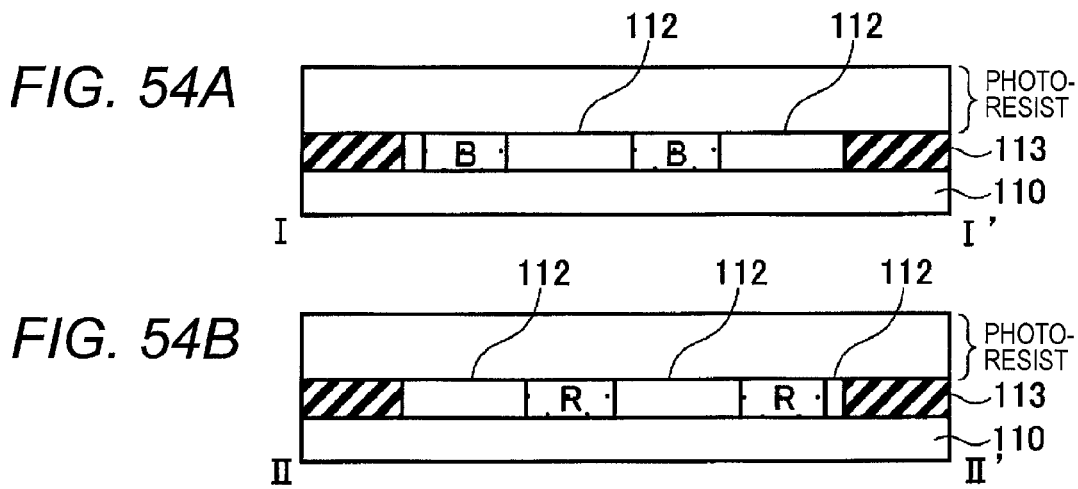
FIG. 54A
FIG. 54B
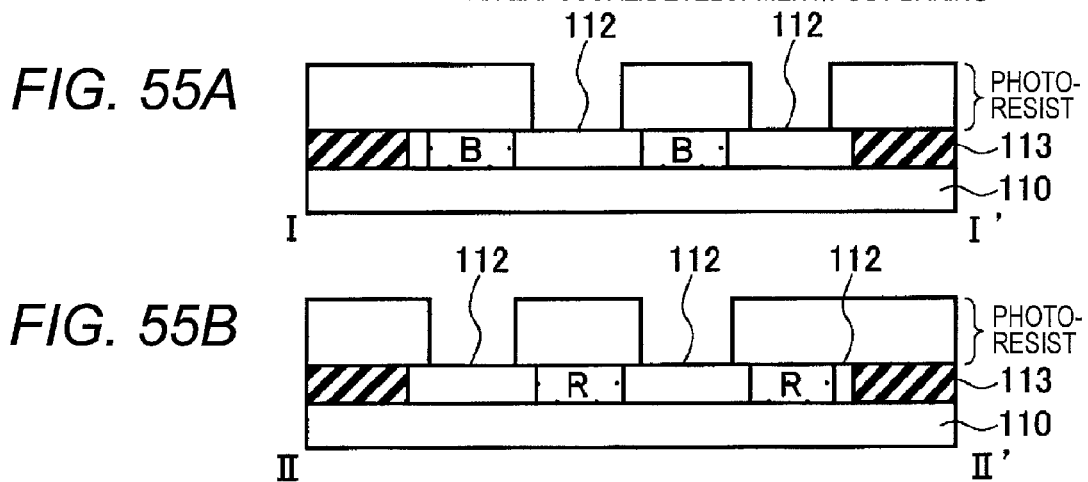
FIG. 55A
FIG. 55B 21 DRY ETCHING
FIG. 56A
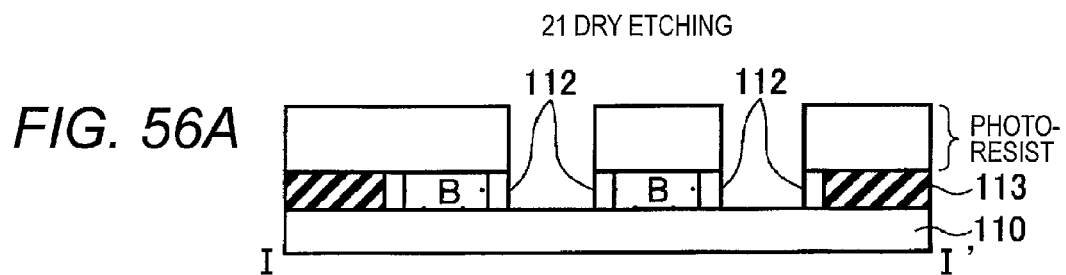
FIG. 56B
22 DELAMINATION OF PHOTO RESIST
FIG. 57A
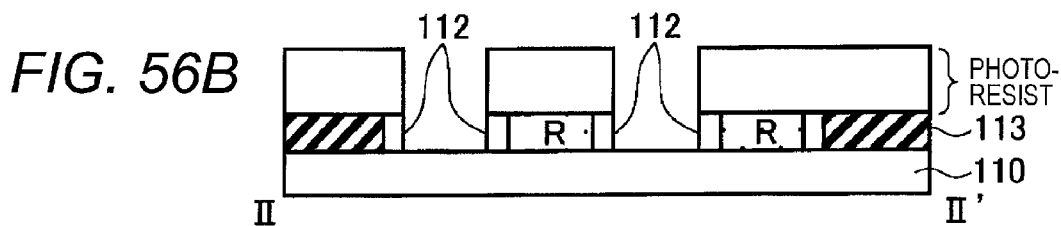
FIG. 57B
23 FORMATION OF COLOR FILTER OF THIRD COLOR (G)
FIG. 58A
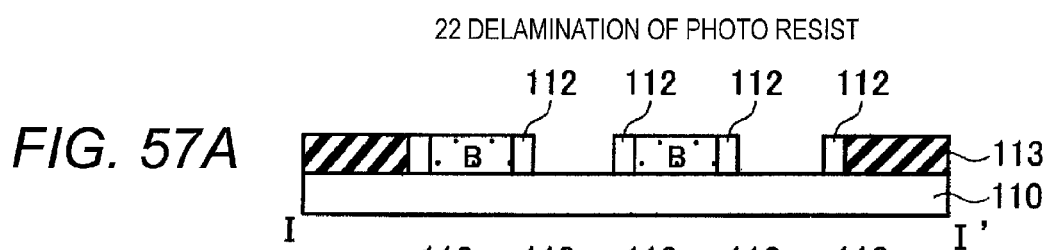
FIG. 58B
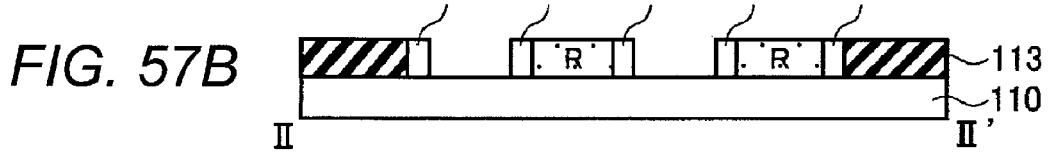

IMAGE PICKUP DEVICE AND IMAGE PICKUP APPARATUS

CROSS-REFERENCE TO RELATED APPLICATIONS

This application is based upon and claims the benefit of priority from Japanese Patent Application No. 2010-202087, filed Sep. 1, 2009.

BACKGROUND

1. Technical Field

The present invention relates to a stacked-type image pickup device having a photoelectric conversion layer on the upper side of a substrate and an image pickup apparatus including the image pickup device.

2. Related Art

In a single-plate image pickup device that is mainly represented by a CCD image sensor or a CMOS image sensor, color signals corresponding to color filters are output from pixel portions through three or four types of mosaic-shaped color filters that are disposed on the upper side of the arrangement of the pixel portions (photo diodes) that perform photoelectric conversion. The color signals output from the single-plate image pickup device are processed so as to generate color image data. However, when the mosaic-shape filters are filters of primary colors, about ⅔ of incident light is absorbed by the color filters. Accordingly, in a single-plate image pickup device in which the mosaic-shaped color filters are disposed, the light use efficiency in each pixel portion is low, and it is difficult to raise the sensitivity. In addition, since only a color signal of one color is acquired in each pixel portion, it is difficult to increase the resolution, and a false color is generated.

Thus, in order to address such cases, for example, an image pickup device disclosed in JP-T-2002-513145 is developed. According to this image pickup device, by arranging three-folded wells (photo diodes) that detect an optical signal within a silicon substrate, signals (having peak values at the wavelengths of blue, green, and red on the surface) having different spectral sensitivities in accordance with a difference in the depths of the silicon substrate may be acquired. According to this image pickup device, the resolution is good, and the light use efficiency is improved. However, the separation of spectral sensitivity characteristics of RGB output signals is not sufficient, and color reproducibility deteriorates. In addition, in order to acquire real RGB signals, addition and subtraction of the output signals are performed. However, the S/N deteriorates due to the addition or the subtraction.

Accordingly, as in JP-T-2002-502120 and JP-A-2002-83946, image pickup devices that may separate the spectral sensitivity characteristics of the RGB output signals well are researched and developed. In such image pickup devices, each pixel portion has a structure in which photoelectric conversion layers sequentially generating signal electric charge for light of B, G, R are sequentially stacked, for example, from the light incident side. Then, in each pixel portion, a reading portion that may independently read out a signal corresponding to electric charge generated by light in each photoelectric conversion layer is disposed integrally with the pixel portion. In such an image pickup device, since any color filter is not placed on the upper side of each pixel portion, the use efficiency of visible light may be configured to be almost 100%. In addition, since a structure in which three photoelectric conversion layers are stacked is used, color signals of three colors of R, G, and B may be acquired in each pixel portion. Furthermore, the spectral sensitivity characteristics of the three photoelectric conversion layers may be independently selected. Accordingly, separation of the spectral sensitivity characteristics of the RGB output signals is good. As a result, an image having high sensitivity, high resolution (a false color is not visually recognizable), excellent color reproducibility, and good S/N may be acquired.

The inventor of the present invention has found a disadvantage in that unevenness occurs in an image due to the structure in a stacked-type image pickup device as disclosed in JP-T-2002-502120 and JP-A-2002-83946. Hereinafter, the disadvantage will be described with reference to the drawings.

FIG. 61 is a schematic diagram showing the cross-section of a stacked-type image pickup device that is conventionally proposed. The image pickup device shown in FIG. 61 includes a plurality of pixel portions P arranged in a two dimensional shape. Each pixel portion P includes a substrate 1, an insulating layer 2, a photoelectric conversion layer 3, an opposing electrode 4, a pixel electrode 5, a connection portion 6, and a signal reading portion 7. The pixel electrode 5 is disposed on the insulating layer 2 disposed on the substrate 1 and is separated for each pixel portion P. The photoelectric conversion layer 3 is disposed on the pixel electrode 5, and one photoelectric conversion layer 3 that is common to all the pixel portions P is configured. The opposing electrode 4 is disposed on the photoelectric conversion layer 3, and one opposing electrode 4 that is common to all the pixel portions P is configured. The signal reading portion 7 is formed in the substrate 1 and is configured by an MOS circuit or the like. The connection portion 6 is formed from a conductive material that electrically connects the pixel electrode 5 and the signal reading portion 7 to each other. In the pixel portion of the image pickup device, by applying an electric field between the opposing electrode 4 and the pixel electrode 5, the electric charge (electrons or holes) generated in the photoelectric conversion layer 3 moves to the pixel electrode 5. Then, a signal corresponding to the electric charge moved to the pixel electrode 5 is read out by the signal reading portion 7 and is externally output.

FIG. 62 is a diagram of the image pickup device shown in FIG. 61 viewed from the top face. In FIG. 62, the opposing electrode 4 is not shown. As shown in FIG. 62, a plurality of pixel portions P is arranged in a tetragonal lattice shape. The partitioned area of each pixel portion P is a square. The pixel electrode 5 included in each pixel portion P is in the shape of a square that is smaller than the pixel portion P and is disposed in the center of the partitioned area of the pixel portion P. In addition, the pixel electrodes 5 of the pixel portions P, similarly to the pixel portions P, are arranged in a tetragonal lattice shape. Accordingly, the distances between adjacent pixel electrodes 5 are the same in all the pixel portions. In FIG. 62, the pixel electrodes, which are positioned on the outermost side, out of a plurality of the pixel electrodes are denoted by white beta blocks that are not hatched.

When focused on one pixel portion P, there is a gap between the pixel electrode 5 included in the pixel portion P and the end portion of the pixel portion P, and a weak electric field is applied between the gap. Accordingly, electric charge generated in this gap move to the pixel electrode 5 and is converted into a signal. Therefore, as signals output from the pixel portion P, there are not only a signal corresponding to the electric charge generated in the photoelectric conversion layer 3 between the pixel electrode 5 and the opposing electrode 4 but also a signal corresponding to the electric charge generated in this gap.

Regarding the pixel electrode 5 that is hatched in FIG. 62, four sides of the pixel portion P including the pixel electrode 5 are brought into contact with other pixel portions P. Accordingly, there is no electric charge that move to the pixel electrode 5 from the outside of the pixel portion P including the pixel electrode 5. However, regarding the pixel electrode 5 that is not hatched in FIG. 62, one or two out of the four sides of the pixel portion P (the pixel portion P positioned on the outermost periphery) including the pixel portion 5 are not brought into contact with other pixel portions P, and electric charge moves to the pixel electrode 5 from the photoelectric conversion layer 3 that is located on the further outer side of the pixel portion P that is positioned on the outermost periphery.

Accordingly, in the pixel portion P, which is positioned on the outermost periphery, out of the plurality of pixel portions P, the electric charge collected in the pixel electrode 5 is more than the electric charge of the pixel portion P (the pixel portion P including the pixel electrode 5 that is hatched) located on the inner periphery (see FIG. 62). Accordingly, the electric potential of the pixel electrode 5 rises (or drops). Regarding the pixel portions P (the pixel portions P located on the outermost end) located on four corners out of the pixel portions P located on the outermost periphery, other pixel portions P are brought into contact with only two sides of the pixel portions P, and accordingly, particularly the electric potentials thereof rise (or drop). As a result, an image that is based on the signal output from the image pickup device is as shown in FIG. 63.

FIG. 63 is a diagram representing an example of a picked-up image that may be acquired when an image pickup operation is performed at a constant amount of light by using the image pickup device shown in FIGS. 61 and 62. As shown in FIG. 63, in the image picked up at a constant amount of light, pixels, which are located on the outer periphery, corresponding to the pixel portions P located on the outermost periphery are brighter than pixels located, which are located, on the inner periphery, corresponding to the pixel portions P located on the inner periphery, thereby unevenness of the image occurs. Particularly, the pixels, which are located on the outermost end, corresponding to the pixel portions P located on the outermost end are the brightest.

In addition, in the image pickup device shown in FIGS. 61 and 62, by not using signals read out from the pixel portions P located on the outermost periphery as image signals, the unevenness of the image may be considered to be suppressed. However, even when the signals read out from the pixel portions P located on the outermost periphery are not used as image signals, the image quality may deteriorate. The reason is as follows. When the electric potential of the pixel electrode 5 exceeds an ordinary range, electric charge is over flown from the pixel electrode 5, and such electric charge may have influence on the electric potential of the pixel electrode 5 of the pixel portion P located on the inner periphery. As miniaturization advances, the gap between the pixel electrodes 5 becomes narrower, and the deterioration of the image quality due to such a factor is considered to easily occur.

In JP-T-2002-502120 and JP-A-2002-83946, the disadvantage of deterioration of the image quality caused by the structure of such a stacked type image pickup device is not fully touched. In addition, any configuration that may address such a disadvantage is not used.

SUMMARY OF THE INVENTION

According to an aspect of the invention, an image pickup device includes a plurality of first electrodes, a second electrode, a third electrode, a photoelectric conversion layer, a plurality of signal reading portions, at least one of electric potential adjusting portions. The plurality of first electrodes is arranged on an upper side of a substrate in two dimensions with a predetermined gap interposed between one of the first electrodes and another first electrode adjacent to the one of the first electrode. The second electrode is arranged next to the first electrodes arranged on an outermost side of the first electrodes with the predetermined gap interposed between the first electrodes arranged on the outermost side and the second electrode. The third electrode faces both of the plurality of first electrodes and the second electrode. The photoelectric conversion layer is disposed between the plurality of first electrodes and the second electrode and the third electrode. The plurality of signal reading portions is connected to the plurality of first electrodes and reads out signals corresponding to electric charge that is generated in the photoelectric conversion layer and moved to the plurality of first electrodes. The at least one of electric potential adjusting portions that is connected to the second electrode and adjusts electric potential of the second electrode such that the electric potential of the second electrode determined in accordance with electric charge that is generated in the photoelectric conversion layer and moved to the second electrode is not beyond a predetermined range.

BRIEF DESCRIPTION OF THE DRAWINGS

FIGS. 41A and 41B are diagrams representing a state in which a color filter of the first color is formed as a film.

FIGS. 42A and 42B are diagrams representing a state in which a photo resist is formed on the color filter of the first color as a film.

FIGS. 43A and 43B are diagrams representing a state in which patterned exposure, development, and post-baking are performed for the photoresist.

FIGS. 47A and 47B are diagrams representing a state in which the color filters of the first and second colors are planarized.

FIGS. 48A and 48B are diagrams representing a state in which a photo resist is formed on the color filters of the first and second colors as a film.

FIGS. 49A and 49B are diagrams representing a state in which pattern exposure, development, and post-baking are performed for the photo resist.

FIGS. 53A and 53B are diagrams representing a state in which the color filters of the first and second colors and the partition wall are planarized.

FIGS. 54A and 54B are diagrams representing a state in which a photoresist is formed on the color filters of the first and second colors and the partition wall as a film.

FIGS. 55A and 55B are diagrams representing a state in which pattern exposure, development, and post-baking are performed for the photo resist.

FIGS. 56A and 56B are diagrams representing a state in which the area of the color filter of the third color is formed by etching a part of the partition wall.

FIGS. 57A and 57B are diagrams representing a state in which the photoresist is delaminated.

FIGS. 58A and 58B are diagrams representing a state in which the color filter of the third color is formed as a film.

DETAILED DESCRIPTION

Hereinafter, exemplary embodiments of the present invention will be described with reference to drawings.

Figure 1:
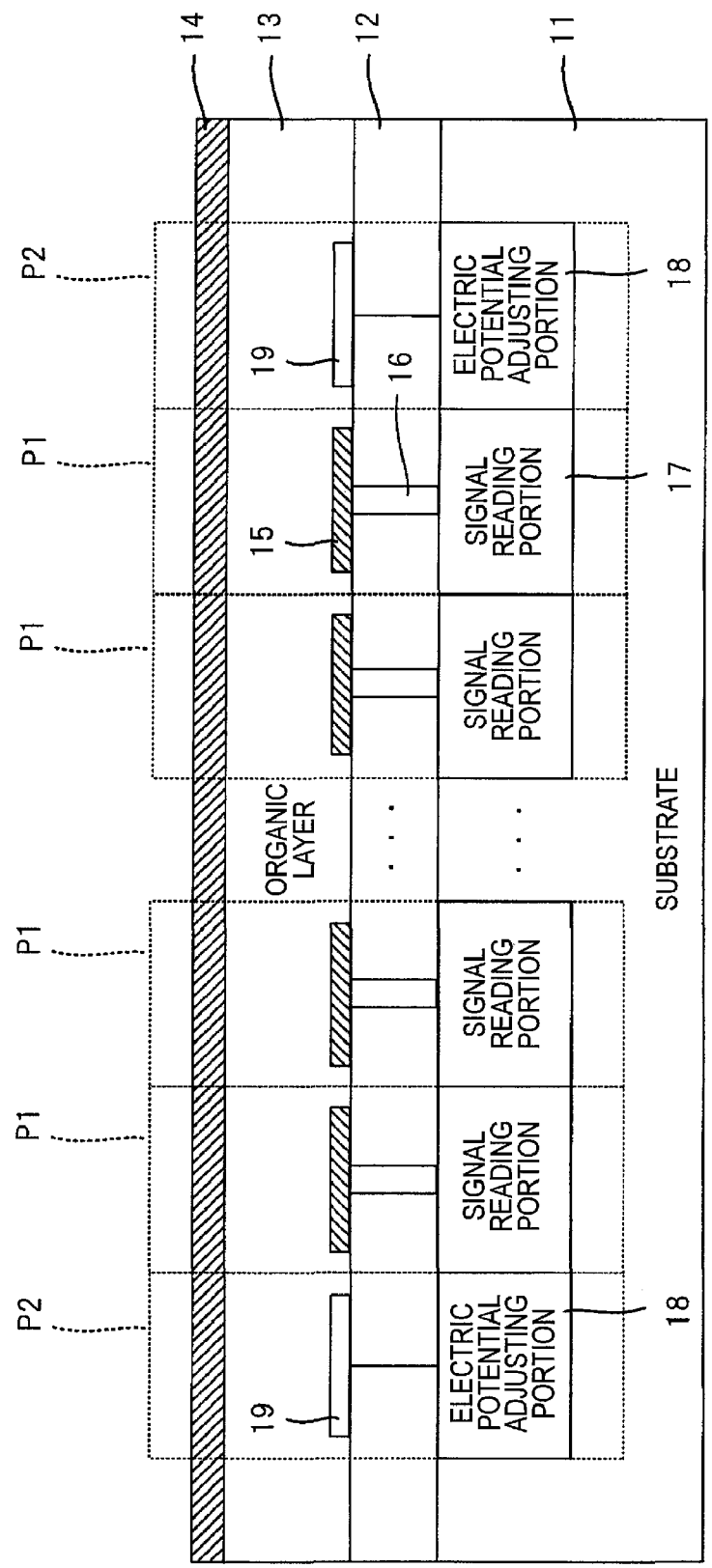
FIG. 1 is a schematic diagram representing the cross section of an image pickup device according to an exemplary embodiment of the present invention.

FIG. 1 is a schematic diagram representing the cross section of an image pickup device according to an exemplary embodiment of the present invention. The image pickup device represented in FIG. 1 includes: a substrate 11; an insulating layer 12; an organic layer 13; an opposing electrode 14; a plurality of electrodes (a plurality of pixel electrodes 15 and a plurality of electric potential adjusting electrodes 19); a connection portion 16; a signal reading portion 17; and an electric potential adjusting portion 18.

The substrate 11 is a glass substrate or a semiconductor substrate formed from silicon or the like. On the substrate 11, the insulating layer 12 is formed. In addition, on the insulating layer 12, the plurality of electrodes is formed.

Figure 2:
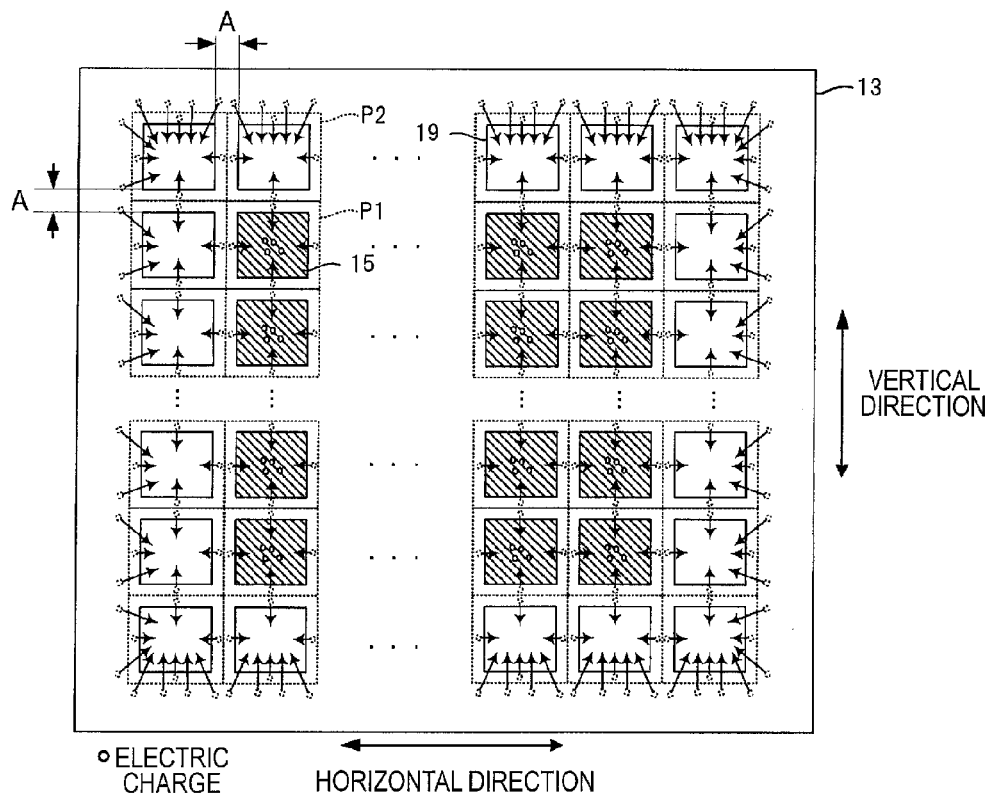
FIG. 2 is a diagram of the image pickup device represented in FIG. 1 viewed from the top side. The opposing electrode 14 is not shown in FIG. 2.

FIG. 2 is a diagram of the image pickup device represented in FIG. 1 viewed from the top side. The opposing electrode 14 is not shown in FIG. 2.

The plurality of electrodes is arranged with a predetermined gap A interposed therebetween in two dimensions (in the example represented in FIG. 2, a square lattice shape) in a horizontal direction of the surface of the insulating layer 12 and a direction orthogonal thereto. Of the plurality of electrodes, electrodes that are positioned on the outermost side are the electric potential adjusting electrodes 19, and the other electrodes are the pixel electrodes 15.

The organic layer 13 includes at least a photoelectric conversion layer that is formed from an organic photoelectric conversion material that generates an electric charge in accordance with light received. The organic layer 13 is disposed on the pixel electrode 15 and the electric potential adjusting electrode 19 so as to cover the electrodes.

The opposing electrode 14 is an electrode that faces the pixel electrode 15 and the electric potential adjusting electrode 19 and is disposed on the organic layer 13. In order to allow light to be incident to the organic layer 13, the opposing electrode 14 is composed of a conductive material that is transparent to the incident light. A predetermined voltage may be applied to the opposing electrode 14 through a wiring not shown in the figure. Accordingly, an electric field may be applied between the opposing electrode 14 and the plurality of electrodes (the pixel electrode 15 and the electric potential adjusting electrode 19).

In FIGS. 1 and 2, blocks (blocks that are denoted by broken lines in the figures) that are partitioned by straight lines that join points spaced apart from two sides, which are located in end portions of the electrodes (the pixel electrode 15 and the electric potential adjusting electrode 19) in the vertical direction by a half of the gap A between the electrodes, and points spaced apart from two sides, which are located in end portions of the electrodes in the horizontal direction by a half of the gap A between the electrodes, are defined as pixel portions. A pixel portion that includes the pixel electrode 15 is set as a standard pixel portion P1, and a pixel portion that includes the electric potential adjusting electrode 19 is set as a peripheral pixel portion P2.

The pixel electrode 15 is a charge collecting electrode that is used for collecting electric charge generated in the photoelectric conversion layer positioned within the organic layer 13 that is included in the standard pixel portion P1. The signal reading portion 17 is disposed in accordance with each of the plurality of pixel electrodes 15 and outputs a signal corresponding to the electric charge collected in the corresponding pixel electrode 15. The signal reading portion 17, for example, is configured by a CCD, a MOS transistor circuit (MOS circuit), a TFT circuit, or the like. The connection portion 16 connects the pixel electrode 15 and the signal reading portion 17 corresponding thereto to each other. The connection portion 16 is composed of a conductive material that is buried in the insulating layer 12.

Figure 3:
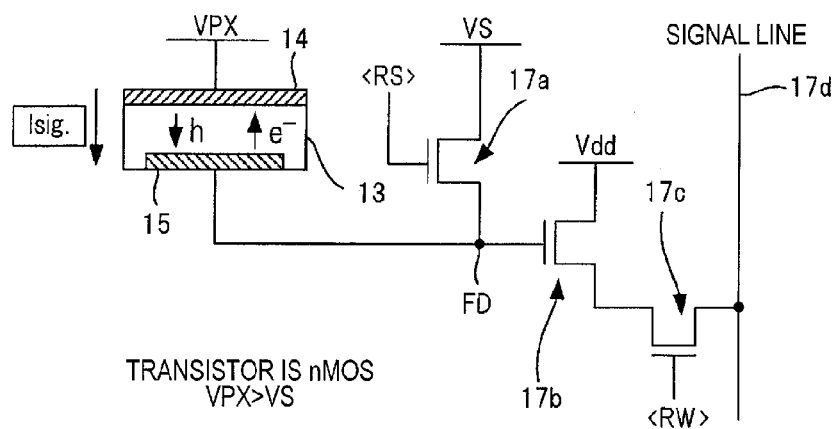
FIG. 3 is a diagram representing a configuration example in a case where a MOS circuit is used as the signal reading portion 17 in the image pickup device represented in FIG. 1.

FIG. 3 is a diagram representing a configuration example in a case where a MOS circuit is used as the signal reading portion 17 in the image pickup device represented in FIG. 1. In FIG. 3, a same reference sign is assigned to a same constituent element as that shown in FIG. 1.

The signal reading portion 17 shown in FIG. 3 includes a floating diffusion FD, a reset transistor 17a, an output transistor 17b, and a selection transistor 17c. The reset transistor 17a, the output transistor 17b, and the selection transistor 17c are respectively configured by an n-channel MOS transistor (hereinafter, referred to as an nMOS transistor).

The floating diffusion FD is electrically connected to the pixel electrode 15. Thus, the electric potential of the floating diffusion FD changes in accordance with the electric potential of the pixel electrode 15. In the example shown in FIG. 3, a voltage VPX applied to the opposing electrode 14 is set such that a signal current Isig flows inside the organic layer 13 during an exposure period from the opposing electrode 14 toward the pixel electrode 15 (in other words, holes generated in the photoelectric conversion layer inside the organic layer 13 are collected in the pixel electrode 15). Accordingly, during the exposure period, by allowing the signal current Isig to flow through the pixel electrode 15, the electric potential of the pixel electrode 15 increases. In accordance with the increase in the electric potential of the pixel electrode 15, the electric potential of the floating diffusion FD increases.

The reset transistor 17a is used for resetting the electric potential of the floating diffusion FD to a predetermined electric potential. The reset transistor 17a has a drain terminal that is electrically connected to the floating diffusion FD and a source terminal to which a voltage VS is supplied. When the reset pulse RS applied to the gate terminal of the reset transistor 17a reaches the high level, the reset transistor 17a is turned on, and electrons are injected from the source to the drain of the reset transistor 17a. The electric potential of the floating diffusion FD drops due to the electrons, and the electric potential of the floating diffusion FD is reset to the predetermined electric potential. The voltage VS is set to be lower than the voltage VPX. Accordingly, the signal current Isig flows from the opposing electrode 14 toward the pixel electrode 15 during the exposure period. Under such a configuration, the electric potential of the pixel electrode 15 may rise from the voltage VS up to the voltage VPX, and accordingly, a signal may be read out in the range.

The output transistor 17b converts the electric potential of the floating diffusion FD into a voltage signal and outputs the voltage signal. In other words, the output transistor 17b outputs a signal corresponding to the electric charge collected in the pixel electrode 15. The output transistor 17b has a gate terminal that is electrically connected to the floating diffusion FD and a drain terminal to which a source voltage Vdd is supplied. In addition, the source terminal of the output transistor 17b is connected to the drain terminal of the selection transistor 17c.

The selection transistor 17c is used for selectively outputting the output signal of the output transistor 17b to a signal line 17d. The selection transistor 17c has a source terminal that is connected to the signal line 17d. When a selection pulse RW that is applied to the gate terminal of the selection transistor 17c becomes the high level, the selection transistor 17c is turned on. Accordingly, the voltage signal converted by the output transistor 17b is output to the signal line 17d.

Under such a circuit configuration, the signal reading portion 17 may read a signal corresponding to the electric charge collected in the pixel electrode 15 into the signal line 17d.

In the circuit shown in FIG. 3, it may be configured that the reset transistor 17a, the output transistor 17b, and the selection transistor 17c are respectively configured by a p-channel MOS transistor, electrons are collected in the pixel electrode 15 with the relation between the voltage VS and the voltage VPX set to "VPX<VS", and a signal corresponding to the amount of the electrons is read out by a MOS circuit that is configured by a pMOS transistor. Under such a configuration, the electric potential of the pixel electrode 15 may drop from the voltage VS to the voltage VPX, and a signal may be read out in the range.

Referring back to FIG. 1, the electric potential adjusting electrode 19 is a newly disposed electrode, for example, for allowing the amounts of electric charge collected in all the pixel electrodes 15 to be uniform when a photographing process is performed at a constant amount of light. In order to allow the amounts of electric charge collected by all the pixel electrodes 15 to be uniform, a uniform distance in the horizontal direction and the vertical direction of each pixel electrodes 15 may be vacated so as to dispose electrodes that collect the electric charge generated in the photoelectric conversion layer located inside the organic layer 13. As represented in FIG. 2, by using electrodes out of the plurality of electrodes arranged in two dimensions with a uniform pitch that are located on the outermost side as the electric potential adjusting electrodes 19, the above-described conditions may be satisfied. According to the configuration shown in FIG. 2, in positions spaced apart by a constant distance from the four sides of each pixel electrode 15 in the horizontal direction and the vertical directions, other electrodes are necessarily placed. Accordingly, to each pixel electrode 15, only the electric charge generated in the organic layer 13 inside the standard pixel portion P1 including the pixel electrode 15 move. Therefore, the amounts of the electric charge collected in all the pixel electrodes 15 may be uniform.

To the electric potential adjusting electrode 19, the electric charge generated in the organic layer 13 inside the peripheral pixel portion P2, in which the electric potential adjusting electrode 19 is included, and the electric charge generated in the organic layer 13 on the outer side of the peripheral pixel portion P2 moves in accordance with an electric field applied between the opposing electrode 14 and the electric potential adjusting electrode 19.

However, a signal corresponding to the electric charge moving to the electric potential adjusting electrode 19 is configured not to be read out on the outside of the image pickup device. In other words, the signal reading portion that reads out a signal corresponding to the electric charge that is generated in the photoelectric conversion layer inside the organic layer 13 and move to the electric potential adjusting electrode 19 is configured not to be connected to the electric potential adjusting electrode 19.

As the material of the electric potential adjusting electrode 19, any conductive material may be used. However, by using the same material as that of the pixel electrode 15, the electric potential adjusting electrode 19 may be formed simultaneously with the pixel electrode 15, whereby the costs may be reduced.

Regarding the pixel electrode 15, four sides of the standard pixel portion P1 including the pixel electrode 15 are brought into contact with other pixel portions, and accordingly, electric charge does not move from the organic layer 13 outside the standard pixel portion P1 to the pixel electrode 15. However, regarding the electric potential adjusting electrode 19, one or two sides out of the four sides of the peripheral pixel portion P2 including the electric potential adjusting electrode 19 are not brought into contact with other pixel portions. Accordingly, as shown in FIG. 2, electric charge moves from the organic layer 13 on the outer side of the peripheral pixel portion P2 to the electric potential adjusting electrode 19.

In other words, when a photographing process is performed at a constant amount of light by using this image pickup device, the amount of electric charge moving to the electric potential adjusting electrode 19 is larger than that moving to the pixel electrode 15. Accordingly, for example when a photographing process is performed at a constant amount of light, there is a difference between a signal level acquired from the standard pixel portion P1 and a signal level acquired from the peripheral pixel portion P2. However, this image pickup device is configured not to read out a signal from the peripheral pixel portion P2. Accordingly, the difference in the signal levels does not cause any disadvantages.

On the other hand, as described above, when a large amount of electric charge moves to the electric potential adjusting electrode 19, and the electric potential of the electric potential adjusting electrode 19 markedly rises or drops such that the electric potential of the electric potential adjusting electrode 19 exceeds the output range (the range from the voltage VS to the voltage VPX) of the signal reading portion 17, the change in the electric potential may influence the electric potential of the pixel electrode 15. When there is such an influence, there is a variation in the signal acquired from the standard pixel portion P1. Accordingly, the image quality may deteriorate.

Thus, according to this image pickup device, by adjusting the electric potential by disposing the electric potential adjusting electrode 19, the image quality is further improved.

The electric potential adjusting portion 18 is disposed in accordance with each electric potential adjusting electrode 19 and adjusts the electric potential such that the electric potential of the corresponding electric potential adjusting electrode 19 does not exceed the output range. As the electric potential adjusting portion 18, any means that may prevent an excessive rise or drop in the electric potential of the electric potential adjusting electrode 19 may be used. In a case where the signal reading portion 17 collects holes in the pixel electrode 15 and is configured by an nMOS transistor, the electric potential may be adjusted by the electric potential adjusting portion 18 such that the electric potential of the electric potential adjusting electrode 19 does not exceed a threshold value. On the other hand, in a case where the signal reading portion 17 collects electrons in the pixel electrode 15 and is configured by a pMOS transistor, the electric potential may be adjusted by the electric potential adjusting portion 18 such that the electric potential of the electric potential adjusting electrode 19 is not lower than the threshold value. A concrete example of the electric potential adjusting portion 18 will be described later.

Next, the operation of the image pickup device configured as described above at a time when an image pickup operation is performed will be described.

When exposure is started by the image pickup device and light is incident to the organic layer 13, electric charge corresponding to the incident light is generated in the organic layer 13. During the exposure period, the voltage VPX is applied to the opposing electrode 14. Accordingly, in accordance with an electric field applied between the opposing electrode 14 and the pixel electrode 15, the electric charge (electrons or holes) generated inside the organic layer 13 that is included in the standard pixel portion P1 moves to the pixel electrode 15 included in the standard pixel portion P1 so as to be collected therein. Then, a signal corresponding to the electric charge collected in the pixel electrode 15 of the standard pixel portion P1 is externally read out by the signal reading portion 17. By processing a plurality of signals acquired from a plurality of the standard pixel portions P1, image data having pixels, the number of which is the same as the number of the standard pixel portions P1 may be generated.

On the other hand, in the peripheral pixel portion P2, the electric charge (electrons or holes) that is generated in the photoelectric conversion layer inside the organic layer 13 included in the peripheral pixel portion P2 move to the electric field adjusting electrode 19 so as to be collected therein in accordance with the electric field applied between the opposing electrode 14 and the electric potential adjusting electrode 19. As described above, the electric charge generated in the organic layer 13 placed on the outer side of the peripheral pixel portion P2 also moves to the electric potential adjusting electrode 19. Accordingly, the electric potential of the electric potential adjusting electrode 19 is higher or lower than the electric potential of the pixel electrode 15. However, the electric potential of the electric potential adjusting electrode 19 is maintained to be within a predetermined range by the electric potential adjusting portion 18. Therefore, the electric potential of the pixel electrode 15 becomes stable, and the influence thereof on the image quality is suppressed.

As described above, according to this image pickup device, around each pixel electrode 15 from which a signal is to be read out, at least one of another pixel electrode 15 and the electric potential adjusting electrode 19 is disposed to be spaced apart from the pixel electrode 15 by a predetermined gap. Accordingly, for example, when a photographing process at a constant amount of light is performed, the amount of electric charge collected in the pixel electrodes 15 are almost the same, and thereby signals acquired from all the standard pixel portions P1 may be uniformized. As a result, compared to a case where a general configuration in which the electric potential adjusting electrode 19 is not included, the image quality may be improved.

In addition, since the electric potential adjusting portion 18 that adjusts the electric potential of the electric potential adjusting electrode 19, disposed on the outer side of all the pixel electrodes 15, is disposed, the electric potential of the electric potential adjusting electrode 19 (that is, the amount of electric charge accumulated in the electric potential adjusting electrode 19) during the exposure period when a photographing process is performed at a constant amount of light may be restricted. Accordingly, for example, when a photographing process is performed at a constant amount of light, the levels of signals acquired from all the standard pixel portions P1 may be uniformized. Therefore, a higher image quality may be realized.

Hereinafter, a concrete example of the electric potential adjusting portion 18 will be described.

FIRST EXAMPLE

Figure 4:
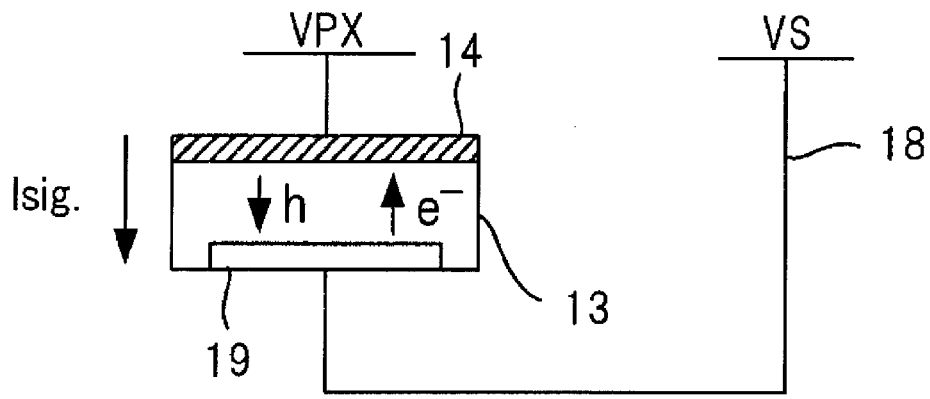
FIG. 4 is a diagram representing a first configuration example of the electric potential adjusting portion of the image pickup device shown in FIG. 1.

FIG. 4 is a diagram representing a first configuration example of the electric potential adjusting portion 18 of the image pickup device shown in FIG. 1. In FIG. 4, to each constituent element that is the same as that shown in FIG. 1, a same reference sign is assigned.

In this example, a wiring for connecting a power source used for supplying the voltage VS and the electric potential adjusting electrode 19 to each other is configured as an electric potential adjusting portion 18. To the electric potential adjusting electrode 19, a wiring as the electric potential adjusting portion 18 is connected, and this wiring is connected to a pad not shown in the figure. In addition, a power source that is located on the outside of the image pickup device is configured to be connectable to the pad. The wiring is formed inside the insulating layer 12 and may be formed simultaneously with other wirings used in the image pickup device.

Under such a configuration, when the image pickup device is used, the electric potential of the electric potential adjusting electrode 19 is fixed to the voltage VS all the time. Accordingly, even in a case where electric charge is collected in the electric potential adjusting electrode 19, the electric potential of the electric potential adjusting electrode 19 is prevented from exceeding the output range of the signal reading portion 17. Therefore, the influence thereof on the pixel electrode 15 may be suppressed. Under such a configuration, since a simple configuration in which the electric potential adjusting electrode 19 is directly connected to the power source is used, the electric potential adjusting portion 19 may be implemented at a low cost.

SECOND EXAMPLE

Figure 5:
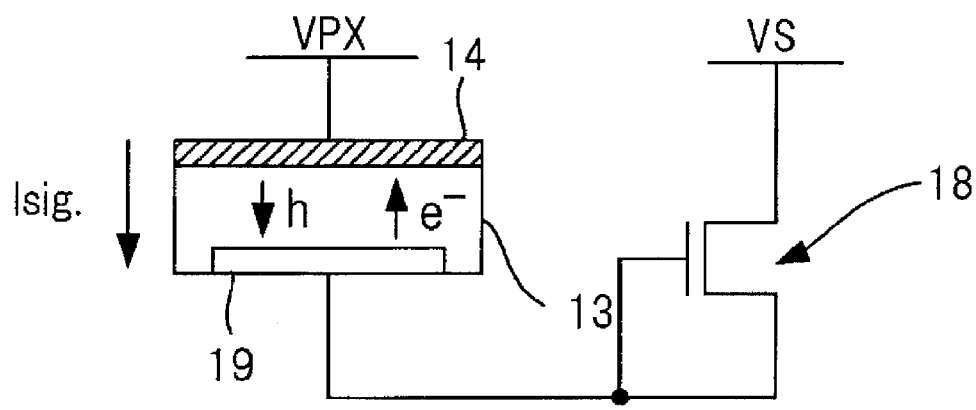
FIG. 5 is a diagram representing a second configuration example of the electric potential adjusting portion of the image pickup device shown in FIG. 1.

FIG. 5 is a diagram representing a second example of the electric potential adjusting portion 18 of the image pickup device shown in FIG. 1. In FIG. 5, to each constituent element that is the same as that shown in FIG. 1, a same reference sign is assigned.

In this example, a diode-connected transistor is configured as an electric potential adjusting portion 18. This transistor is formed on the substrate 11 and is electrically connected to the electric potential adjusting electrode 19. This transistor is an nMOS transistor having the gate terminal and the drain terminal connected together and prevents that the electric potential of the electric potential adjusting electrode 19 rises to be equal to or higher than (voltage VS+threshold value Vth of the transistor).

Under such a configuration, the electric potential of the electric potential adjusting electrode 19 is adjusted so as not to be equal to or higher than the threshold value. Accordingly, even in a case where a large electric charge is collected in the electric potential adjusting electrode 19, the electric potential of the electric potential adjusting electrode 19 is prevented from exceeding the output range of the signal reading portion 17. Therefore, the influence thereof on the pixel electrode 15 may be suppressed. In a case where the electrons are collected in the pixel electrode 15 as the signal reading portion 17 and a pMOS transistor is used, a diode-connected pMOS transistor that is connected to the pixel electrode 15 may be used as the electric potential adjusting portion 18.

THIRD EXAMPLE

Figure 6:
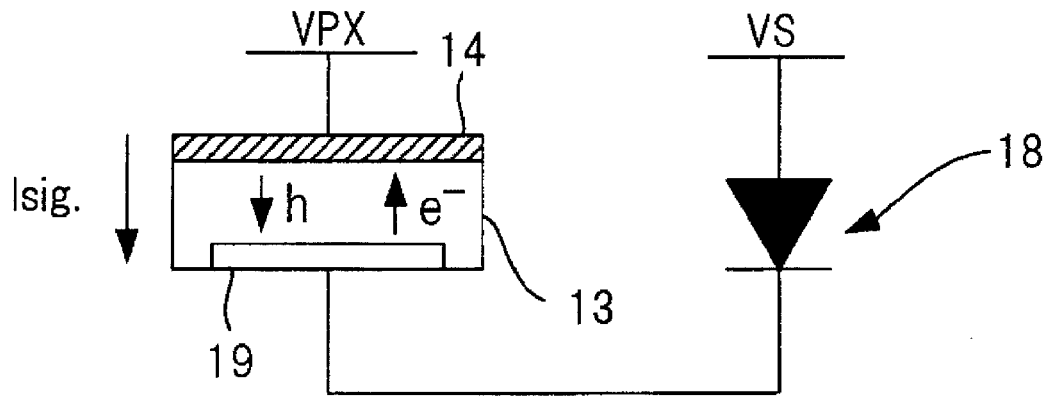
FIG. 6 is a diagram representing a third configuration example of the electric potential adjusting portion of the image pickup device shown in FIG. 1.

FIG. 6 is a diagram representing a third example of the electric potential adjusting portion 18 of the image pickup device shown in FIG. 1. In FIG. 6, to each constituent element that is the same as that shown in FIG. 1, a same reference sign is assigned.

In this example, a diode that is electrically connected to each electric potential adjusting electrode 19 is configured as an electric potential adjusting portion 18. For example, this diode is a zener diode. The zener diode is formed on the substrate 11. The zener diode prevents the electric potential of the electric potential adjusting electrode 19 from rising to be equal to or higher than (voltage VS+breakdown voltage of the diode).

Under such a configuration, the electric potential of the electric potential adjusting electrode 19 is adjusted so as not to be equal to or higher than the threshold value. Accordingly, even in a case where a large electric charge is collected in the electric potential adjusting electrode 19, the electric potential of the electric potential adjusting electrode 19 is prevented from exceeding the output range of the signal reading portion 17. Therefore, the influence thereof on the pixel electrode 15 may be suppressed.

As described above, the electric potential adjusting portion 18 may be implemented by various means.

In addition, in the example represented in FIG. 2, there is a gap between the electric potential adjusting electrodes 19. However, a configuration in which such a gap is eliminated may be used. In other words, the electric potential adjusting electrodes 19 may be configured as one electrode continuously formed (that is, formed without any gap) so as to surround the pixel electrodes 15.

Figure 7:
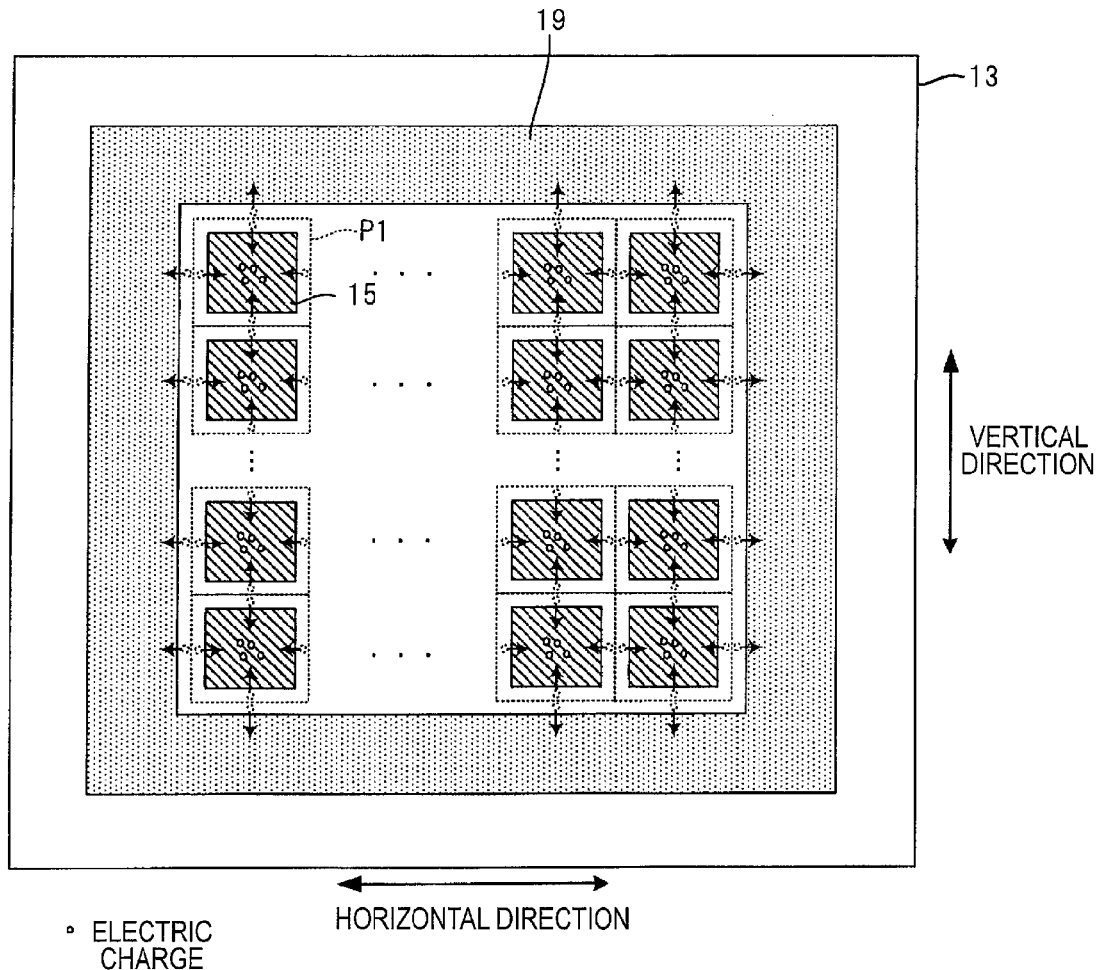
FIG. 7 is a diagram representing a modified example of the electric potential adjusting electrode of the image pickup device shown in FIG. 2.

FIG. 7 is a diagram representing a modified example of the electric potential adjusting electrode 19 of the image pickup device shown in FIG. 2. In the image pickup device shown in FIG. 7, the electric potential adjusting electrodes 19 are formed without any gap so as to surround the periphery of the pixel electrodes 15. The distance between the inner edge of the electric potential adjusting electrode 19 shown in FIG. 7 and the outer edge of the pixel electrode 15 is configured to be the same as the gap A of the pixel electrodes 15.

By employing the configuration as represented in FIG. 7, the number of the electric potential adjusting portions 18 may be configured to be minimized as one. Accordingly, the number of the electric potential adjusting portions 18 may be decreased. In addition, in the substrate 11 located on the lower side of the electric potential adjusting electrode 19, a wide space is generated. Therefore, the electric potential adjusting portion 18 may be formed by using the space, and thereby the degree of freedom of design is improved.

Next, a desired value of the gap A of the pixel electrodes 15 described above will be described.

Figure 8:
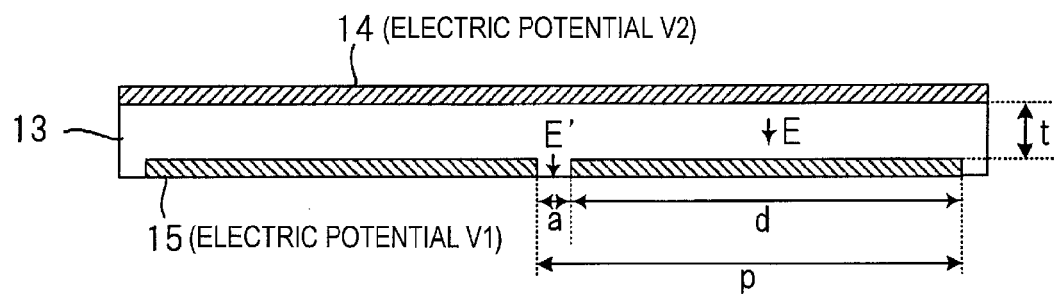
FIG. 8 is a diagram illustrating a preferred value of the gap between pixel electrodes of the image pickup device shown in FIG. 1.
Figure 9:
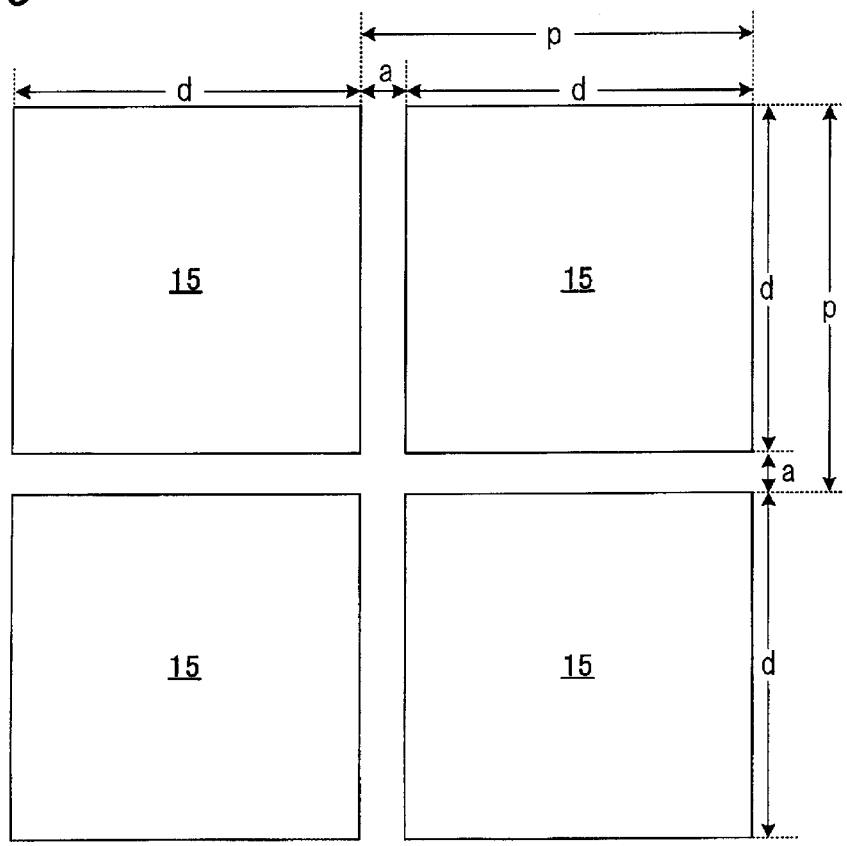
FIG. 9 is a diagram illustrating a preferred value of the gap between pixel electrodes of the image pickup device shown in FIG. 1.

In the image pickup device shown in FIG. 1, as represented in FIGS. 8 and 9, the gap between the adjacent pixel electrodes 15 is assumed to be a, a width (in a case where the electrode has a square shape as shown in FIG. 9, the length of one side of the peripheral edge thereof) of the pixel electrode 15 is assumed to be d, the arrangement pitch of the pixel electrodes 15 is assumed to be p, and the thickness of the organic layer 13 is assumed to be t. In addition, the electric field on the pixel electrode 15 in the organic layer 13 is assumed to be E, and the electric field in the gap between the pixel electrodes 15 is assumed to be E'. In addition, the mobility of electric charge in the organic layer 13 is assumed to be u. Then, the electric fields E and E' may be represented as in the following equations.

$$E = \frac{V2 - V1}{t}$$ [Numeric Expression 1]

$$E' = \frac{V2 - V1}{\sqrt{\frac{a^2}{4} + t^2}}$$ [Numeric Expression 2]

Generally, a time t that is required for movement of a carrier inside the organic layer 13 is represented as the following equation by using the mobility u of the carrier inside the organic layer 13. Here l denotes a moving distance, and E denotes the field intensity.

$$\tau = \frac{l}{uE}$$ [Numeric Expression 3]

Accordingly, a time T1 required for a carrier, which is generated near the opposing electrode 14 right above the pixel electrode 15, to arrive at the pixel electrode 15 is determined by the following equation.

$$T1 = \frac{t}{uE} = \frac{t^2}{u(V1 - V2)}$$ [Numeric Expression 4]

On the other hand, a time T2 required for an electric charge generated on the uppermost surface of the organic layer 13 to arrive at the pixel electrode 15 determined by the following equation.

$$T2 = \frac{\frac{a^2}{4} + t^2}{u(V2 - V1)}$$ [Numeric Expression 5]

In order to prevent generation of a lag, any of T1 and T2 needs to be shorter than one frame period T. When the relationship of "T2<T" is satisfied based on "T1<T2", the lag is not generated.

In a case where T=33 msec, V2−V1=10V, the mobility u=1×10$^{-6}$ cm$^2$/V·sec in the organic layer 13, and t=200 nm, theoretically, when the relationship of "a<10 µm" is satisfied, a lag is not generated.

However, according to the research of the inventor of the present invention, in a practical device, the same result as that of the above-described theory is not acquired, and a lag is generated still unless the gap a is decreased further. One of the factors causing such a result is thought to be the behavior of the carrier in the organic layer 13 that cannot be represented by the above-described equations.

Thus, the inventor of the present invention performed an experiment as below so as to check the degree of generation of the lag in a case where the configurations are changed.

Figure 10:
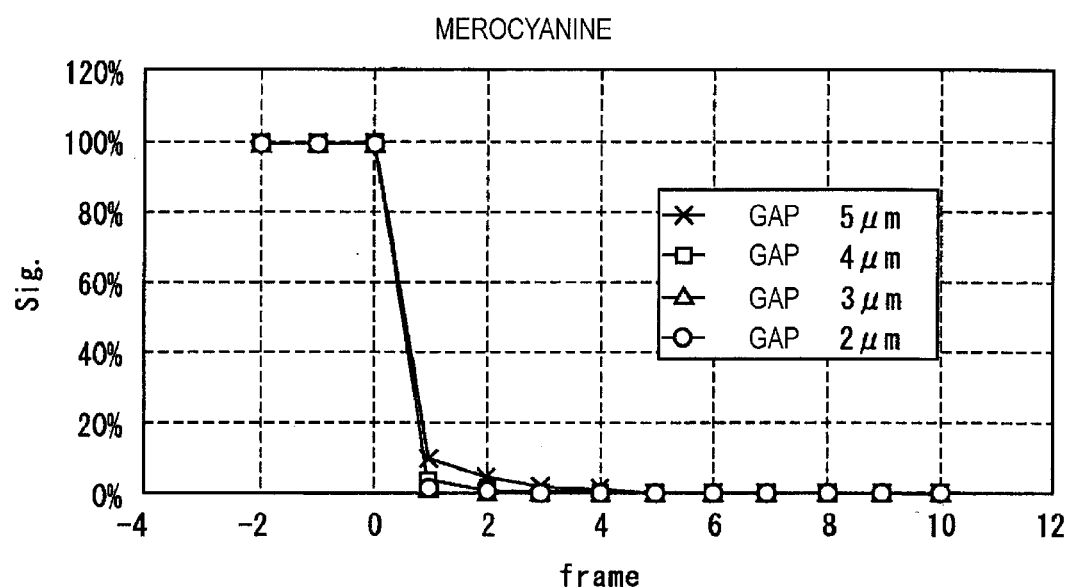
FIG. 10 is a graph representing the rate of generation of a lag in a case where merocyanine is used as a photoelectric conversion material forming an organic layer in the configuration represented in FIG. 8.
Figure 11:
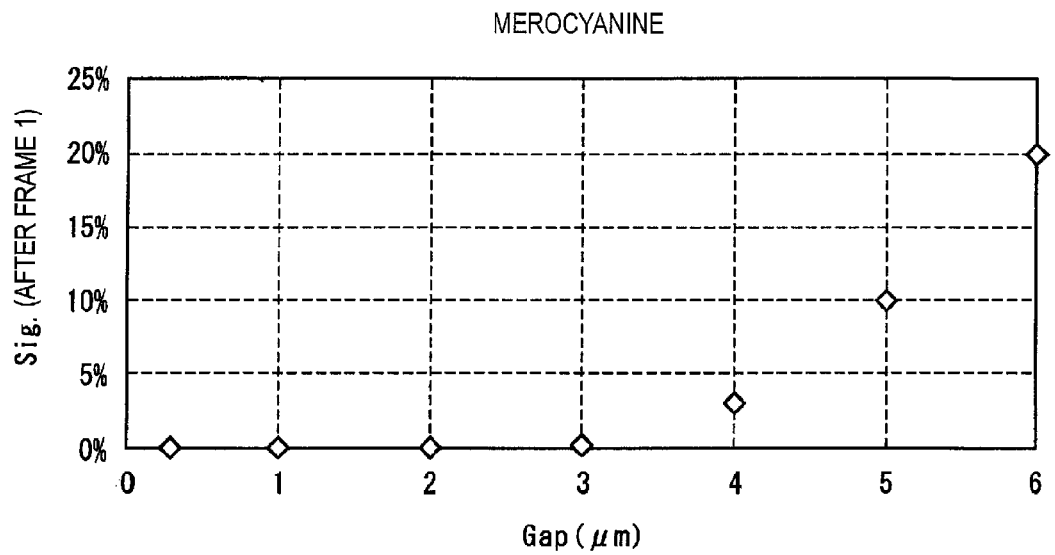
FIG. 11 is a graph representing the rate of generation of a lag after frame 1 in a case where merocyanine is used as the photoelectric conversion material forming the organic layer and the gap between the pixel electrodes is changed in the configuration represented in FIG. 8.

FIG. 10 is a graph representing the rate of generation of a lag in a case where merocyanine is used as the photoelectric conversion material forming the organic layer 13. FIG. 11 is a graph representing the rate of generation of a lag after frame 1 in a case where merocyanine is used as the photoelectric conversion material forming the organic layer 13 and the gap between the pixel electrodes 15 is changed.

Figure 12:
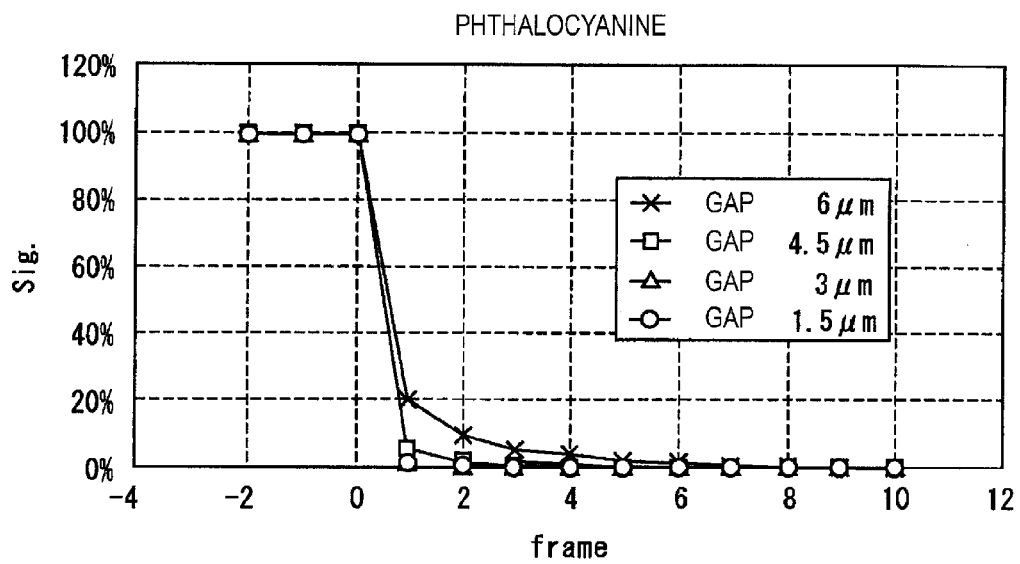
FIG. 12 is a graph representing the rate of generation of a lag in a case where phthalocyanine is used as the photoelectric conversion material forming the organic layer in the configuration represented in FIG. 8.
Figure 13:
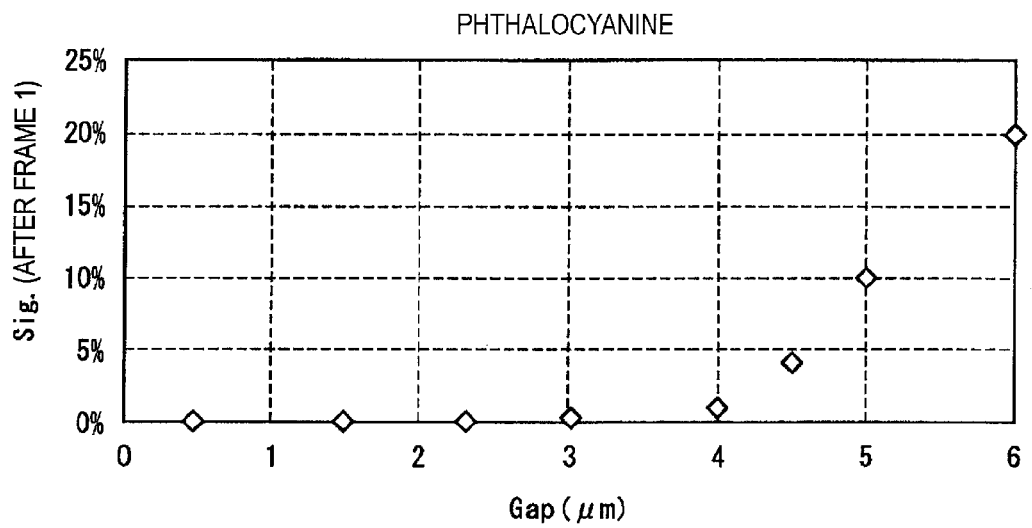
FIG. 13 is a graph representing the rate of generation of a lag after frame 1 in a case where phthalocyanine is used as the photoelectric conversion material forming the organic layer and the gap between the pixel electrodes is changed in the configuration represented in FIG. 8.

FIG. 12 is a graph representing the rate of generation of a lag in a case where phthalocyanine is used as the photoelectric conversion material forming the organic layer 13. FIG. 13 is a graph representing the rate of generation of a lag after frame 1 in a case where phthalocyanine is used as the photoelectric conversion material forming the organic layer 13 and the gap between the pixel electrodes 15 is changed.

Figure 14:
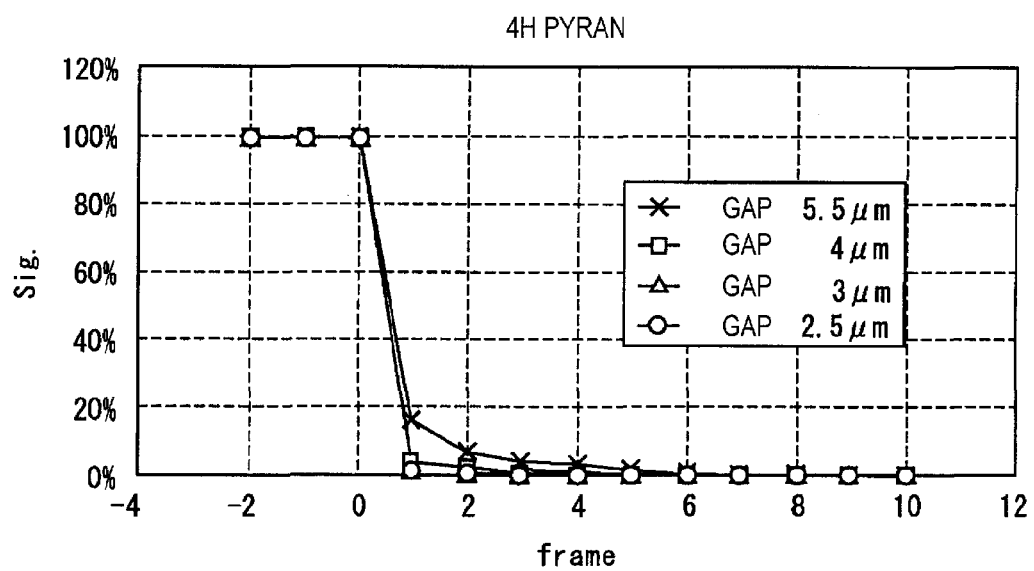
FIG. 14 is a graph representing the rate of generation of a lag in a case where 4H-pyran is used as the photoelectric conversion material configuring the organic layer in the configuration represented in FIG. 8.
Figure 15:
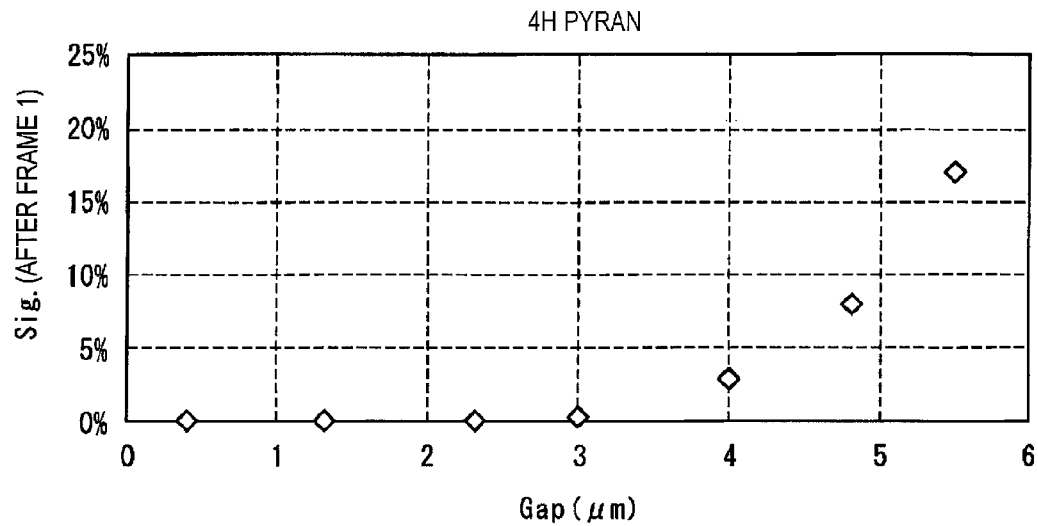
FIG. 15 is a graph representing the rate of generation of a lag after frame 1 in a case where 4H-pyran is used as the photoelectric conversion material forming the organic layer and the gap between the pixel electrodes is changed in the configuration represented in FIG. 8.

FIG. 14 is a graph representing the rate of generation of a lag in a case where 4H-pyran is used as the photoelectric conversion material configuring the organic layer 13. FIG. 15 is a graph representing the rate of generation of a lag after frame 1 in a case where 4H-pyran is used as the photoelectric conversion material forming the organic layer 13 and the gap between the pixel electrodes 15 is changed.

In the graphs shown in FIGS. 10, 12, and 14, the vertical axis represents the rate (Sig. %) of generation of a lag with respect to the frame number, and the horizontal axis represents the frame number. Here, the light source is turned off in synchronization with frame 0. In addition, in the graphs shown in FIGS. 11, 13, and 15, the vertical axis represents the rate (Sig. %) of generation of a lag after frame 1, and the horizontal axis represents the size (μm) of the gap.

In the image pickup device shown in FIG. 10, the degrees of generation of a lag are compared to each other while changing the gap between the pixel electrodes to 5 μm, 4 μm, 3 μm, and 2 μm. When the gap is set to 5 μm or 4 μm, the generation of a lag is recognized in frames 1 to 3. On the other hand, it may be known that the lag is suppressed to a level at which the lag causes no disadvantage in practical use regardless of the frame number when the gap is set to 3 μm or 2 μm.

As shown in FIG. 11, it may be known that the generation of a lag after frame 1 is suppressed to almost zero when the gap is set to be equal to or less than 3 μm.

In the image pickup device shown in FIG. 12, the degrees of generation of a lag are compared to each other while changing the gap between the pixel electrodes to 6 μm, 4.5 μm, 3 μm, and 1.5 μm. When the gap is set to 6 μm or 4.5 μm, the generation of a lag is recognized in frames 1 to 4. On the other hand, it may be known that the lag is suppressed to a level at which the lag causes no disadvantage in practical use regardless of the frame number when the gap is set to 3 μm or 1.5 μm.

As shown in FIG. 13, it may be known that the generation of a lag after frame 1 is suppressed to almost zero when the gap is set to be equal to or less than 3 μm.

In the image pickup device shown in FIG. 14, the degrees of generation of a lag are compared to each other while changing the gap between the pixel electrodes to 5.5 μm, 4 μm, 3 μm, and 2.5 μm. When the gap is set to 5.5 μm or 4 μm, the generation of a lag is recognized in frames 1 to 4. On the other hand, when the gap is set to 3 μm or 2.5 μm, it may be known that the lag is suppressed to a level at which the lag causes no disadvantage in practical use regardless of the frame number.

As shown in FIG. 15, it may be known that the generation of a lag after frame 1 is suppressed to almost zero when the gap is set to be equal to or less than 3 μm.

As described above, in the configuration in which an organic photoelectric conversion material (merocyanine, phthalocyanine, or 4H-pyran) is used in the organic layer 13, it may be known that the lag is suppressed to a level at which the lag causes no disadvantage in practical use regardless of the photoelectric conversion material when the gap between the pixel electrodes is set to be equal to or less than 3 μm. On the other hand, it may be known that a lag markedly appears when the gap is set to be equal or greater than 4 μm.

Next, the lag for frame is measured when the area of the pixel electrode 15 and the voltage applied to the opposing electrode 14 are changed. In this measurement, merocyanine is used as the photoelectric conversion material.

Figure 16:
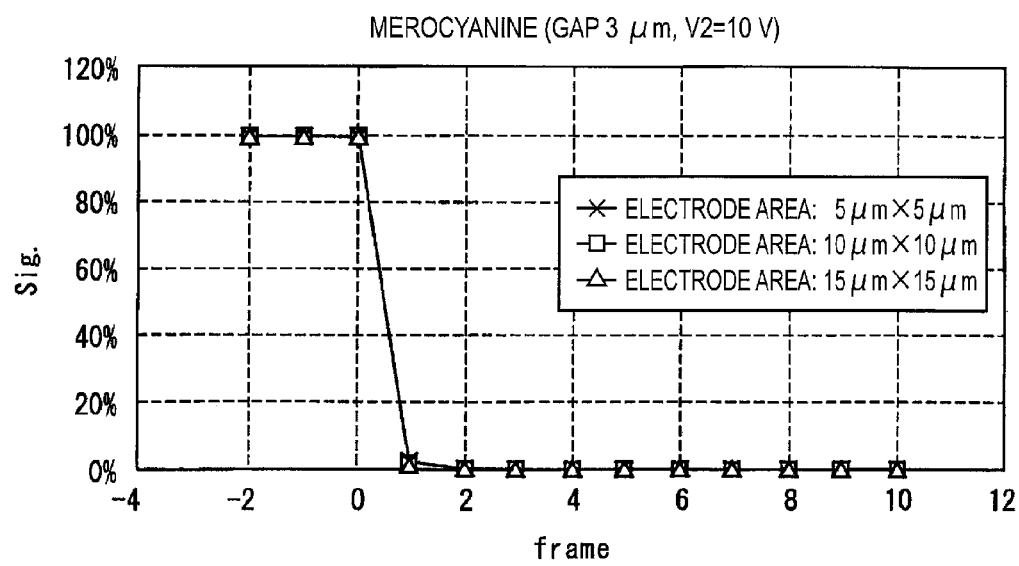
FIG. 16 is a graph representing the correlation of the rate of generation of a lag with the frame number in a case where the electrode area of the pixel electrode is changed in the configuration represented in FIG. 8.

FIG. 16 is a graph representing the correlation of the rate of generation of a lag with the frame number in a case where the electrode area of the pixel electrode 15 is changed. Here, the correlations are measured in the configurations in which the electrode areas are 5 μm×5 μm, 10 μm×10 μm, and 15 μm×15 μm. In addition, in the measurement, the gap between the pixel electrodes 15 is set to 3 μm, and the voltage applied to the opposing electrode 14 is set to 10 V. As a result, when the gap between the pixel electrodes 15 is 3 μm, generation of a lag for each frame number is suppressed regardless of the electrode area.

Figure 17:
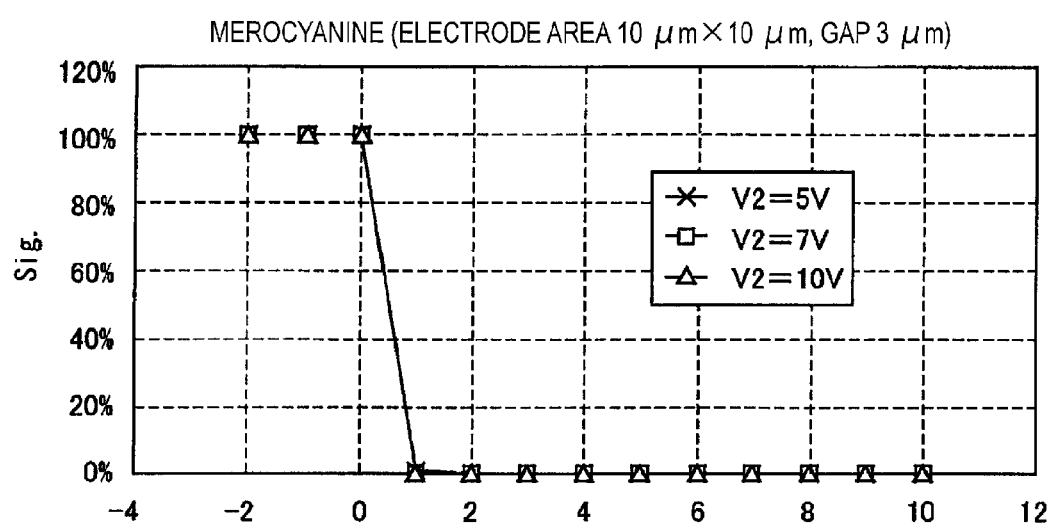
FIG. 17 is a graph representing the correlation of the rate of generation of a lag with the frame number in a case where the voltage of the pixel electrode is changed in the configuration represented in FIG. 8.

FIG. 17 is a graph representing the correlation of the rate of generation of a lag with the frame number in a case where the voltage of the opposing electrode 14 is changed. Here, the correlations are measured in the configurations in which the voltages (V2) of the opposing electrode 14 are set to 5 V, 7 V, and 10 V. In addition, in the measurement, the gap between the pixel electrodes 15 is set to 3 μm, and the electrode area of the pixel electrode 15 is 10 μm×10 μm. As a result, when the gap between the pixel electrodes 15 is 3 μm, generation of a lag for each frame number is suppressed regardless of the voltage of the opposing electrode 14.

Through the verification of the measurement, in a case where the organic photoelectric conversion material is used to form the organic layer 13 of the image pickup device shown in FIG. 1 or 2, it may be known that there is the influence of the gap between the pixel electrodes 15 on the lag without depending on the electrode area of the pixel electrode 15 or the voltage of the opposing electrode 14. In other words, by configuring the gap between the pixel electrodes 15 to be equal to or less than 3 μm, the generation of a lag may be suppressed regardless of the electrode area of the pixel electrode 15 or the voltage of the opposing electrode 14.

Hereinafter, a preferred configuration example of a stacked-type image pickup device according to an exemplary embodiment of the present invention will be described.

Figure 18:
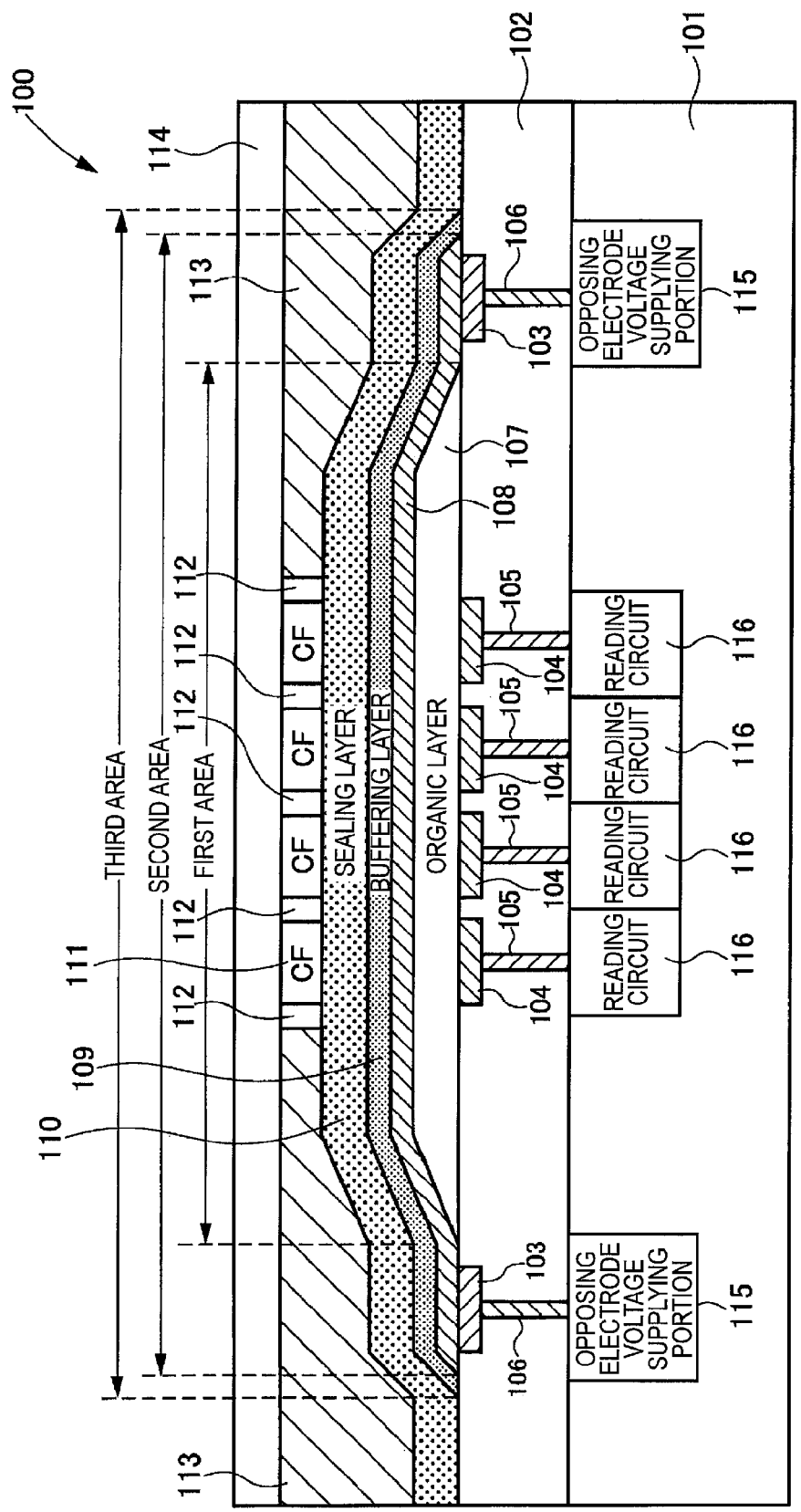
FIG. 18 is a schematic cross-sectional view of a solid-state image pickup apparatus of the stacked type.

FIG. 18 is a schematic cross-sectional view of a solid-state image pickup apparatus of the stacked type.

The solid-state image pickup apparatus 100 shown in FIG. 18 includes a substrate 101, an insulating layer 102, connection electrodes 103, pixel electrodes 104, a connection portion 105, a connection portion 106, an organic layer 107, an opposing electrode 108, a buffer layer 109, a sealing layer 110, color filters 111, partition walls 112, a light shielding layer 113, a protection layer 114, opposing electrode voltage supplying portions 115, and reading circuits 116.

The substrate 101 is a glass substrate or a semiconductor substrate formed from silicon or the like. On the substrate 101, the insulating layer 102 is formed. In addition, on the surface of the insulating layer 102, a plurality of the pixel electrodes 104 and a plurality of the connection electrodes 103 are formed.

The organic layer 107 is configured so as to include at least a photoelectric conversion layer. The photoelectric conversion layer generates electric charge in accordance with light received. The organic layer 107 is disposed on a plurality of the pixel electrodes 104 so as to cover the pixel electrodes 104. The organic layer 107 has a constant film thickness on the pixel electrodes 104. However, the film thickness of the organic layer 107 in a portion other than the pixel portion (other than the effective pixel area) may be changed. The organic layer 107 will be described later in detail. In addition, the organic layer 107 is not limited as being configured by a layer that is formed only from an organic material but may be configured to include a part of the layer that is formed from an inorganic material.

The opposing electrode 108 is an electrode that faces the pixel electrode 104 and is disposed on the organic layer 107 so as to cover the organic layer 107. In order to allow light to be incident to the organic layer 107, the opposing electrode 108 is composed of a conductive material that is transparent to the incident light. The opposing electrode 108 is formed up to the upper sides of the connection electrodes 103 that are disposed on the outer sides of the organic layer 107 so as to be electrically connected to the connection electrodes 103.

The connection portion 106 is buried in the insulating layer 102 and is a plug or the like that is used for electrically connecting the connection electrode 103 and the opposing electrode voltage supplying portion 115 to each other. The opposing electrode voltage supplying portion 115 is formed in the substrate 101 and applies a predetermined voltage to the opposing electrode 108 through the connection portion 106 and the connection electrode 103. In a case where the voltage to be applied to the opposing electrode 108 is higher than the source voltage of the solid-state image pickup apparatus 100, the predetermined voltage is supplied by rising the source voltage by using a boost circuit such as a charge pump.

The pixel electrode 104 is a charge collecting electrode that is used for collecting electric charge generated in the organic layer 107 that is disposed between the pixel electrode 104 and the opposing electrode 108 facing the pixel electrode 104. The reading circuit 116 is disposed on the substrate 101 in accordance with each of the plurality of the pixel electrodes 104 and reads out a signal corresponding to the electric charge collected in the corresponding pixel electrode 104. The reading circuit 116, for example, is configured by a CCD, a MOS circuit, a TFT circuit, or the like. The reading circuit 116 is shielded by a light shielding layer, which is not shown in the figure, disposed inside the insulating layer 102. The pixel electrode 104 and the reading circuit 116 will be described later in detail.

The buffer layer 109 is formed on the opposing electrode 108 so as to cover the opposing electrode 108. The sealing layer 110 is formed on the buffer layer 109 so as to cover the buffer layer 109. The color filters 111 are formed in positions on the sealing layer 110 that face the pixel electrodes 104. The partition walls 112 are disposed between the color filters 111 and are used for improving the light transmission efficiency of the color filters 111. The light shielding layer 113 is formed in areas on the sealing layer 110 other than the area in which the color filters 111 and the partition walls 112 are disposed and prevents light from being incident to the organic layer 107 that is formed in an area other than the effective pixel area. The protection layer 114 is formed on the color filters 111, the partition walls 112, and the light shielding layer 113 and protects the entire solid-state image pickup apparatus. The buffer layer 109, the sealing layer 110, the color filter 111, the partition wall 112, the light shielding layer 113, and the protection layer 114 will be described later in detail.

In addition, in the example represented in FIG. 18, the pixel electrode 104 and the connection electrode 103 are formed so as to be buried in the surface portion of the insulating layer 102. However, the pixel electrode 104 and the connection electrode 103 may be formed on the insulating layer 102. In addition, a plurality of sets each configured by the connection electrode 103, the connection portion 106, and the opposing electrode voltage supplying portion 115 is disposed. However, only one set thereof may be disposed. Similarly to the example represented in FIG. 18, the voltage drop of the opposing electrode 108 may be suppressed by supplying a voltage to the opposing electrode 108 from both end portions of the opposing electrode 108. The number of the sets may be appropriately increased or decreased in consideration of the chip area of the device.

The solid-state image pickup apparatus 100 includes a plurality of pixel portions. The plurality of pixel portions is arranged in two dimensions in the state in which the substrate 101 is viewed in the plan view from the incident side of light. The pixel portion includes at least the pixel electrode 104, the organic layer 107, the opposing electrode 108 that faces the pixel electrode 104, the sealing layer 110, the color filter 111, and the reading circuit 116.

Next, a configuration example of the peripheral circuit will be described. The above-described reading circuit 116 preferably employs a CCD or a CMOS circuit for the use of a general image sensor. In addition, in the viewpoint of noise and speed, the CMOS circuit is preferably employed. In the configuration example of the peripheral circuit described below is a configuration example in which the CMOS circuit is used as the reading circuit 116.

Figure 19:
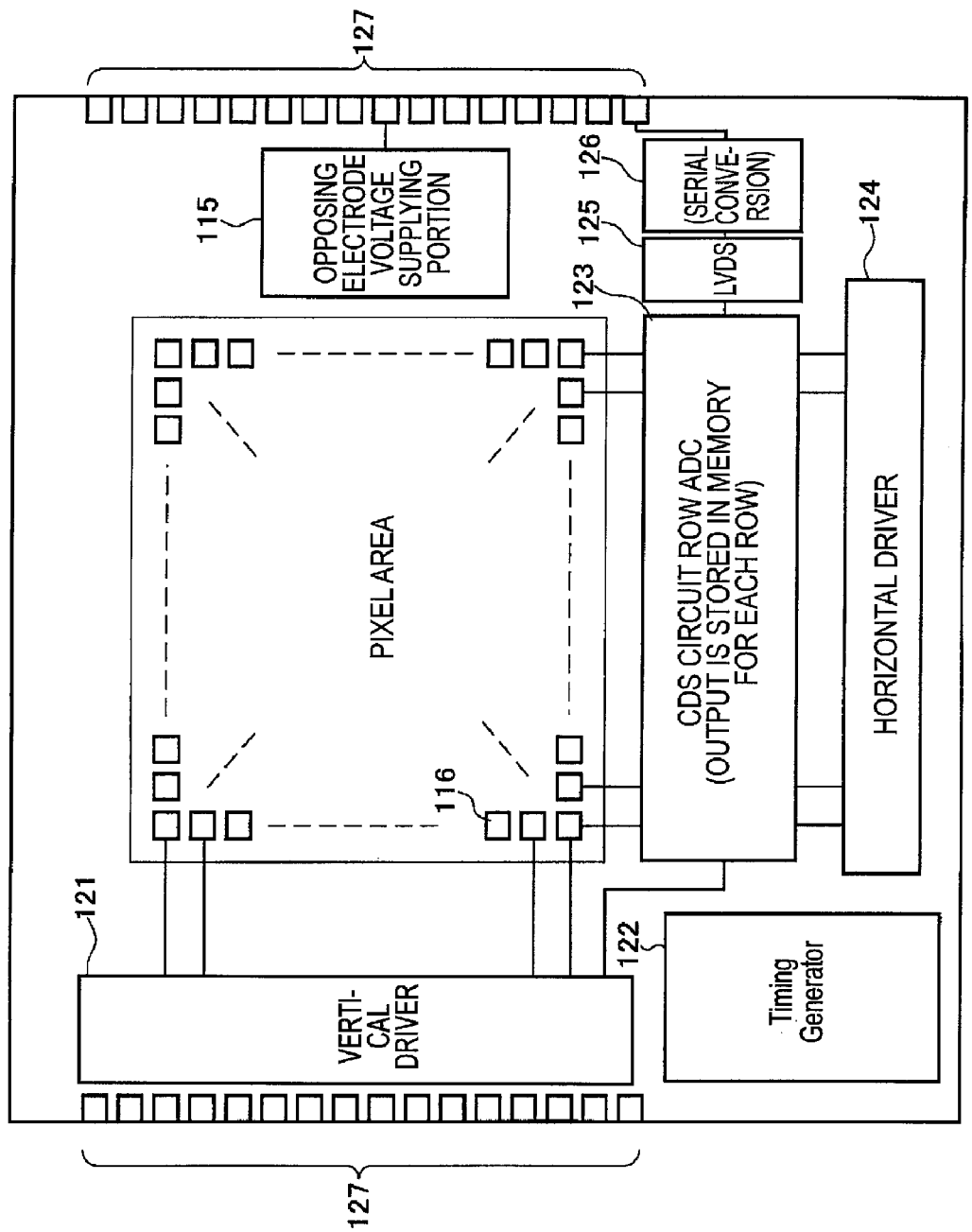
FIG. 19 is a diagram representing an example of the configuration of the peripheral circuit of the solid-state imaging device.

FIG. 19 is a diagram representing an example of the entire configuration including the peripheral circuit of the solid-state imaging device shown in FIG. 1. As shown in FIG. 19, the solid-state image pickup apparatus 100 includes a vertical driver 121, a timing generator 122, a signal processing circuit 123, a horizontal driver 124, an LVDS 125, a serial conversion unit 126, and a pad 127, in addition to the configuration represented in FIG. 18.

The pixel area shown in FIG. 19 corresponds to the first area shown in FIG. 18. Each block inside the pixel area represents the reading circuit 116. As the peripheral circuit of the solid-state image pickup apparatus, a peripheral circuit that is almost the same as that used in a general CMOS image sensor may be employed. This solid-state image pickup apparatus is different from the configuration of the peripheral circuit of a general CMOS image sensor in that an opposing electrode voltage supplying portion 115 is added.

The pad 127 is an interface that is used for input/output from/to the outside thereof. The timing generator 122 also controls reading such as thinned reading or partial reading by supplying timing for driving the solid-state image pickup apparatus. The signal processing circuit 123 is disposed in accordance with each column of the reading circuits 116. The signal processing circuit 123 performs correlation double sampling (CDS) for a signal output from the corresponding column and converts the processed signal into a digital signal. The signal processed by the signal processing circuit 123 is stored in a memory that is disposed for each column. The vertical divider 121 performs control of reading a signal from the reading circuit 116 and the like. The horizontal driver 124 controls sequentially reading out of signals corresponding to one row, which are stored in the memory of the signal processing circuit 123, and outputting the read-out signals to the LVDS 125. The LVDS 125 transmits a digital signal in accordance with the LVDS (low voltage differential signaling). The serial conversion unit 126 converts the input parallel digital signal into a serial signal and outputs the serial signal.

The serial conversion unit 126 may be omitted. In addition, it may be configured that only the correlation double sampling process is performed by the signal processing circuit 123, and an AD conversion circuit is disposed instead of the LVDS 125. In addition, it may be configured that only the correlation double sampling process is performed by the signal processing circuit 123, and the LVDS 125 and the serial conversion unit 126 are omitted. In such a case, it is preferable that an AD conversion circuit is disposed outside the chip in which the solid-state image pickup apparatus is formed. In addition, the signal processing circuit 123, the LVDS 125, and the serial conversion unit 126 may be disposed on each of one side and the other side of the area adjacent to the pixel area. In such a case, it may be configured that a half (for example, odd columns) of the columns of the reading circuits 116 is processed by the signal processing circuit 123 disposed on the one side of the area adjacent to the pixel area, and the remaining half (for example, even columns) is processed by the signal processing circuit 123 disposed on the other side of the area adjacent to the pixel area.

Next, the organic layer 107, the pixel electrode 104, the opposing electrode 108, the buffer layer 109, the sealing layer 110, the color filter 111, the partition wall 112, the light shielding layer 113, the protection layer 114, and the reading circuit 116 will be described in detail.

<Organic Layer>

Figure 20:
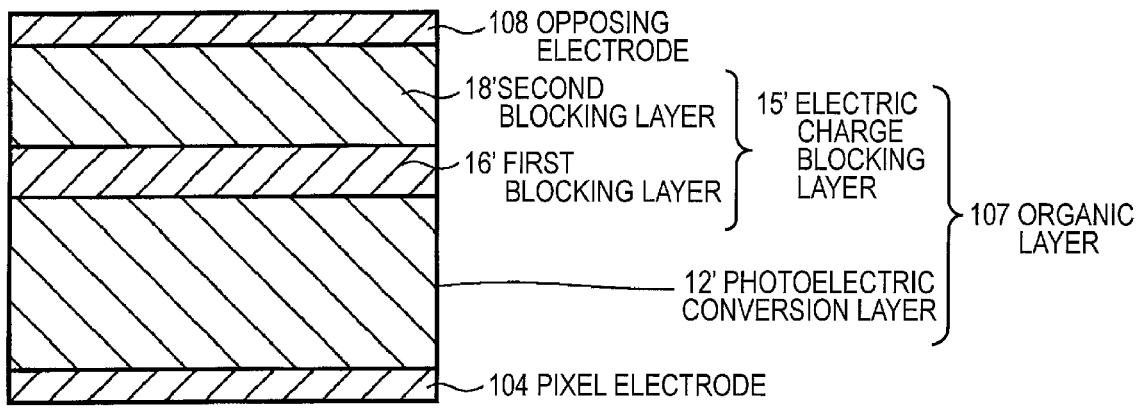
FIG. 20 is a cross section showing an example of the configuration of the organic layer.

FIG. 20 is a cross section showing an example of the configuration of the organic layer. As shown in FIG. 20, the organic layer includes a photoelectric conversion layer 12' and an electric charge blocking layer 15'.

The electric charge blocking layer 15' has a function of suppressing a dark current. The electric charge blocking layer 15' is configured by a first blocking layer 16' and a second blocking layer 18'. By configuring the electric charge blocking layer 15' as a plurality of layers as described above, a boundary is formed between the first blocking layer 16' and the second blocking layer 18'. Accordingly, there is discontinuity of the intermediate level in the layers. Therefore, it becomes difficult for the charge carriers to move through the intermediate level, whereby the dark current may be suppressed. In addition, as in another configuration example to be described later, the electric charge blocking layer 15' may be configured as a single layer.

The photoelectric conversion layer 12' includes p-type organic semiconductor and n-type organic semiconductor. By forming a donor-acceptor boundary by bonding the p-type organic semiconductor and the n-type organic semiconductor, the exciton dissociation efficiency may be increased. Accordingly, the photoelectric conversion layer 12' having the configuration acquired by bonding the p-type organic semiconductor and the n-type organic semiconductor exhibits high photoelectric conversion efficiency. In particular, in the photoelectric conversion layer 12' acquired by mixing the p-type organic semiconductor and the n-type organic semiconductor, the bonding boundary is increased, and the photoelectric conversion efficiency is improved, which is advantageous.

The p-type organic semiconductor (compound) is donor-type organic semiconductor and is mainly represented by a hole transporting organic semiconductor. The p-type organic semiconductor indicates an organic compound that has a property of readily donating electrons. Described in detail, when two organic compounds are in contact, the p-type organic semiconductor represents one of the two organic compounds that has a lower ionization potential. Accordingly, any donor-type organic compound may be used as long as it has an electron-donating property. For example, as the donor-type organic compound, a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic ring compound (such as naphthalene derivatives, anthracene derivatives, phenanthrene derivatives, tetracene derivatives, pyrene derivatives, perylene derivatives, or fluoranthene derivatives), and a metal complex containing a nitrogen-containing heterocyclic compound as a ligand, or the like may be used. In addition, the p-type organic semiconductor is not limited thereto. Thus, as described above, organic compounds having ionization potential that is lower than the organic compound used as the n-type (acceptor type) compound may be used as the donor-type organic semiconductor.

The n-type organic semiconductor (compound) is acceptor-type organic semiconductor and is mainly represented by an electron transporting organic compound. The n-type organic semiconductor represents an organic compound that has a property of readily accepting electrons. Described in detail, when two organic compounds are in contact, the n-type organic semiconductor indicates one of the two organic compounds that has higher electron affinity. Accordingly, any acceptor-type organic compound may be used as long as it has an electron-accepting property. For example, as the acceptor-type organic compound, a fused aromatic carbocyclic ring compound (such as naphthalene derivatives, anthracene derivatives, phenanthrene derivatives, tetracene derivatives, pyrene derivatives, perylene derivatives, or fluoranthene derivatives); a 5-7 membered heterocyclic ring compound containing a nitrogen atom, an oxygen atom, or a sulfur atom (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyraridine, pyrrolopyridine, thiadiazolopyridine, dibenzazepine, or tribenzazepine); a polyarylene compound; a fluorene compound; a cyclopentadiene compound; a silyl compound; a metal complex containing a nitrogen-containing heterocyclic compound as a ligand, or the like may be used. The acceptor-type organic compound is not limited thereto. Thus, as described above, any organic compound that has electron affinity that is higher than that of an organic compound used as the p-type (donor-type) compound may be used as the acceptor-type organic semiconductor.

In addition, any organic dye may be used as the p-type organic semiconductor or the n-type organic semiconductor. Preferably, the organic dye includes: cyanine dye; styryl dye; hemicyanine dye; merocyanine dye (including zero-methine merocyanine (simple merocyanine)); trinuclear merocyanine dye; tetranuclear merocyanine dyes; rhodacyanine dye; complex cyanine dye; complex merocyanine dye; allopolar dye; oxonol dye; hemioxonol dye; squarium dye; croconium dye; azamethine dye; coumarin dye; allylidene dye; anthraquinone dye; triphenylmethane dye; azo dye; azomethine dyes; a spiro compound; metallocene dyes; fluorenone dye; fulgide dye; perylene dye; perynon dye; phenazine dye; phenothiazine dye; quinone dye; diphenylmethane dye; polyene dyes; acridine dye; acridinone dye; diphenylamine dye; quinacridone dye; quinophthalone dye; phenoxazine dye; phthaloperylene dye; diketone pyrollo pyrole dye; porphyrin dye; propylene dye, dioxane dye, chlorophyll dye; phthalocyanine dye; metal complex dye; and fused aromatic carbocyclic ring dye (such as naphthalene derivatives, anthracene derivatives, phenanthrene derivatives, tetracene derivatives, pyrene derivatives, perylene derivatives, and fluoranthene derivatives).

As the n-type organic semiconductor, a fullerene or fullerene derivatives having superior electron-transporting property may be preferably used. The fullerene represents fullerenes C60, C70, C76, C78, C80, C82, C84, C90, C96, C240, and C540, a mixed fullerene, and a fullerene nanotube. In addition, the fullerene derivatives represent compounds acquired by adding a substituent group thereto.

The substituent group of the fullerene derivatives is preferably an alkyl group, an aryl group, or a heterocyclic group.

The alkyl group is more preferably an alkyl group having carbon number of 1 to 12. The aryl group and the heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxazine ring, a phenothiazine ring and a phenazine ring. More preferably, a benzene ring, a naphthalene ring, an anthracene ring, a phenanthrene ring, a pyridine ring, an imidazole ring, an oxazole ring, or a thiazole ring is used. In addition, further more preferably, a benzene ring, a naphthalene ring, or a pyridine ring is used. These materials may have an additional substituent group, and the substituent group may be combined as much as is possible to form a ring. In addition, these materials may have a plurality of substituent groups, and the plurality of substituent groups may be the same or different from each other. Furthermore, the plurality of substituent groups may be combined as much as is possible to form a ring.

Since the photoelectric conversion layer 12' contains a fullerene or a fullerene derivative, electrons generated in the photoelectric conversion process may be transported to the pixel electrode 104 or the opposing electrode 108 in a speedy manner through fullerene molecules or fullerene derivative molecules. When the fullerene molecules or the fullerene derivative molecules are in the state being concatenated so as to form an electron path, the electron transporting ability is improved. Accordingly, high-speed response of the photoelectric conversion device may be realized. Therefore, it is preferable that a fullerene or a fullerene derivative is contained in the photoelectric conversion layer 12' to be 40% or more. When a fullerene or a fullerene derivative is contained too much, the p-type organic semiconductor is decreased, and accordingly, the bonding boundary is decreased. Therefore, the dissociation efficiency of excitons decreases.

It is further more preferable that a tryarylamine compound described in Japanese Patent No. 4213832 and the like is used as the p-type organic semiconductor mixed together with a fullerene or a fullerene derivative in the photoelectric conversion layer 12', a high SN ratio of the photoelectric conversion device may be realized. When the ratio of the fullerene or the fullerene derivative in the photoelectric conversion layer 12' is too high, the triarylamine compound is decreased. Accordingly, the amount of absorption of incident light decreases. Therefore, the photoelectric conversion efficiency decreases. Thus, it is preferable that the fullerene or the fullerene derivative contained in the photoelectric conversion layer 12' is equal to or less than 85%.

As the materials of the first blocking layer 16' and the second blocking layer 18, electron-donating organic materials may be used. Described in detail, as a low-molecule material, an aromatic diamine compound such as N,N'-bis(3-methylphenyl)-(1,1'-biphenyl)-4,4' diamine (TPD) or 4,4'-bis [N-(naphtyl)-N-phenylamine]biphenyl(α-NPD), a porphin compound such as oxazole, oxadiazole, triazole, imidazole, imidazolone, a stilbene derivative, a pyrazolone derivative, tetrahydroimidazole, a polyarylalkane, butadiene, 4,4',4''-tris (N-(3-methylphenyl)N-phenylamino)triphenylamine (m-MTDATA), a porphyrin compound such as porphin, copper tetraphenylporphin, phthalocyanine, copper phthalocyanine and titanium phthalocyanine oxide, a triazole derivative, an oxadiazole derivative, an imidazole derivative, a polyarylalkane derivative, a pyrazoline derivative, a pyrazolone derivative, a phenylenediamine derivative, an anilamine derivative, an amino-substituted chalcone derivative, an oxazole derivative, a styryl-anthracene derivative, a fluorenone derivative, a hydrazone derivative, a silazane derivative, or the like may be used. As a polymer material, a polymer such as phenylenevinylene, fluorene, carbazole, indole, pyrene, pyrrole, picolin, thiophene, acetylene and diacetylene, or a derivative thereof may be used. Any compound having a sufficient hole transporting ability may be used even if it is not an electron-donating compound.

As the electric charge blocking layer 15', an inorganic material may be used. Generally, an inorganic material has permittivity that is higher than that of an organic material. Thus, when the inorganic material is used in the electric charge blocking layer 15', a high voltage is applied to the photoelectric conversion layer 12', and accordingly, the photoelectric conversion efficiency may be increased. As a material that forms the electric charge blocking layer 15', there is calcium oxide, chrome oxide, iron chrome oxide, manganese oxide, cobalt oxide, nickel oxide, cooper oxide, iron gallium oxide, iron strontium oxide, niobium oxide, molybdenum oxide, iron indium oxide, silver indium oxide, iridium oxide, or the like.

In the electric charge blocking layer 15' configured by a plurality of layers, it is preferable that a layer, which is adjacent to the photoelectric conversion layer 12', of the plurality of layers is a layer that is formed from the same material as that of the p-type organic semiconductor included in the photoelectric conversion layer 12'. In such a case, by using the same p-type organic semiconductor for the electric charge blocking layer 15', generation of an intermediate level in the boundary of the layer adjacent to the photoelectric conversion layer 12' is suppressed. Accordingly, the dark current may be further suppressed.

In a case where the electric charge blocking layer 15' is configured as a single layer, the layer may be a layer that is formed from an inorganic layer. On the other hand, in a case where the electric charge blocking layer 15' is configured as a plurality of layers, one, two, or more layers may be layers that are formed from inorganic materials.

Figure 21:
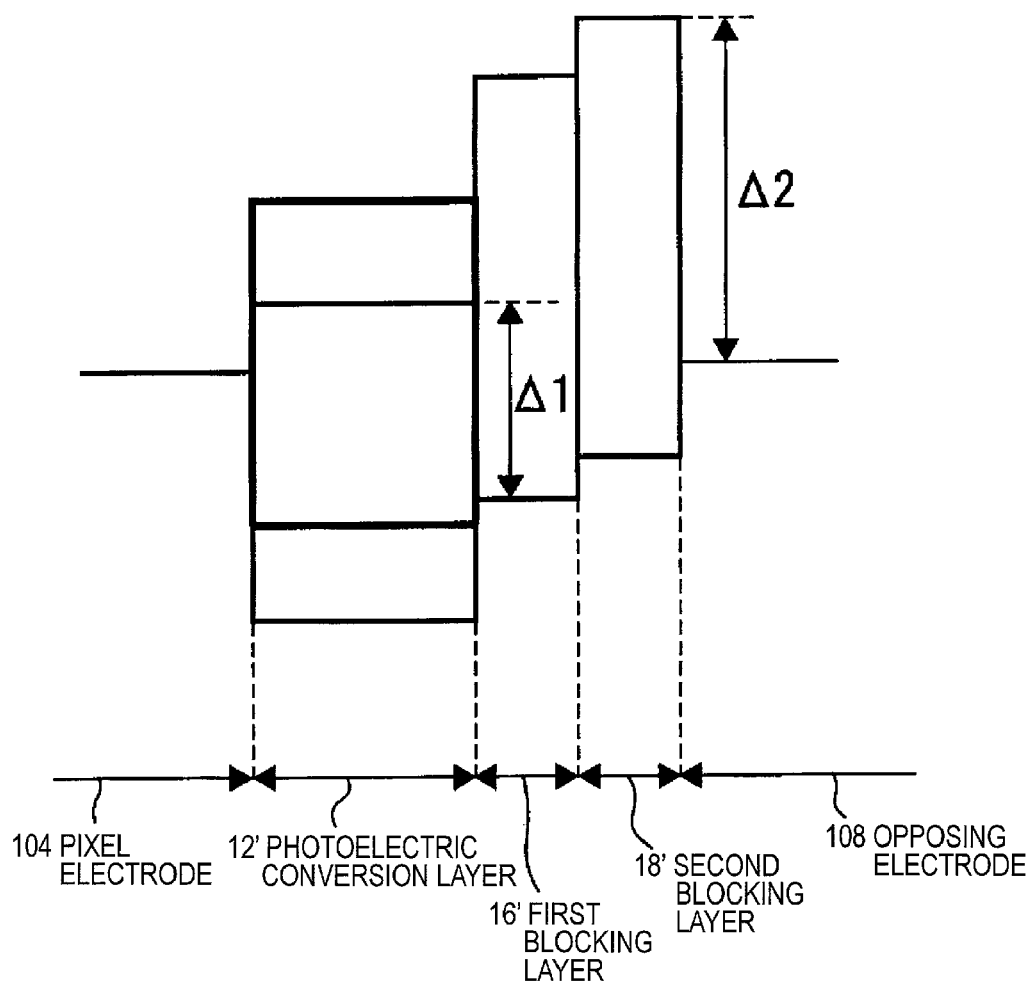
FIG. 21 is a diagram showing the energy bands of the photoelectric conversion device shown in FIG. 20.

FIG. 21 is a diagram showing the energy bands of the photoelectric conversion device shown in FIG. 20. In FIG. 21, sequentially from the left side, the energy levels of the pixel electrode 104, the photoelectric conversion layer 12', the first blocking layer 16', the second blocking layer 18', and the opposing electrode 108 are represented. In addition, to a configuration stacked in the reverse order of a pixel electrode 104, not shown in the figure, the second blocking layer 18', the first blocking layer 16', the photoelectric conversion layer 12', and the opposing electrode 108, similarly to this configuration, the description below may be applied.

Here, a difference between the electron affinity Ea of the n-type organic semiconductor that is included in the photoelectric conversion layer 12' and the ionization potential Ip of the first blocking layer 16' that is adjacent to the photoelectric conversion layer 12' is assumed to be Δ1. In addition, a difference between the electron affinity Ea of the second blocking layer 18' and the work function of the opposing electrode 108 that is adjacent to the second blocking layer 18 is assumed to be Δ2. On the other hand, in the configuration that is reversely stacked as described above, not shown in the figure, a difference between the electron affinity of the second blocking layer 18' and the work function of the pixel electrode 104 that is adjacent to the second blocking layer 18' is assumed to be Δ2.

The photoelectric conversion device shown in FIGS. 20 and 21 may suppress an increase in the dark current by being configured so as to satisfy the following condition (a). In addition, by configuring the photoelectric conversion device so as to satisfy the conditions (b) and (c) in addition to the condition (a), the increase in the dark current may be further suppressed.

(a) the difference Δ1 between the ionization potential Ip of the first blocking layer 16', which is adjacent to the photoelectric conversion layer 12', and the electron affinity Ea of the n-type organic semiconductor is equal to or larger than 1 eV;

(b) the total thickness of the electric charge blocking layer 15' including the first blocking layer 16' and the second blocking layer 18' is equal to or larger than 20 nm; and (c) the film thickness of the first blocking layer 16' adjacent to the photoelectric conversion layer 12' is equal to or larger than 10 nm.

Figure 22:
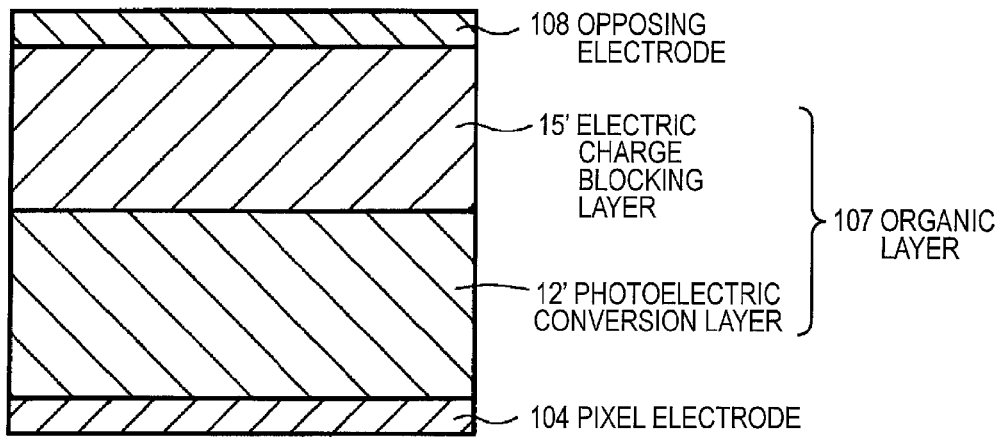
FIG. 22 is a cross-sectional view representing a configuration example other than the organic layer.
Figure 23:
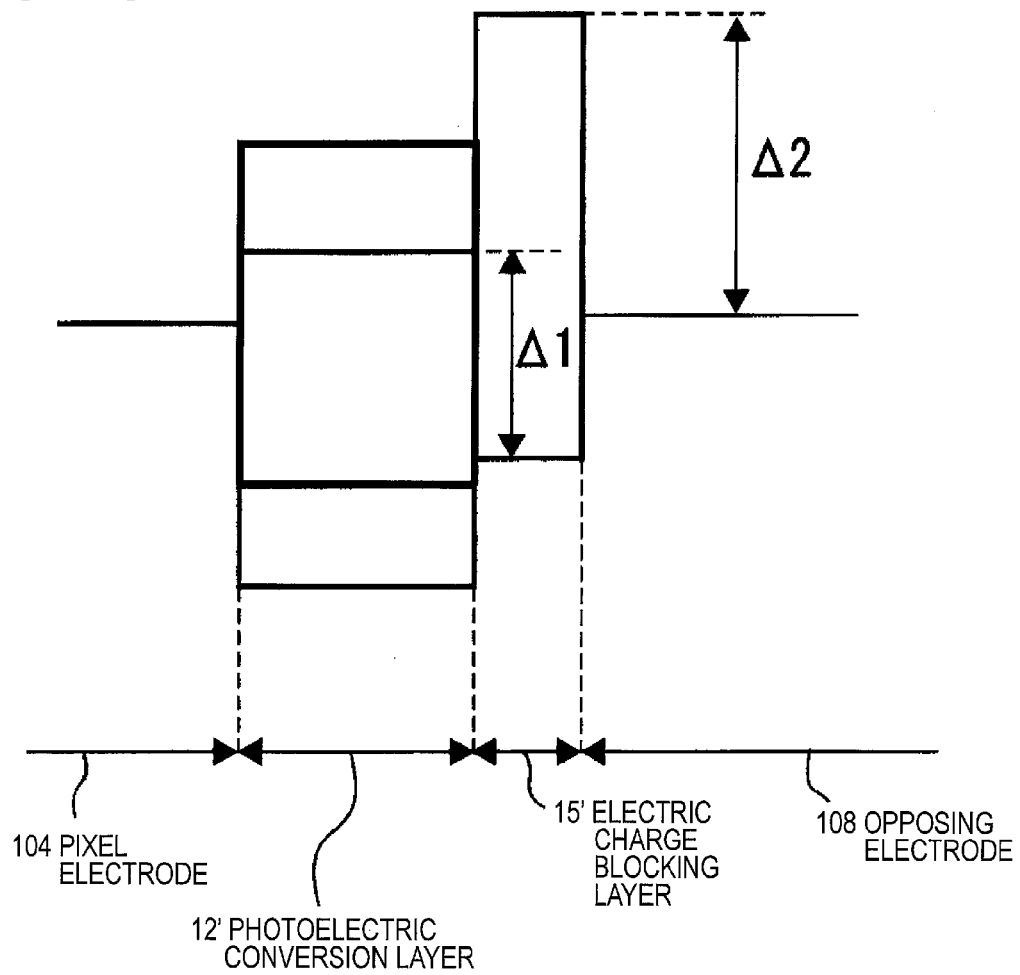
FIG. 23 is a diagram representing the energy bands of the photoelectric conversion device shown in FIG. 22.

FIG. 22 is a cross-sectional view representing a configuration example other than the organic layer. FIG. 23 is a diagram representing the energy bands of the photoelectric conversion device shown in FIG. 22. In the photoelectric conversion device shown in FIG. 22, the electric charge blocking layer is configured as a single layer. In addition, to a configuration stacked in the reverse order of a pixel electrode 104, not shown in the figure, the electric charge blocking layer 15', the photoelectric conversion layer 12', and the opposing electrode 108, similarly to this configuration, the description below may be applied.

In a case where the electric charge blocking layer 15' is configured as a single layer, a difference between the electron affinity Ea of the n-type organic semiconductor that is included in the photoelectric conversion layer 12' and the ionization potential Ip of the electric charge blocking layer 15' is assumed to be Δ1. In addition, a difference between the electron affinity Ea of the electric charge blocking layer 15' and the work function of the opposing electrode 108 is assumed to be Δ2. On the other hand, in the configuration that is reversely stacked as described above, not shown in the figure, a difference between the electron affinity of the electric charge blocking layer 15' and the work function of the pixel electrode 104 is assumed to be Δ2.

The photoelectric conversion device shown in FIGS. 22 and 23 may suppress an increase in the dark current by being configured so as to satisfy the following condition (a). In addition, by configuring the photoelectric conversion device so as to satisfy the condition (b) in addition to the condition (a), the increase in the dark current may be further suppressed.

(a) the difference Δ1 between the ionization potential Ip of the electric charge blocking layer 15' and the electron affinity Ea of the n-type organic semiconductor is equal to or larger than 1 eV (b) the film thickness of the electric charge blocking layer 15' configured as a single layer is equal to or larger than 20 nm In other words, according to the configuration of the organic layer shown in FIGS. 20 and 22, the increase in the dark current may be suppressed by configuring the electric charge blocking layer 15' as a single layer or a plurality of layers and satisfying the following conditions.

(a) the difference (Δ1) between the ionization potential Ip of the electric charge blocking layer 15' (in a case where the electric charge blocking layer 15' is configured by a plurality of layers, a layer adjacent to the photoelectric conversion layer 12') and the electron affinity Ea of the n-type organic semiconductor is equal to or larger than 1 eV (b) the total film thickness of the electric charge blocking layer 15' is equal to or larger than 20 nm (c) in a case where the electric charge blocking layer 15' is configured by a plurality of layers, the thickness of the layer, which is adjacent to the photoelectric conversion layer 12', out of the plurality of layers is equal to or larger than 10 nm In the photoelectric conversion device shown in FIGS. 20 and 22, in order to prevent an increase in the dark current by injecting electrons from the opposing electrode 108 or the pixel electrode 104 to the photoelectric conversion layer 12', Δ2 is preferably equal to or larger than 1.3 eV.

When a voltage is applied to the organic layer 107 of the photoelectric conversion device having the above-described configuration, it is advantageous that the photoelectric conversion efficiency is improved. The applied voltage is determined based on the field intensity applied to the organic layer 107. The electric field to be applied to the organic layer 107 is preferably equal to or higher than $1 \times 10^3$ V·m$^{-1}$. In addition, the electric field to be applied to the organic layer 107 is more preferably equal to or higher than $1 \times 10^5$ V·m$^{-1}$, and is further more preferably equal to or higher than $1 \times 10^7$ V·m$^{-1}$. Moreover, since the electric field becomes a high electric field, the dark current of the photoelectric conversion device increases, and the required application voltage increases. Accordingly, the design and the manufacture of circuits including the opposing electrode voltage supplying portion 115 become complicated. Thus, the application voltage needs to be appropriately determined for achieving the improvement of the SN ratio of the photoelectric conversion device and the reduction of the solid-state image pickup apparatus.

<Pixel Electrode>

The pixel electrode 104 collects electric charge of electrons or holes that are generated in the organic layer 107 including the photoelectric conversion layer positioned on the pixel electrode. A signal is generated from the electric charge collected in each pixel electrode by the reading circuit 116 of the corresponding pixel, and an image is synthesized based on the signals acquired from a plurality of pixels.

When the level difference corresponding to the film thickness of the pixel electrode is steep in an end portion of the pixel electrode 104, there is distinguished unevenness on the surface of the pixel electrode, or dust (particles) is attached to the pixel electrode, the organic layer 107 positioned on the pixel electrode becomes thinner than the desired film thickness or cracks are generated therein. When the opposing electrode 108 is formed on the organic layer in such a state, a pixel defect such as an increase in the dark current or occurrence of a shorted circuit occurs due to a contact between the pixel electrode and the opposing electrode or concentration of the electric field in the defective portion. Furthermore, it is found by the review of the inventor of the present invention that such a defect deteriorates the contact between the pixel electrode and the organic layer and the heat resistance of the photoelectric conversion device, whereby degrading the reliability of the solid-state image pickup apparatus.

In order to improve the reliability of the solid-state image pickup apparatus by preventing such a defect, the surface roughness Ra of the pixel electrode 104 is preferably equal to or less than 0.5 nm. As the surface roughness Ra of the pixel electrode decreases, the unevenness of the surface decreases, and thereby the surface flatness is improved. In addition, in order to eliminate the particles located on the pixel electrode, it is preferable that the substrate is cleaned by using a general technology used in a semiconductor manufacturing process before the organic layer 107 is formed.

Figure 24:
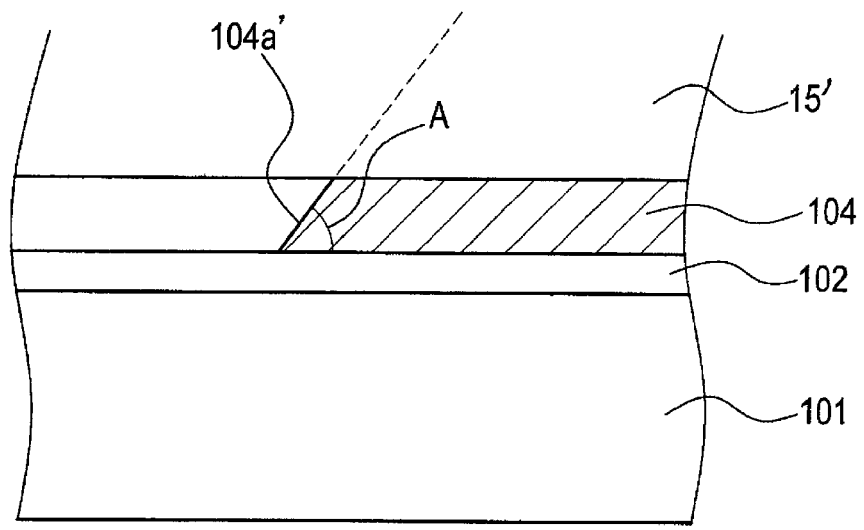
FIG. 24 is a schematic cross section view representing one example of the configuration of the pixel electrode.

Next, the configuration of the end portion of the pixel electrode for preventing such a defect will be described. FIG. 24 is a schematic diagram representing the cross section of the pixel electrode. The pixel electrode 104 is disposed on the substrate 101 through the insulating layer 102. In such a configuration, the electric charge blocking layer 15' is stacked on the insulating layer 102 so as to cover the pixel electrode 104.

It is preferable that an inclining face 104' is disposed in the end portion of the pixel electrode 104. It is more preferable that A is equal to or less than 50° in a case where the inclining face 104a is tilted by angle A with respect to the surface (including the insulating layer 102) of the substrate 101. By disposing the inclining face in the pixel electrode, the defect in the organic layer is decreased, and the adhesiveness between the pixel electrode and the organic layer is improved.

<Complete Planarization of Pixel Electrode>

In order to completely eliminate the level difference in the end portion of the pixel electrode, the surface of the pixel electrode and the surface of the insulating layer between the pixel electrodes are configured as the same surface. In other words, the pixel electrode is preferably configured so as to be completely planarized. Hereinafter, the configuration for completely planarizing the pixel electrode, and a manufacturing method thereof will be described.

The configuration for completely planarizing the pixel electrode is preferably formed by using multi-layer wiring technology used in a general semiconductor manufacturing process such as a standard CMOS image sensor process, from the viewpoint of reliability and manufacturing cost thereof. As the method of manufacturing the pixel electrode having the completely planarized configuration, there are two methods including a groove separation (trench isolation) method and a damascene method. These manufacturing methods are appropriately selected in consideration of the material of the pixel electrode that is determined in accordance with the organic photoelectric conversion material and manufacturing cost.

<Groove Separation Method>

Figure 25:
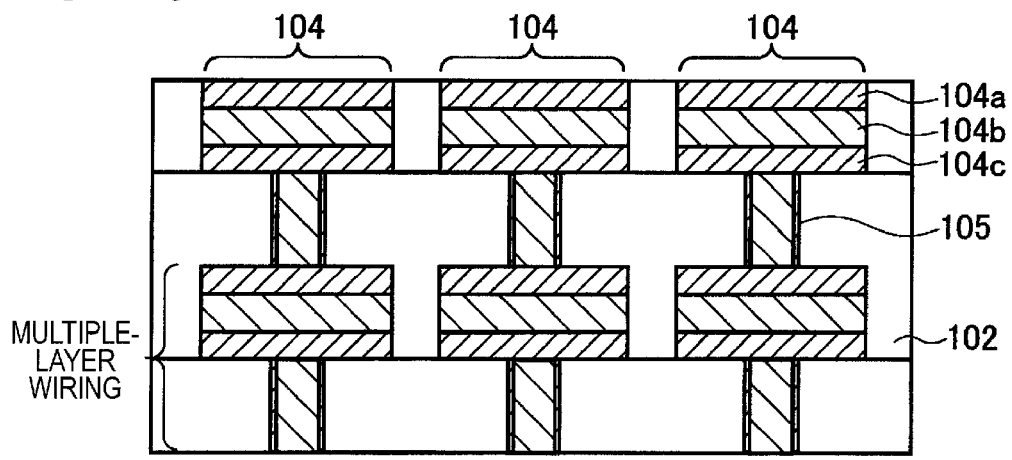
FIG. 25 is a diagram representing the configuration of the pixel electrode that is formed by using a groove separating method.

The procedure for forming a pixel electrode by using the groove separation method will be described with reference to FIGS. 25 to 28. As shown in FIG. 25, a metal layer that becomes a pixel electrode 104 is formed on a multi-layer wiring of a reading circuit through an interlayer insulating film by performing a general semiconductor manufacturing process. Right below the metal layer in an area in which a pixel electrode, an opposing electrode connection pad, a bonding pad, and the like are formed, a via plug (connection portion) 105 that connects a multi-layer wiring that is formed on a further lower layer and the metal layer to each other is formed in advance. It is preferable that the metal layer is formed to have the same configuration as that of the multi-layer wiring of the reading circuit from the viewpoint of reliability and manufacturing cost. The metal layer, for example, is preferably formed to have a three-layer configuration of a barrier metal layer 104a (TiN), a wiring layer 104b (Al), and a barrier metal layer 104c (TiN) for a multi-layer wiring process using aluminum (Al) wirings.

Figure 26:
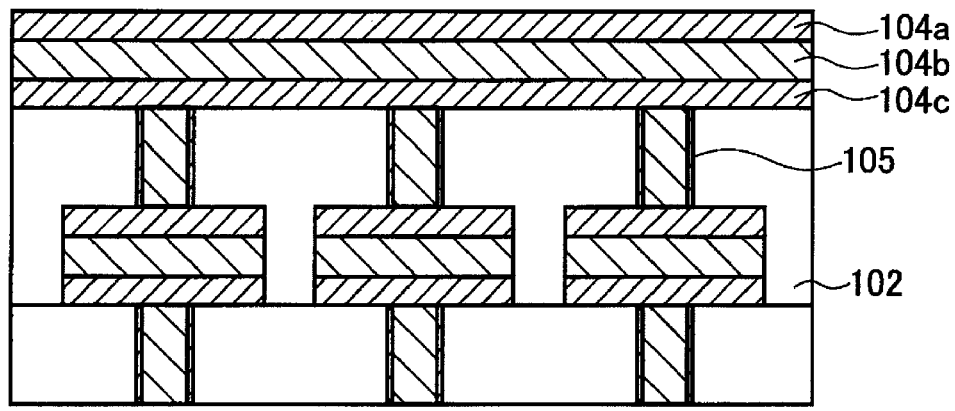
FIG. 26 is a diagram illustrating the order of forming the pixel electrode by using a groove separating method.

As the procedure for forming the pixel electrode 104, first, as represented in FIG. 26, on the insulating layer 102 in which the multi-layer wiring is formed in advance, the barrier metal layer 104c, the wiring layer 104b, and the barrier metal layer 104a are stacked in this order.

Figure 27:
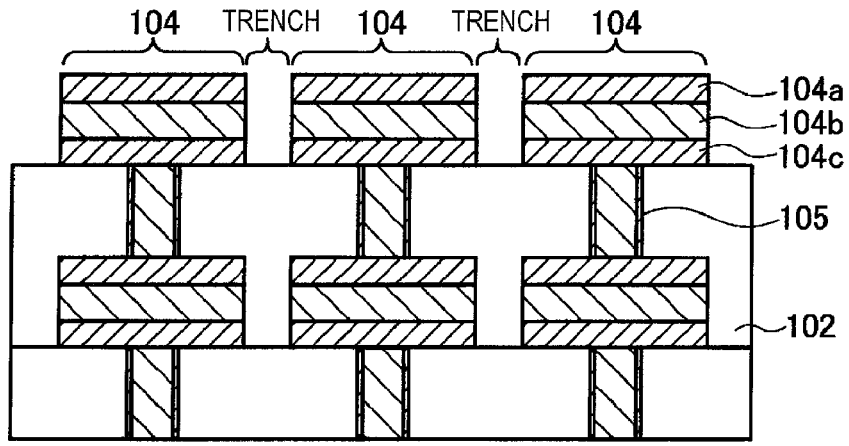
FIG. 27 is a diagram illustrating the order of forming the pixel electrode by using a groove separating method.

Then, as represented in FIG. 27, the metal layer that is positioned in an area other than the area in which the pixel electrode 104, the opposing electrode connection pad, the bonding pad, and the like are formed is eliminated and a groove (trench) corresponding to the thickness of the metal layer is formed around the pixel electrode 104 through a photolithographic process and a dry etching process that are generally used as general multi-layer wiring technology.

Figure 28:
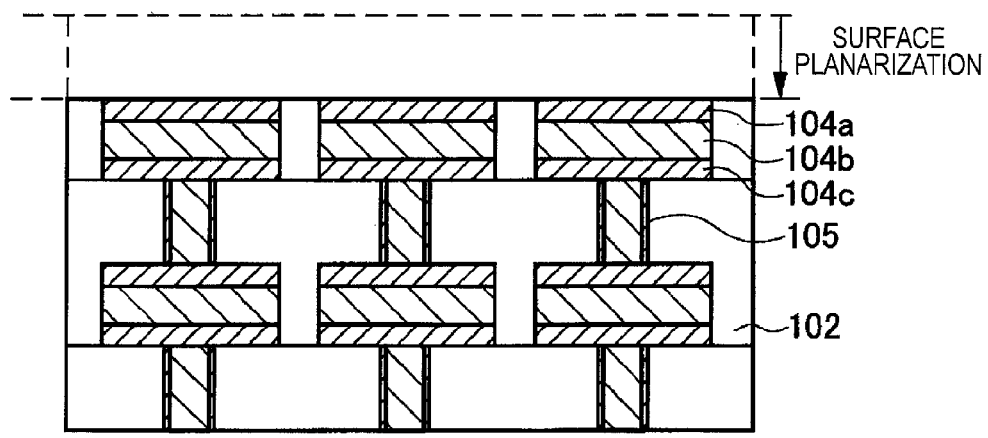
FIG. 28 is a diagram illustrating the order of forming the pixel electrode by using a groove separating method.

Subsequently, as shown in FIG. 28, an insulating layer is formed on the metal layer patterned in the shape of the pixel electrode through the multi-layer wiring process. Since the insulating layer is generally used in a CMOS image sensor process or the like, it is preferable that the material of the interlayer insulating film used for the multi-layer wiring of the lower layer is used so as to form the film, from the viewpoint of reliability and manufacturing cost. For example, silicon oxide, silicon nitride, silicon nitride oxide or laminated films thereof are generally used.

After the interlayer insulating film is formed on the metal layer patterned in the shape of the pixel electrode, surface planarization is performed by using a chemical mechanical polishing (CMP) method or an etch back method. Since the interlayer insulating layer is generally used in a CMOS image sensor process or the like, it is preferable that the CMP condition used for the multi-layer wiring of the lower layer is applied, from the viewpoint of reliability and manufacturing cost. In a case where a multi-layer wiring is formed, generally, the polishing process is completed so as to allow the interlayer insulating film to have a predetermined thickness. However, here, the polishing process is continued until the surface of the metal layer patterned in the shape of the pixel electrode 104 is exposed. The polishing speed for TiN composing the bather metal layer 104a, which is formed on the surface of the metal layer, is lower than that for the interlayer insulating film located on the periphery thereof. Accordingly, the barrier metal layer 104a becomes a polishing stopper, and at a time point when the CMP process is completed, a completely planarized electrode in which the surface of the pixel electrode and the surface of the trench (insulating layer) between the pixel electrodes are on the same plane may be formed. Moreover, by appropriately continuing the CMP process to the degree at which dishing cannot be performed for the surface of the trench even when the surface of the material TiN is exposed, the surface of TiN is polished. Accordingly, a pixel electrode 104 that is markedly planarized may be acquired, which is advantageous.

<Damascene Method>

The procedure for forming a pixel electrode by using the damascene method will be described with reference to FIGS. 29 to 33.

Figure 29:
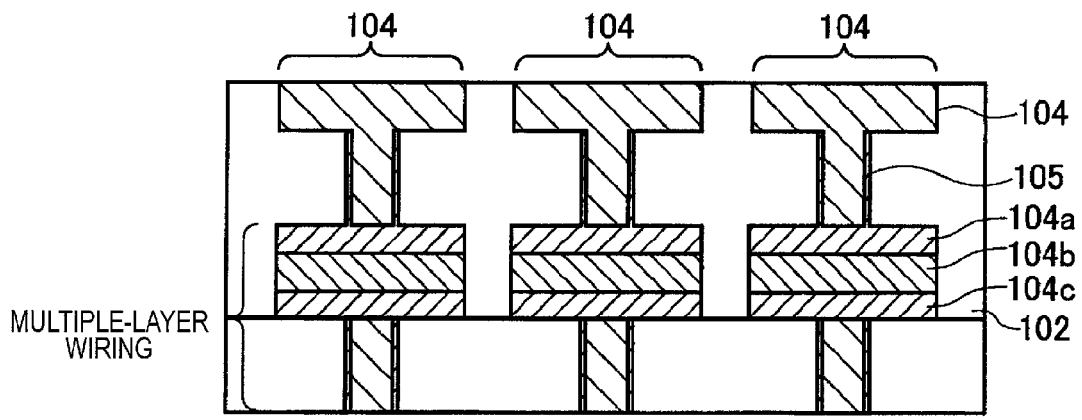
FIG. 29 represents the configuration of the pixel electrode that is formed by using a damascene method.

FIG. 29 represents the configuration of the pixel electrode 104 that is formed by using the damascene method. The pixel electrode 104 is formed from a material such as tungsten (W) that composes the via plug, and the surface of the pixel electrode 104 and the surface of the insulating layer 102 are on the same plane.

Figure 30:
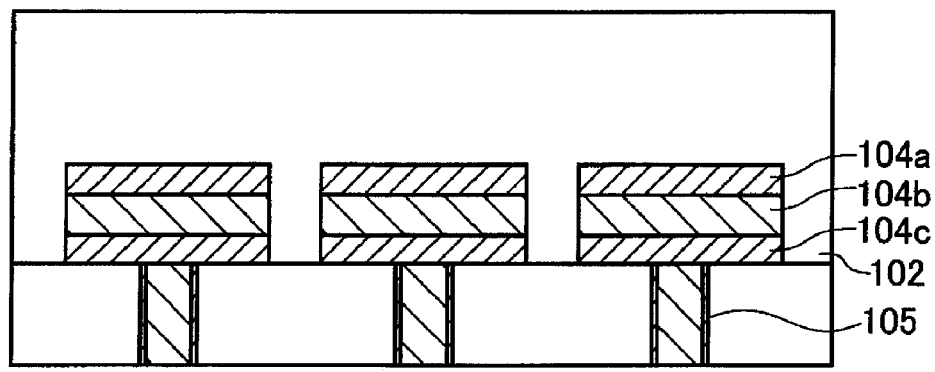
FIG. 30 is a diagram illustrating the order of forming the pixel electrode by using the damascene method.

As the procedure for forming the pixel electrode 104, first, as shown in FIG. 30, on the multilayer wiring of the reading circuit, an interlayer insulating film used in the manufacturing process is formed, and the surface thereof is planarized by being polished through the CMP process or the like.

Figure 31:
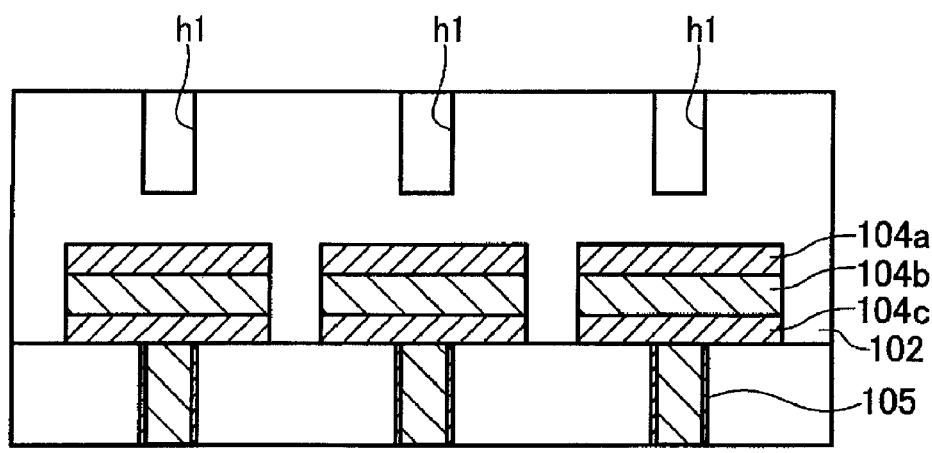
FIG. 31 is a diagram illustrating the order of forming the pixel electrode by using the damascene method.

As represented in FIG. 31, in each area in which the pixel electrode 104, the opposing electrode connection pad, the bonding pad, and the like are formed, a via hole h1 that is used for forming a via plug, which connects the pixel electrode 104, the opposing electrode connection pad, the bonding pad, and the like to the multilayer wiring, is formed to be open through the photolithographic process and the dry etching process that are used in the multilayer wiring process. Here, in a case where a dual-damascene method is used, the interlayer insulating film is etched by a depth acquired by subtracting the thickness of the pixel electrode 104 from the thickness of the interlayer insulating film. Since the etching stopper is disposed, the variation in the etching process may be suppressed by forming the interlayer insulating film having a multi-layer configuration in which materials having different etching speeds are disposed at the depth acquired by subtracting the thickness of the pixel electrode 104 from the thickness of the interlayer insulating film, which is advantageous.

Figure 32:
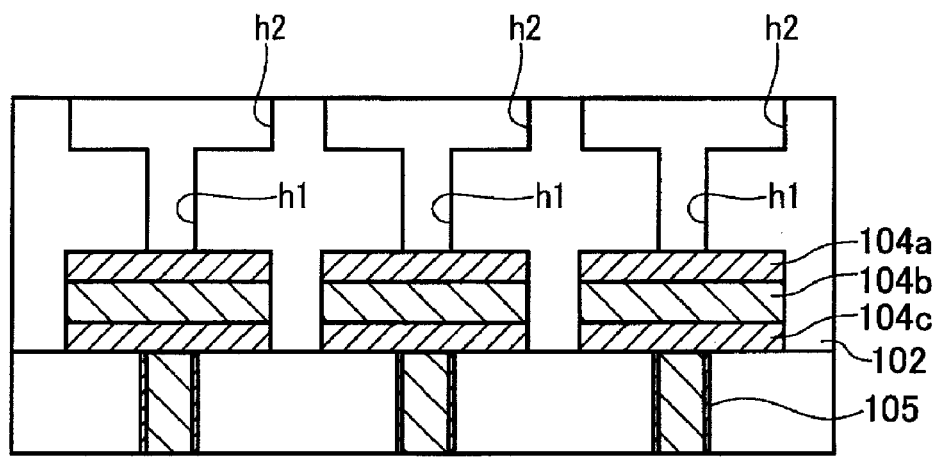
FIG. 32 is a diagram illustrating the order of forming the pixel electrode by using the damascene method.

Subsequently, as represented in FIG. 32, when the via holes h1 are formed, additionally, openings h2 are formed in accordance with the shapes of the pixel electrode 104, the opposing electrode pad, and the bonding pad through the photolithographic process and the dry etching process. When a portion corresponding to the thickness of the pixel electrode 104 is etched, the via hole h1 formed in advance passes through the multilayer wiring that is located right below the via hole h1.

Figure 33:
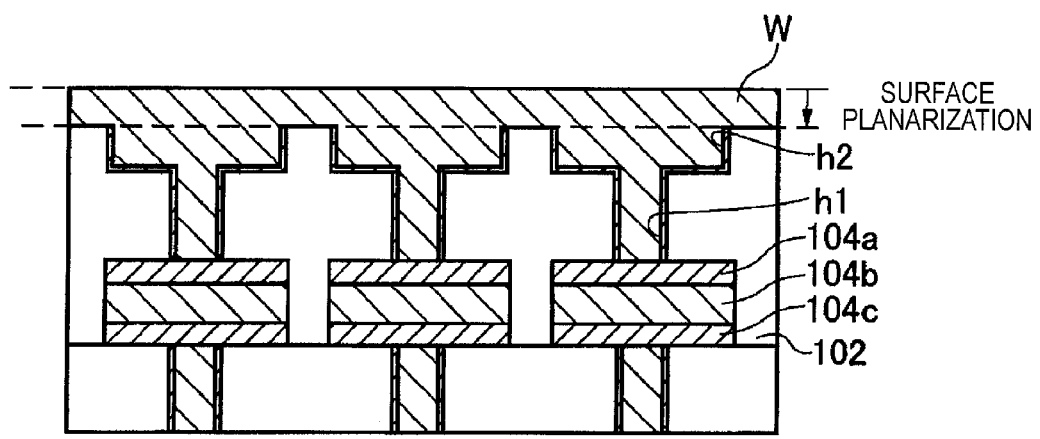
FIG. 33 is a diagram illustrating the order of forming the pixel electrode by using the damascene method.

It is preferable that the same material as that of the via plug used in the multilayer wiring of the lower layer is allowed to grow in the via hole h1, from the viewpoint of reliability and manufacturing cost. As such a material, generally, molybdenum (Mo) or tungsten W is formed by using a chemical vapor deposition (CVD) method. Before a film is formed with the material of the via plug, TiN or the like as a barrier metal is formed in advance as a film on the peripheral faces of the via hole h1 and the opening h2 by using a sputtering method or a CVD method. As represented in FIG. 33, after a film is formed with the material of the via plug by coating the interlayer insulating film on the surface, the surface is planarized by using the CMP method and the etch back method. Since the interlayer insulating film becomes a stopper, when the surface of the interlayer insulating film is exposed, the material of the via plug becomes the pixel electrode 104. Accordingly, the surface of the pixel electrode 104 and the surface of the insulating layer 102 are on the same plane, whereby a completely planarized electrode is formed.

As described above, the completely planarized electrode eliminates the level difference between the surface of the pixel electrode and the surface of the interlayer insulating layer, whereby preventing an increase in the dark current and occurrence of a short circuit as a defect in the configuration of the solid-state image pickup apparatus in which the organic layer is stacked. Moreover, since the standard material of the multilayer wiring is used for the pixel electrode 104, the pixel electrode 104 also serves as a light shielding layer that blocks stray light toward the reading circuit. In addition, as the pixel electrode 104 reflects incident light to the organic layer side, the incident light may be effectively used.

<Opposing Electrode>

The opposing electrode 108 applies an electric field to the organic layer 107 by inserting the organic layer 107 including the photoelectric conversion layer together with the pixel electrode 104 and collects electric charge, which has the polarity opposite to the signal electric charge collected in the pixel electrode 104, out of the electric charge generated in the photoelectric conversion layer. Such collection of the electric charge having the opposite polarity does not need to be separately performed for each pixel. Accordingly, the opposing electrode 108 may be configured to be common to a plurality of pixels. Thus, sometimes, the opposing electrode 108 is referred to as a common electrode.

The opposing electrode 108 allows light to be incident to the organic layer 107 including the photoelectric conversion layer. Accordingly, the opposing electrode 108 is preferably formed as a transparent conductive film. For example, as the material of the opposing electrode 108, there are metal, metal oxide, metal nitride, metal borides, an organic conductive compound, and mixtures thereof. As a concrete example of the material of the opposing electrode 108, there are: conductive metal oxides such as tin oxide, zinc oxide, indium oxide, indium tin oxide (ITO), indium zinc oxide (IZO), indium tungsten oxide (IWO), and titanium oxide; metal nitrides such as TiN; metals such as gold (Au), platinum (Pt), silver (Ag), chromium (Cr), nickel (Ni), and aluminum (Al); mixtures or stacks of such a metal and such a conductive metal oxide; organic conductive compounds such as polyaniline, polythiophene, and polypyrrole, and stacks of such organic conductive compounds and ITO; and the like. As the material of the transparent conductive film, any one material of ITO, IZO, tin oxide, antimony-doped tin oxide (ATO), fluorine-doped tin oxide (FTO), zinc oxide, antimony-doped zinc oxide (AZO), and gallium-doped zinc oxide (GZO) may be preferably used.

In a case where the reading circuit 116 is the CMOS type, the sheet resistance of the opposing electrode 108 is preferably equal to or lower than 10 K$\Omega$/, and is more preferably equal to or lower than 1 k$\Omega$. On the other hand, in a case where the reading circuit 116 is the CCD type, the sheet resistance of the opposing electrode 108 is preferably equal to or lower than 1 K$\Omega$/, and is more preferably equal to or less than 0.1 K$\Omega$/.

<Sealing Layer>

As the sealing layer, the following conditions are required.

First, the sealing layer protects the photoelectric conversion layer by blocking infiltration of factors that deteriorate the photoelectric conversion material included in a solution, plasma, or the like in each manufacturing process of a stacked-type solid-state image pickup apparatus.

Second, the sealing layer prevents deterioration of the photoelectric conversion layer over a long time of conservation or use by blocking factors that deteriorate the photoelectric conversion material such as a water molecule after the stacked-type solid-state image pickup apparatus is manufactured.

Third, the sealing layer does not deteriorate the photoelectric conversion layer formed in advance when the sealing layer is formed. Fourth, since incident light arrives at the photoelectric conversion layer through the sealing layer, the sealing layer needs to be transparent for light of a wavelength that is detected by the photoelectric conversion layer.

The sealing layer may be configured as a thin film that is formed from a single material. However, by configuring the sealing layer so as to have a multilayer configuration and assigning different functions to the layers, advantages such as alleviation of stress applied to the entire sealing layer, suppression of generation of defects such as cracks and pinholes due to oscillation during the manufacturing process or the like, and easy optimization of development of materials may be expected. For example, the sealing layer may be formed to have a two-layer configuration in which, on a layer achieving the original purpose of blocking the infiltration of deterioration factors such as water molecules, a "sealing auxiliary layer" having a function, that cannot be easily realized by the layer, is stacked. The sealing layer may be configured to have a configuration of three or more layers. However, the number of layers preferably needs to be as small as is possible, in consideration of the manufacturing cost.

<Formation of Sealing Layer according to Atomic Layer Deposition Method>

The organic photoelectric conversion material has the performance that markedly deteriorates due to the deterioration factors such as water molecules. Accordingly, the entire photoelectric conversion layer needs to be coated with ceramic such as metal oxide, metal nitride, or metal nitride oxide, which is dense or diamond-like carbon (DLC) and be sealed so as not to allow the water molecules to penetrate therein.

Generally, as the sealing layer, aluminum oxide, silicon oxide, silicon nitride, or silicon nitride oxide, or a stacked configuration thereof, a stacked configuration thereof with organic polymers, or the like is formed by using various vacuum film-forming technologies. Moreover, in these general sealing layers, a thin film cannot easily grow (the level difference becomes a shade) due to the level difference formed by structural bodies on the substrate surface, a tiny defect of the substrate surface, particles attached to the substrate surface, or the like, and accordingly, the film thickness of the sealing layer markedly decreases, compared to a flat portion. Therefore, the portion of the level difference becomes a path through which the deterioration factors penetrate. In order to completely coat the level difference with the sealing layer, the entire sealing layer needs to be thick by being formed to have a film thickness of 1 μm or more on the flat portion.

In a stacked-type solid-state image pickup apparatus having a pixel size of 2 μm or less, particularly about 1 μm, when a distance between a color filter and a photoelectric conversion layer, that is, the film thickness of the sealing layer is large, incident light diffracts and spread inside the sealing layer. Accordingly, a crosstalk is generated. Therefore, for a stacked-type solid-state image pickup apparatus having a pixel size of about 1 μm, a sealing layer material and a manufacturing method, in which the performance of the device does not deteriorate even when the film thickness of the entire sealing layer decreases, are necessary.

The atomic layer deposition (ALD) method is one type of the CVD method. The ALD method is a technology of forming a thin film by alternately repeating adsorption and reaction of organic metal compound molecules, metal halide molecules, or metallic hydride molecules, which become the material of the thin film, with a substrate surface and decomposition of unreacted groups contained therein. When the material of the thin film arrives at the substrate surface, the substrate surface is in the low-molecule state. Accordingly, when there is a negligible space through which the low molecules may pass, the thin film may grow. Thus, according to a general thin-film forming method, a portion of the level difference, which cannot be easily coated completely, is completely coated (the thickness of the thin film growing in the portion of the level difference is the same as that of the thin film growing in the flat portion). In other words, the coating of the level difference is very superior. Accordingly, the level difference due to structural bodies formed on the substrate surface, a tiny defect of the substrate surface, particles attached to the substrate surface, or the like may be completely coated. Therefore, the portion of the level difference does not become a path through which the deterioration factors of the photoelectric conversion material may pass. According to the general technology, when the formation of the sealing layer is performed by using the atomic layer deposition method, the required film thickness of the sealing layer may be effectively formed to be thin.

When the sealing layer is formed by using the atomic layer deposition method, a material corresponding to ceramic, which is desirable as the sealing layer, may be appropriately selected. First, in order to use an organic photoelectric conversion material, the material of the photoelectric conversion layer according to the present invention is limited to a material that may grow as a thin film at a relatively low temperature, so that the organic photoelectric conversion material does not deteriorate. According to the atomic layer deposition method using alkyl aluminum or aluminum halide as a material, a dense thin film of aluminum oxide may be formed at a temperature of 200° C. or lower at which the organic photoelectric conversion material does not deteriorate. In particular, when trimethyl aluminum is used, a thin film of aluminum oxide may be formed even at about 100° C., which is advantageous. By appropriately selecting a material of silicon oxide or titanium oxide, similarly to aluminum oxide, a dense thin film may be formed at a temperature lower than 200° C., which is advantageous.

<Sealing Auxiliary Layer>

Regarding the thin film formed by using the atomic layer deposition method, a thin film having an incomparably superior quality may be formed at a low temperature, from the viewpoint of the coating of the level difference and the density. First, the physical property of the material of the thin film may deteriorate due to chemicals used in the photolithographic process. For example, the thin film of aluminum oxide that is formed by using the atomic layer deposition method is amorphous. Accordingly, the surface of the thin film erodes with an alkali solution such as developer or stripping liquid. In such a case, a thin film having superior chemical resistance needs to be formed on the thin film of the aluminum oxide that is formed by using the atomic layer deposition method. In other words, a sealing auxiliary layer that is a functional layer for protecting the sealing layer is necessary.

In addition, the thin film formed by using a CVD method such as the atomic layer deposition method frequently has very strong internal tensile stress. Accordingly, cracks in the thin film may occur so as to deteriorate through a process of repeating intermittent heating and cooling as a semiconductor manufacturing process or the conservation or use thereof under an atmosphere of high temperature and high humidity for a long time.

In order to address the cases of the sealing layer formed by using the atomic layer deposition method, a configuration in which a sealing auxiliary layer, which includes at least one of metal oxide ceramic, metal nitride ceramic, and metal nitride oxide ceramic, that is formed by using a physical vapor deposition (PVD) method and has superior chemical resistance is disposed may be preferably used. Here, a sealing layer that is formed by using the atomic layer deposition method is configured as a first sealing layer, and a layer that is formed on the first sealing layer by using the PVD method and includes any one of metal oxide, metal nitride, and metal nitride oxide is configured as a second sealing layer. In such a case, the chemical resistance of the entirety of the sealing layers may be improved in an easy manner. In addition, the ceramic formed as a film by using a PVD method such as a sputtering method frequently has strong pressing stress and may offset the tensile stress of the first sealing layer formed by using the atomic layer deposition method. Accordingly, the stress of the entirety of the sealing layers is alleviated, and thereby the reliability of the sealing layers is improved. In addition, the occurrence of defects such as deterioration of performance of the photoelectric conversion layer or the like or destruction of the photoelectric conversion layer or the like due to the stress of the sealing layer may be markedly suppressed.

In particular, it is preferable that a configuration, in which the second sealing layer that is formed on the first sealing layer by using the sputtering method and includes any one of aluminum oxide, silicon oxide, silicon nitride, and silicon nitride oxide is disposed, is employed.

It is preferable that the film thickness of the first sealing layer is equal to or larger than 0.05 μm and equal to or smaller than 0.2 μm. In addition, the first sealing layer preferably includes any one of aluminum oxide, silicon oxide, and titanium oxide.

<Buffering Layer>

The buffering layer adsorbs and/or reacts with the factors such as water molecules that penetrate based on a tiny defect of the sealing layer, which cannot be easily prevented completely from being generated due to oscillation or the like during the manufacturing process, and deteriorate the organic photoelectric conversion material and has a function of blocking the deterioration, and has a function of blocking the reach of the deterioration factors up to the organic photoelectric conversion material positioned below the sealing layer. In addition, since the dense ceramic material that is used as the material of the sealing layer has large stress, the stress is concentrated particularly in the end portion of the photoelectric conversion layer. Accordingly, a defect such as a contact between the opposing electrode and the pixel electrode or peel-off of the photoelectric conversion layer due to long-time conservation or use or a thermal shock that is intermittent heating and cooling during the manufacturing process may occur. The buffering layer is also responsible for the role of alleviating the stress. In addition, since the buffering layer is formed on the upper side of the photoelectric conversion layer, the material of the buffering layer needs to be transparent.

As materials of the buffering layer satisfying the above-described conditions, there are organic materials and inorganic materials as below. As the organic materials, there are a polymer such as polyvinyl alcohol or an organic semiconductor that is used as the photoelectric conversion material. As the inorganic materials, there are metal fluoride such as calcium fluoride, magnesium fluoride, and lithium fluoride and metal oxide such as calcium oxide, silicon oxide, strontium oxide, barium oxide, and magnesium oxide.

In a case where the sealing layer is formed so as to coat the buffering layer by using the atomic layer deposition method, an organic polymer or metal oxide having a hydroxyl group that may react with an organic metal compound, a metal halide compound, or the like that becomes the material thereof is preferably used. In particular, it is preferable that the buffering layer includes any one of silicon oxide, silicon nitride, and silicon nitride oxide. In addition, when so-called beta film formation, that is, forming the buffering layer on the entire substrate is performed, the deterioration factors such as water molecules rather penetrate to the inside of the photoelectric conversion layer through the buffering layer from the end portion of the substrate. Accordingly, it is preferable that the buffering layer is patterned in an area for coating the photoelectric conversion layer, and the buffering layer is completely coated with the sealing layer simultaneously with the photoelectric conversion layer and the opposing electrode. Thus, it is more preferable that metal oxide is formed as the buffering layer by using a PVD method such as a vacuum deposition method or a sputtering method capable of patterning using a metal master in a film forming process. By performing vacuum film formation of the buffering layer by using the PVD method, the substrate is not exposed to the external air, the deterioration factors such as water molecules are not allowed to be mixed in, and the organic photoelectric conversion material does not deteriorate in the buffering layer forming process, which are advantageous. In order not to allow the deterioration factors such as water molecules to be mixed in the organic layer in the manufacturing process, it is preferable that at least the organic layer 107, the opposing electrode 108, the buffering layer 109, and the sealing layer 110 are uniformly formed under an atmosphere of vacuum and/or inert gas without exposing the substrate to the external air. It is particularly preferable that an organic electroluminescence (organic EL) manufacturing apparatus is used in which a vacuum deposition device that forms the electric charge blocking layer, the photoelectric conversion layer, and the buffering layer without exposing the substrate to the external air at all in the middle of vacuum and/or inert gas such as Ar or $N_2$, a sputtering device that forms the opposing electrode and the sealing auxiliary layer, and an atomic layer deposition device that forms the sealing layer are directly connected to a clustering-type vacuum transport system having a degree of vacuum of $1 \times 10^{-4}$ Pa or less.

<Color Filter, Partition Wall, Light Shielding Layer, and Protection Layer>

In a plurality of pixel portions, color filters are disposed. In addition, partition walls disposed between the adjacent color filters in the plurality of the pixel portions serve as a light collecting means that collects light incident to the pixel portions to the photoelectric conversion layer of the pixel portion. A color filter manufacturing process includes a peripheral light shielding layer forming process, a process of forming a color filter of the first color, a process of forming a color filter of the second color, a process of forming a color filter of the third color, and a partition wall forming process. As the peripheral light shielding layer, any one of the color filters of the first to third colors may be formed in an area other than the effective pixel area. In such a case, the process only for forming the peripheral light shielding layer may be omitted so as to suppress the manufacturing cost. The partition wall forming process may be performed after the peripheral light shielding layer forming process, after the process of forming the color filter of the first color, after the process of forming the color filter of the second color, or after the process of forming the color filter of the third color may be appropriately selected in accordance with a combination of a used manufacturing technology and a used manufacturing method. In the procedure described below, an example in which the partition wall forming process is performed after the process of forming the color filter of the second color will be introduced.

As a general color filter manufacturing method, there is a photolithographic method. The manufacturing process of the photolithographic method is pursuant to the photolithographic process for semiconductor manufacture. Accordingly, the initial investment may be suppressed. Thus, generally, the photolithographic method is widely used as the manufacturing method of the color filter. In the method of manufacturing a color filter using the photolithographic method, color filters are manufactured by repeating a process of forming a coloring pixel by performing pattern exposure, development, and a baking process for a thin film that is formed by coating the substrate with photosensitive compositions including coloring-curable compositions and drying the substrate for each color. This photolithographic method may be easily applied to the present invention by combining known technologies.

In the manufacturing method of a color filter using the photolithographic method, a dry etching method is used as an effective method of forming a thin film and a color filter having a fine pattern. In the dry etching method, a coloring-curable composition that does not include a photosensitive composition such as a photo initiator or a monomer or alkali-soluble resin is used. Accordingly, compared to the color filter manufacturing method using a general photolithographic method, the content of the coloring agent in the total solid amount of the coloring-curable composition may be increased. Therefore, compared to the photolithographic method, a color filter of which the film thickness is decreased by a half while maintaining the same degree of the spectral characteristics may be formed. As a color filter manufacturing method in a solid-state image pickup apparatus in which the pixel size for prominent crosstalks is less than 2 μm, and more particularly, about 1 μm, the dry etching method is preferably used.

Here, the color filter manufacturing process according to the dry etching method will be described. In a case where the dry etching method is used, the processes of forming the color filters of the first to third colors further include a photoresist patterning process, an etching process, a photoresist eliminating process, a coloring layer forming process, and a planarization process. The planarization process is omitted in the process of forming the color filter of the first color and/or the process of forming the color filter of the second color, and is collectively performed in the third color filter forming process, whereby the number of manufacturing processes may be reduced. In a case where the planarization process is collectively performed in the final process, manufacture variations of the etching process and the planarization process become large. Accordingly, omission of the planarization process needs to be appropriately considered in accordance with the combination of a used manufacturing technology and a used manufacturing method. The procedure described below is an example in which the planarization process is omitted in the first color filter forming process.

Figure 34:
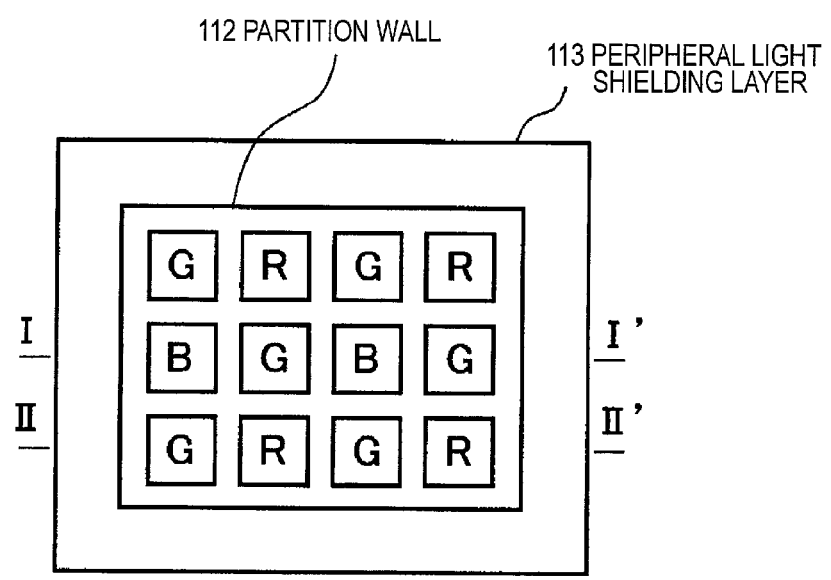
FIG. 34 is a plan view representing a configuration example of a color filter.
Figure 35A:
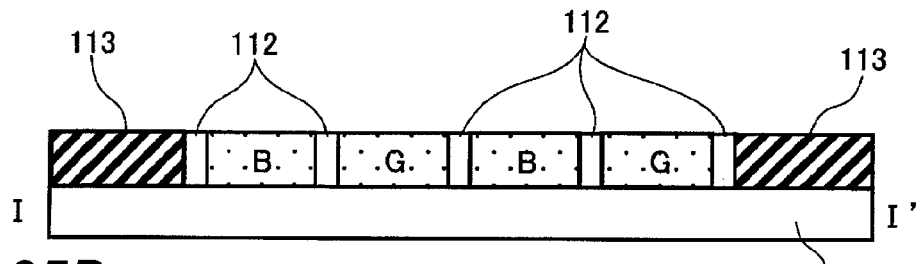
FIGS. 35A and 35B are cross-sectional views of the color filter shown in FIG. 34.
Figure 35B:
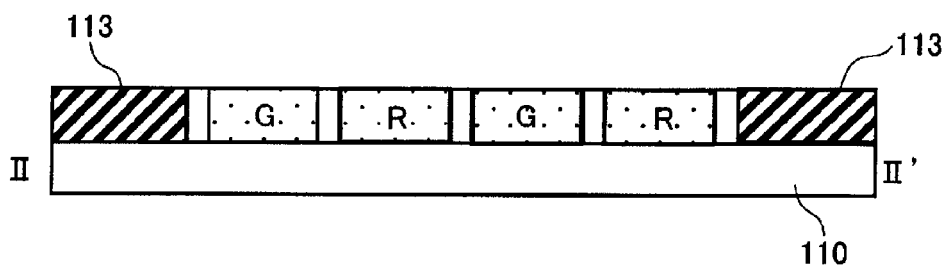

FIG. 34 is a plan view representing a configuration example of a color filter described below. The configuration of the color filter that is represented in FIG. 34 is simplified by decreasing the number of pixel portions, compared to an actual color filter. FIG. 35 represents a cross-sectional view of the color filter represented in FIG. 34. FIG. 35A represents a cross-section taken along line I-I' shown in FIG. 34, and FIG. 35B represents a cross-section taken along line II-II'shown in FIG. 34. In addition, in FIGS. 36 to 58, an added letter "A" represents a cross-section taken along line I-I' shown in FIG. 34, and an added letter "B" represents a cross-section taken along line II-II'.

[Peripheral Light Shielding Layer Forming Process]

FIGS. 36A to 40B represent an example of the peripheral light shielding layer forming process.

Figure 36A:
FIGS. 36A and 36B are diagrams representing a state in which a peripheral light shielding layer is formed as a film.
Figure 36B:
Figure 37A:
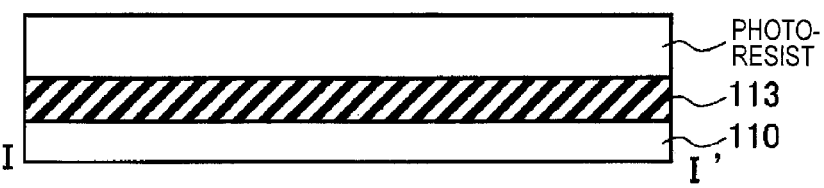
FIGS. 37A and 37B are diagrams representing a state in which a photo resist is formed as a film.
Figure 37B:
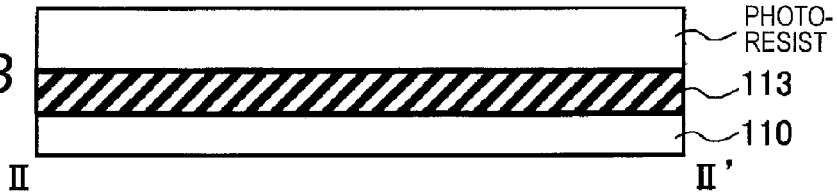
Figure 38A:
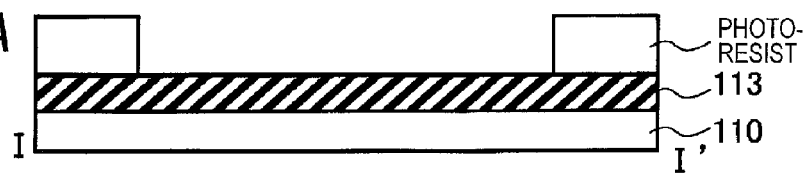
FIGS. 38A and 38B are diagrams representing a state in which pattern exposure, development, and post-baking are performed for the photo resist.
Figure 38B:
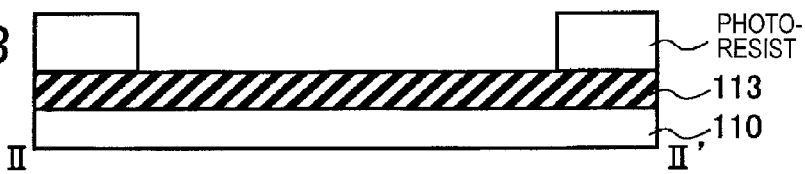
Figure 39A:
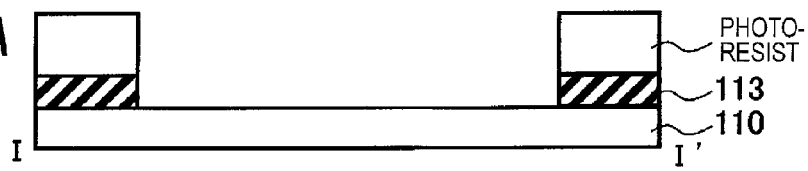
FIGS. 39A and 39B are diagrams representing a state in which a dry etching process is performed for the peripheral light shielding layer.
Figure 39B:
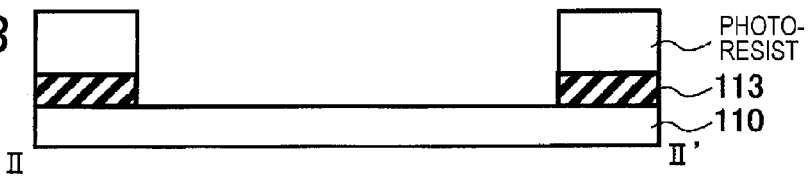
Figure 40A:
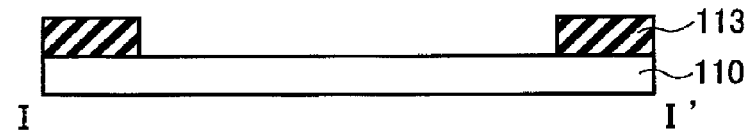
FIGS. 40A and 40B are diagrams representing a state in which a photo resist positioned on the peripheral light shielding layer is delaminated.
Figure 40B:
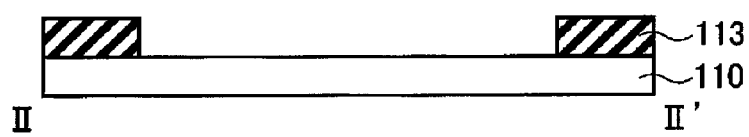

FIGS. 36A and 36B represent a state in which the peripheral light shielding layer 113 is formed on the sealing layer 110. FIGS. 37A and 37B represent a state in which a photoresist is formed as a film on the peripheral light shielding layer 113. FIGS. 38A and 38B represent a state in which the pattern of the photoresist positioned on the peripheral light shielding layer 113 is formed. FIG. 39 represents a state in which a dry etching process is performed for the peripheral light shielding layer 113. FIGS. 40A and 40B represent a state in which the photoresist positioned on the peripheral light shielding layer 113 is delaminated after the dry etching process.

In the peripheral light shielding layer forming process, as represented in FIGS. 36A and 36B, the entire upper side of the sealing layer 110 is coated with a composition including a black coloring agent that forms the peripheral light shielding layer 113. Next, the coating film is cured so as to form the peripheral light shielding layer (black coloring layer) 113 by being heated for 5 to 10 minutes at the atmospheric temperature of 180° C. to 250° C. This heating process may be performed simultaneously with a drying process performed after the composition coating. Alternatively, after the coating process and the drying process, an additional heat-curing process may be set up. It is preferable that the peripheral light shielding layer 113 is formed from a back coloring composition in which titanium black, carbon black, or the like is dispersed. The peripheral light shielding layer 113 may be used as a polishing stopper in the planarization process in the process of forming the color filters of the first to third colors to be described later. In a case where the peripheral light shielding layer 113 is also used as the polishing stopper, in order to improve polishing resistance, inorganic fine particles formed from aluminum oxide, silicon oxide, zirconium oxide, or the like may be added to the composition that forms the peripheral light shielding layer. In a case where the peripheral light shielding layer 113 is formed in any of the color filters of the first to third colors, this process is omitted.

In addition, on the outside the effective pixel area, the end portion of the organic layer 107 forms a level difference. Accordingly, when the peripheral light shielding layer 113 is formed, a level difference may be formed on the upper side of the end portion of the peripheral light shielding layer 113. In particular, in a case where the peripheral light shielding layer 113 also serves as a polishing stopper, it is preferable to polish the level difference so as to planarize the surface of the peripheral light shielding layer 113 by performing a planarization process to be described later in advance after the peripheral light shielding layer 113 is formed thick.

Next, in the peripheral light shielding layer forming process, as described below, the processes of forming the color filters of the first to third colors are sequentially performed so as to form color filters. Here, an example in which a red color filter (denoted by "R" in the figure) is used as the color filter of the first color, a blue color filter (denoted by "B" in the figure) is used as the color filter of the second color, and a green color filter (denoted by "G" in the figure) is used as the color filter of the third color will be described.

[Patterning of Photoresist]

In the process of forming the color filter of the first color, first, as shown in FIGS. 37A and 37B, the upper side of the peripheral light shielding layer 113 is coated with a positive-type photoresist (for example, FHi622BC made by Fujifilm Electronics Materials Co., Ltd). A pre-baking process is performed for 60 seconds in the range of 80 to 100° C. by using a hot plate, whereby forming a photoresist.

Subsequently, as shown in FIGS. 38A and 38B, an area corresponding to the effective pixel area in which the color filers of the first to third colors are arranged is exposed by using a photo mask from the upper side of the photoresist. For example, an exposure stepper using a mercury lamp i line (wavelength 365 nm) is used. Next, by using a hot plate, after an exposure process is performed in the range of 100 to 120° C. for 90 seconds, a heating (PEB) process is performed. Thereafter, a puddle developing process is performed by using a developing solution, and a post-baking process is performed by using a hot plate, whereby the photoresist positioned in the effective pixel area is eliminated. At this time, the photoresist positioned on the upper area of the peripheral light shielding layer 113 remains.

[Etching Process]

Next, a dry etching process performed for the peripheral light shielding layer 113 by using the photoresist as a mask will be described. As a dry etching device, for example, a reactive ion etching (RIE) device is used. The RIE device has a known structure such as a parallel plate type, a capacitive coupling type, or an electron cyclotron resonance type and may perform dry etching by using high-frequency discharge. By using such an RIE device, the dry etching process is performed for the peripheral light shielding layer 113 with the photoresist used as a mask. Accordingly, as shown in FIGS. 39A and 39B, the light shielding layer positioned in the effective pixel area in which the color filers of the first to third colors are arranged is eliminated.

According to the present invention, in the etching process of the peripheral light shielding layer 113, an opening portion forming dry etching process and a residual liquid eliminating dry etching process are sequentially performed. In the etching process, first, the opening portion forming dry etching process is performed.

[Opening Portion Forming Dry Etching Process]

When the opening portion forming dry etching process is performed, from the viewpoint of processing the peripheral light shielding layer 113 into a rectangular shape, it is preferable that mixed gas containing at least one type of fluorinated gas and $O_2$ gas is used as the first etching gas. Then, in the opening portion forming dry etching process, the first etching gas is introduced to the inside of a processing chamber in which a semiconductor substrate is installed on a planar electrode (cathode). Then, in the state in which the etching gas is introduced, when a high-frequency voltage is applied between the planar electrode and an opposing electrode, etching of processing the peripheral light shielding layer 113 into a rectangular shape based on the cathode effect is performed. As the fluorinated gas that is used in the opening portion forming dry etching process, gas of a fluorinated compound represented in the following Formula 1 is preferably used.

[Chemical Formula 1]

$$C_nH_mF_l \qquad \text{Formula (1)}$$

(here, n denotes 1 to 6, m denotes 0 to 13, and l denotes 1 to 14)

As the fluorinated gas represented by Formula (1), for example, there is gas including at least one type that is formed from the group consisting of $CF_4$, $C_2F_6$, $C_3F_8$, $C_2F_4$, $C_4F_8$, $C_4F_6$, $C_5F_8$, and $CHF_3$. As the fluorinated gas according to the present invention, one type of gas may be selected so as to be used from the above-described group. In addition, two or more types of gas may be use in a combined manner. Among these, from the viewpoint of maintaining the etched portion to be in a rectangular shape, the fluorinated gas is preferably at least one selected from the group consisting of $CH_4$, $C_4H_6$, $C_4H_8$, and $CHF_3$. In addition, the fluorinated gas is more preferably $CH_4$ and/or $C_4F_6$. Furthermore, the fluorinated gas is further more preferably mixed gas of $CF_4$ and $C_4F_6$.

From the viewpoint of maintaining the stability of etching plasma and the vertically etched shape, in addition to the fluorinated gas and $O_2$ gas described above, the mixed gas that is used in the opening portion forming dry etching process is preferably rare gas such as He, Ne, Ar, Kr, and Xe, halogenated gas (for example, $CCl_4$, $CClF_3$, $AlF_3$, $AlCl_3$, and the like) containing halogen atoms of chlorine, fluorine, bromine, or the like, or gas containing at least one selected from the group consisting of $N_2$, CO, and $CO_2$. In addition, the mixed gas is more preferably gas containing at least one selected from the group consisting of Ar, He, Kr, $N_2$ and Xe. Furthermore, the mixed gas is further more preferably gas containing at least one selected from the group consisting of He, Ar, and Xe. However, in a case where the stability of plasma and the vertically etched shape may be maintained, the mixed gas used in the opening portion forming dry etching process may be gas that is formed only from fluorinated gas and $O_2$ gas.

[Residual Liquid Eliminating Dry Etching Process]

In the residual liquid eliminating dry etching process, by performing a dry etching process using the second etching gas containing $O_2$ gas, residual liquid remaining in an area, in which the surface alteration layer of the photoresist and the light shielding layer are eliminated, may be eliminated with the rectangular shape of the peripheral light shielding layer 113 being maintained.

The second etching gas that is used in the residual liquid eliminating dry etching process is formed to contain $O_2$ gas. However, from the viewpoint of the stability of etching plasma, the third etching gas that is formed from at least one type of gas selected from the group consisting of He, Ne, Ar, Kr, Xe, and $N_2$ gas may be further included. In such a case, the mixing ratio of the third etching gas to $O_2$ gas (Ar gas or the like/$O_2$ gas) is preferably equal to or less than 40/1 as a flow ratio, is more preferably equal to or less than 20/1, and is further more preferably equal to or less than 10/1. In order to improve the capability of eliminating the residual liquid, gas of a fluorinated compound of 5% or less may be further included.

The third etching gas is more preferably at least one type of gas selected from the group consisting of He, Ar, and Xe. However, in a case where the stability of etching plasma may be maintained, the second etching gas may be formed only from $O_2$, and the fourth gas may not be included.

In addition, it is preferable that the residual liquid eliminating dry etching process is completed based on an etching processing time that is calculated in advance. For example, from the viewpoint of maintaining the rectangular shape of the photoresist, the processing time of the residual liquid eliminating dry etching process is preferably in the range of 3 to 10 seconds, and is more preferably in the range of 4 to 8 seconds.

[Photoresist Eliminating Process]

After the etching process is performed, a photoresist eliminating process is performed. First, a photoresist delamination process is performed by using solvent or photoresist delamination solution, and thereby the photoresist remaining on the peripheral light shielding layer 113 is eliminated. Alternatively, by extending the processing time of the residual liquid eliminating etching process, the photoresist is eliminated.

After the photoresist eliminating process is performed, a baking process may be additionally provided for desolvation and dehydration. As described above, the light shielding layer positioned in the area (effective pixel area), in which the color filters are to be formed, is eliminated by being etched, and the photoresist is delaminated.

It is preferable that the photoresist eliminating process according to the present invention includes: 1) a process of applying delamination solution or solvent to the photoresist so as to allow the photoresist to be able to be eliminated; and 2) a process of eliminating the photoresist by using cleaning water. As the process of applying the delamination solution or the solvent to the photoresist so as to be able to be eliminated, for example, there is a puddle developing process in which delamination solution or solvent is applied at least to the upper side of the photoresist and is allowed to remain for a predetermined time. The time for allowing the delamination solution or the solvent to remain is not particularly limited, but is preferably in the range of several tens of seconds to several minutes.

As a process of eliminating the photoresist by using cleaning water, for example, there is a process in which the photoresist is eliminated by injecting cleaning water to the photoresist from a spray-type or shower-type injection nozzle. As the cleaning water, pure water may be preferably used. In addition, as the injection nozzle, there are an injection nozzle having an injection range in which the entire support body is included, a movable-type injection nozzle, and an injection nozzle having a movable range that includes the entire support body. In a case where the injection nozzle is the movable type, the photoresist may be more effectively eliminated by moving from the center portion of the support body to the end portion of the support body two times or more so as to inject cleaning water during the process of eliminating the photoresist.

Generally, the delamination solution contains an organic solvent, and may additionally contain an inorganic solvent.

As the organic solvent, for example, there are 1) a hydrocarbon compound, 2) a halogenated hydrocarbon compound, 3) an alcoholic compound, 4) an ether or acetal compound, 5) a ketone or aldehyde compound, 6) an esther compound, 7) a polyalcoholic compound, 8) a calboxilic acid or an acid anhydride compound thereof, 9) a phenolic compound, 10) a nitrogen-containing compound, 11) a sulfur-containing compound, and 12) a fluorine-containing compound. The delamination solution preferably contains a nitrogen-containing compound, and more preferably contains an acyclic nitrogen-containing compound and a cyclic nitrogen-containing compound.

The delamination solution more preferably contains at least one selected from monoethanolamine, diethanolamine, and triethanolamine as an acyclic nitrogen-containing compound and at least one selected from N-methyl-2-pyrrolidinone and N-ethyl morpholine as a cyclic nitrogen-containing compound. The delamination solution further more preferably contains monoethanolamine and N1-methyl-2-pyrrolidinone. In addition, it is preferable that the content of the acyclic nitrogen-containing compound is equal to or higher than 9 pts.mass and equal to or lower than 11 pts.mass with respect to the delamination solution of 100 pts.mass, and the content of the cyclic nitrogen-containing compound is equal to or higher than 65 pts.mass and equal to or lower than 70 pts.mass. The delamination solution according to the present invention is preferably acquired by diluting a mixture of an acyclic nitrogen-containing compound and a cyclic nitrogen-containing compound with pure water.

In the photoresist eliminating process, the photoresist formed on the coloring layer may be eliminated, and, even in a case where an etching product is attached to the side wall of the coloring layer, the etching product may not be completely eliminated. In the photoresist eliminating process according to the present invention, it is more preferable that a dehydration process through post-baking is additionally performed.

[Process of Forming Color Filter of First Color]

Figure 44A:
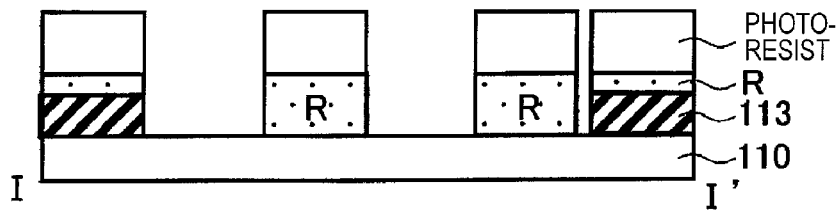
FIGS. 44A and 44B are diagrams representing a state in which a dry etching process is performed for the color filter of the first color.
Figure 44B:
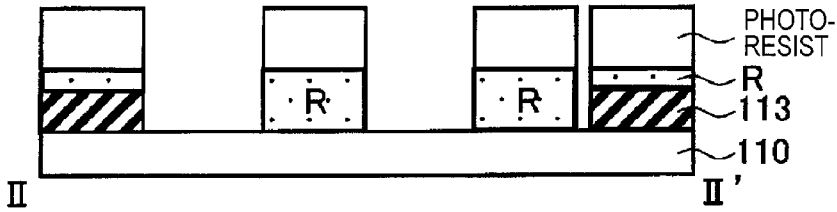
Figure 45A:
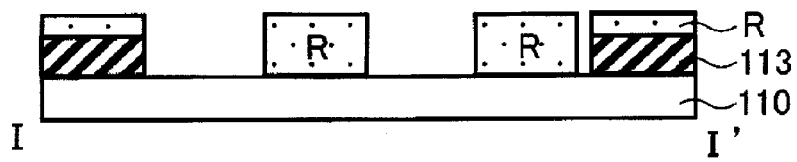
FIGS. 45A and 45B are diagrams representing a state in which the photoresist formed on the color filter of the first color is delaminated.
Figure 45B:
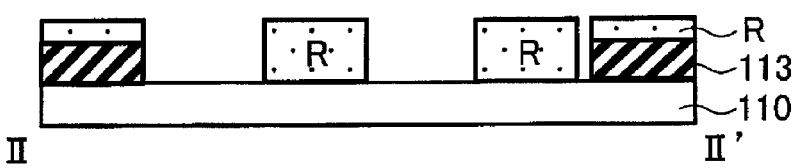

After the photoresist eliminating process is performed, subsequently, a first-color color filter process is performed. FIGS. 41A and 41B represents a state in which a color filter of the first color is formed as a film. FIGS. 42A and 42B represent a state in which a photoresist is formed on the color filter of the first color as a film. FIGS. 43A and 43B represent a state in which the photoresist is exposed and developed. FIGS. 44A and 44B represent a state in which a dry etching process is performed for the color filter of the first color. FIGS. 45A and 45B represent a state in which the photoresist formed on the color filter of the first color is delaminated.

First, as shown in FIGS. 41A and 41B, the peripheral light shielding layer 113 is coated with a composition forming the color filter of the first color such that the composition covers the entire upper surface of the peripheral light shielding layer 113 and is buried in the opening portion. Thereafter, a post-baking process is performed by using a hot plate, and whereby the color filter of the first color is formed.

In addition, in the process of forming the color filter of the first color, in consideration of planarization such as polishing is performed in the process thereafter, the upper face of the color filter of the first color is formed so as to be positioned on the side higher than the upper face of the peripheral light shielding layer 113 that serves as a polishing stopper. In the planarization process included in the processes of forming the color filters of the first to third colors, in a case where the color filter of the first color is used as a polishing stopper, in order to improve the polishing resistance, inorganic fine particles of aluminum oxide, silicon oxide, zirconium oxide, or the like may be added to a coloring layer composition that forms the color filter of the first color.

Next, as shown in FIGS. 42A and 42B, the entire upper surface of the color filter of the first color is coated with a positive-type photoresist, and then pre-baking process is performed, thereby the photoresist is formed.

Then, the photoresist is eliminated by patterning the area, in which a color filter of the second color is to be formed, by using an i-line exposure stepper, as shown in FIGS. 43A and 43B. In addition, the process of forming the pattern of the photoresist and the like are the same as those of the above-described patterning process.

In addition, as shown in FIGS. 44A and 44B, an etching process in which the color filter of the first color positioned in the area, in which the color filter of the second color is to be formed, is eliminated by using the photoresist as a mask is performed. In this etching process, from the viewpoint of processing a rectangular pixel pattern in the color filter of the first color, the area in which the color filter of the second color is to be formed is preferably eliminated by sequentially performing the opening portion forming dry etching process using the first etching gas that contains fluorinated gas and $O_2$ gas and the residual liquid eliminating dry etching process using the second etching gas that contains $N_2$ gas and $O_2$ gas, as described above.

After the etching process is performed, as represented in FIGS. 45A and 45B, a photoresist eliminating process is performed. The processing method, the conditions, the solvent or the delamination solution, and the like for eliminating the photoresist are the same as those in the photoresist eliminating process described above.

[Process of Forming Color Filter of Second Color]

Figure 46A:
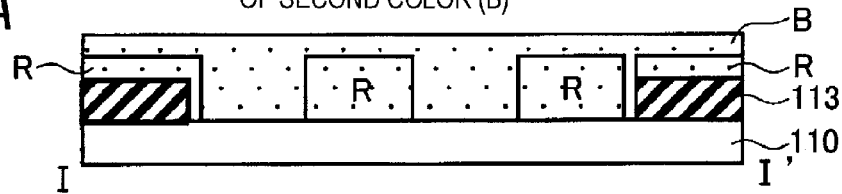
FIGS. 46A and 46B are diagrams representing a state in which the color filter of the second color is formed as a film.
Figure 46B:
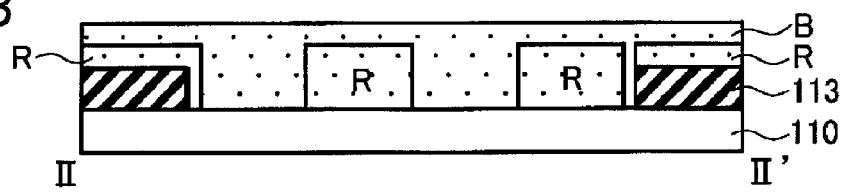

FIGS. 46A and 46B represent a state in which the color filter of the second color is formed as a film. FIGS. 47A and 47B represents a state in which the color filters of the first and second colors are planarized.

In the process of forming the color filter of the second color, as shown in FIGS. 46A and 46B, the color filter of the second color is formed so as to cover the entire upper surfaces of the peripheral light shielding layer 113 serving as a polishing stopper and the color filter of the first color and be buried in the opening portion. Similarly to the method of forming the color filter of the first color, coating performed by using the composition of the color filter. After the coating is performed by using the composition of the color filter, a post-baking process is performed by using a hot plate, and thereby forming the color filter of the second color. In a case where the color filter of the second color is used as a polishing stopper, in order to improve the polishing resistance, inorganic fine particles of aluminum oxide, silicon oxide, zirconium oxide, or the like may be added to the composition of the coloring layer that forms the color filter of the second color.

[Planarization Process]

As represented in FIGS. 47A and 47B, in the planarization process, the color filter of the first color and the color filter of the second color are polished so as to be planarized by using a CMP device until the peripheral light shielding layer 113 serving as a polishing stopper is exposed. Accordingly, when the peripheral light shielding layer 113 that serves as a polishing stopper having polishing resistance higher than those of the color filter of the first color and the color filter of the second color is exposed, the speed of polishing the color filter of the first color and the color filter of the second color is lowered. Accordingly, it becomes easy to fit the surfaces of the color filter of the first color and the color filter of the second color to the end point of the polishing process, that is, the surface of the peripheral light shielding layer 113 serving as the polishing stopper.

[Conditions of Polishing]

As the polishing agent, slurry in which fine particles of silicon oxide are dispersed is used. In addition, as the polishing device, a device that has a slurry flow rate of 100 to 250 cm3·min$^{-1}$, wafer pressure of 0.2 to 5.0 psi, and retainer ring pressure of 1.0 to 2.5 psi and is formed from an abrasive cloth may be used. By setting the number of revolutions of the wafer abrasive cloth to about 30 rpm to 100 rpm, a color filter having a little micro scratch may be formed. After being polished, the color filters are cleaned by using pure water. Thereafter, a post-baking process is performed so as to eliminate the containing moisture.

[Partition Wall Forming Process]

Figure 50A:
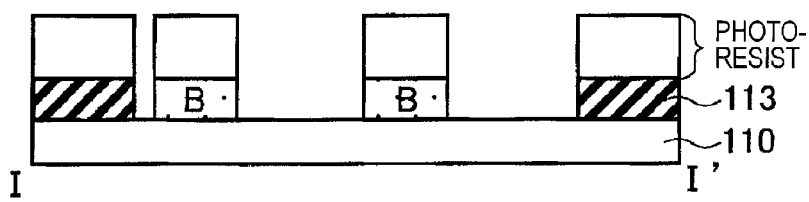
FIGS. 50A and 50B are diagrams representing a state in which dry etching is performed with the photo resist used as a mask.
Figure 50B:
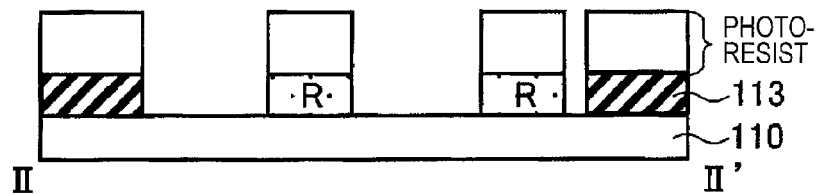
Figure 51A:
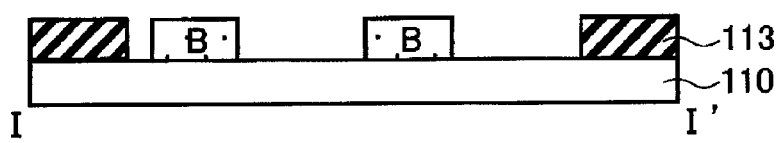
FIGS. 51A and 51B are diagrams representing a state in which the photoresist is delaminated.
Figure 51B:
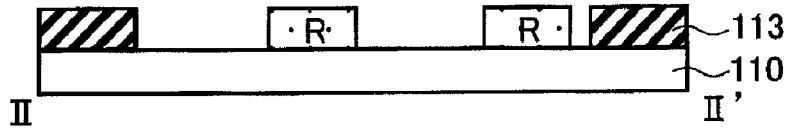
Figure 52A:
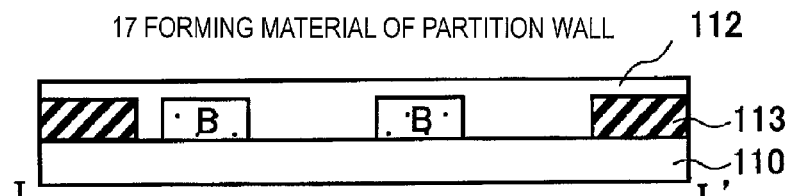
FIGS. 52A and 52B are diagrams representing a state in which the material of the partition wall is formed as a film.
Figure 52B:
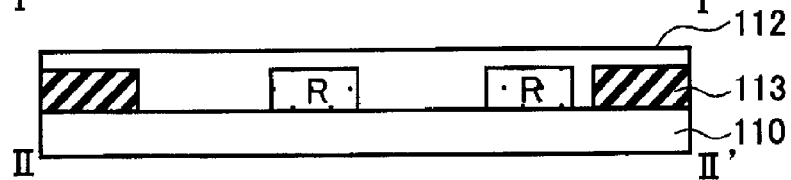

FIGS. 48A and 48B represent a state in which a photoresist is formed on the color filters of the first and second colors as a film. FIGS. 49A and 49B represent a state in which the photoresist is developed and exposed. FIGS. 50A and 50B represent a state in which dry etching is performed with the photoresist used as a mask. FIGS. 51A and 51B represent a state in which the photoresist is delaminated. FIGS. 52A and 52B represent a state in which the material of the partition wall is formed as a film. FIGS. 53A and 53B represents a state in which the color filters of the first and second colors and the partition wall are planarized. In the partition wall forming process, first, as shown in FIGS. 48A and 48B, the entire upper surfaces of the color filter of the first color, the color filter of the second color, and the peripheral light shielding layer 113 are coated with a positive-type photoresist, and pre-baking is performed so as to form the photoresist.

Next, by using an i-line exposure stepper, as shown in FIGS. 49A and 49B, the photoresist positioned in an area in which an opening is to be formed is patterned so as to be eliminated. In addition, the process of forming the pattern of the photoresist is the same as that of the patterning process described above.

Then, as shown in FIGS. 50A and 50B, an etching process in which the areas, in which the openings are to be formed, are eliminated with the photoresist used as a mask is performed. In this etching process, similarly to the etching process described above, the opening portion forming dry etching process and the residual liquid eliminating dry etching process are performed so as to form the opening portions in the color filters of the first and second colors.

After the etching process is performed, a photoresist eliminating process is performed. FIGS. 51A and 51B represent a state in which the photoresist is eliminated. The processing method, the conditions, the solvent or the delamination solution, and the like for eliminating the photoresist are the same as those of the photoresist eliminating process described above. After the photoresist eliminating process is performed, a partition wall forming process is performed.

In the partition wall forming process, a partition wall is formed so as to cover the entire upper surfaces of the peripheral light shielding layer 113 serving as the polishing stopper and the color filters of the first and second colors and be buried in the opening portions. As shown in FIGS. 52A and 52B, coating is performed by using the composition of the partition wall by using the same method as the method of forming the color filter of the first color. After the coating is performed by using the composition of the partition wall, a post-baking process is performed by using a hot plate so as to form the partition wall 112. As the material of the partition wall, a transparent material having a refractive index lower than color filters of the first to third colors is preferable. The refractive index of the partition wall is preferably lower than 1.5, and is more preferably lower than 1.4. As the material of the partition wall, there are a porous film formed from silicon oxide or the like, a siloxane polymer, amorphous fluorine resin, and the like. OPSTAR low refractive index material JN series manufactured by JSR corporation, NR series manufactured by Toray Industries, Inc., Cytop series manufactured by Asahi Glass Co., Ltd., TeflonAF grade manufactured by E.I. du Pont de Nemours and Company, and the like are available in the market. In a case where the partition wall 112 is used as a polishing stopper, in order to improve the polishing resistance thereof, inorganic fine particles of aluminum oxide, silicon oxide, zirconium oxide, or the like may be added to the composition of the partition wall.

Before the process of forming the color filter of the third colors is performed, as shown in FIGS. 53A and 53B, the color filter of the first color, the color filter of the second color, and the partition wall 112 are polished until the peripheral light shielding layer 113 serving as the polishing stopper is exposed. After the partition wall forming process is performed, the process of forming the color filter of the third color is performed. It may be configured that the planarization process is omitted, and the polishing process is performed together in the process of forming the color filter of the third color.

In a case where the partition wall 112 is not formed, the partition wall forming process is omitted, and the process of forming the color filter of the third color is performed after the process of forming the color filter of the second color is formed. The partition wall forming process is not limited to be performed between the process of forming the color filter of the second color and the process of forming the color filter of the third color. Thus, the order of the partition wall forming process may be appropriately changed with the process of forming the peripheral light shielding layer 13 and the processes of forming the color filters of the first to third colors based on a combination of the manufacturing technology and the manufacturing method that are used.

[Process of Forming Color Filter of Third Color]

FIGS. 54A and 54B represent a state in which a photoresist is formed on the color filters of the first and second colors and the partition wall as a film. FIGS. 55A and 55B represent a state in which the photoresist is exposed and developed. FIGS. 56A and 56B represent a state in which the area of the color filter of the third color is formed by etching a part of the partition wall. FIGS. 57A and 57B represent a state in which the photoresist is delaminated. FIGS. 58A and 58B represent a state in which the color filter of the third color is formed as a film. In the process of forming the color filter of the third color, first, as shown in FIGS. 54A and 54B, the entire upper surface of the partition wall material layer is coated with a positive-type photoresist, and pre-baking is performed so as to form the photoresist.

Next, by using an i-line exposure stepper, as shown in FIGS. 55A and 55B, the area in which the color filter of the third color is to be formed is patterned so as to eliminate the photoresist. In addition, the process of forming the pattern of the photoresist is the same as that of the patterning process described above.

Then, as shown in FIGS. 56A and 56B, an etching process in which the area, in which the color filter of the third color is to be formed, is eliminated with the photoresist used as a mask is performed. In this etching process, similarly to the etching process described above, the opening portion is formed in the partition wall 112 by performing the opening portion forming dry etching process and the residual liquid eliminating dry etching process. In the photoresist pattern forming process performed before this process and this process, the size of the opening portion is determined so as to form the partition wall 112 having a desired width by adjusting the processing conditions of the photoresist and/or the processing conditions of the dry etching. For example, in a case where the pixel size is 1.0 μm, in order to increase the aperture ratio of the pixel, the width of the partition wall 112 is preferably equal to or less than 0.1 μm, and the size of the opening portion is equal to or larger than 0.9 μm and smaller than 1.0 μm.

As represented in FIGS. 57A and 57B, after the etching process is performed, a photoresist eliminating process is performed. The processing method, the conditions, the solvent or the delamination solution, and the like for eliminating the photoresist are the same as those of the photoresist eliminating process described above.

After the photoresist is eliminated, as represented in FIGS. 58A and 58B, the color filter of the third color is formed so as to cover all the color filter of the first color, the color filter of the second color, the partitions wall 112, and the opening portion. In the method of forming the color filter of the third color, similarly to the method of forming the color filter of the first color and the color filter of the second color, coating is performed by using the composition of the color filter. After the coating is performed by using the composition of the color filter, a post-baking process is performed by using a hot plate, and thereby the color filter of the third color is formed.

After the process of forming the color filter of the third color is performed, a planarization process is performed.

In the planarization process, a polishing process is performed by using a CMP device so as to planarize the surface of the color filter of the third color until the upper faces of the peripheral light shielding layer 113, which serves as a polishing stopper, the color filter of the first color, the color filter of the second color, and the partition walls 112. In addition, in the planarization process, the color filter of the third color is polished by performing a process that is similar to the planarization process described above. Accordingly, when the polishing process is performed until the peripheral light shielding layer 113 that has polishing resistance higher than the color filter of the third color and serves as a polishing stopper is exposed, the position of the upper face of the color filter of the third color may be easily fitted to the upper surface of the peripheral light shielding layer 113 serving as the polishing stopper formed in advance, that is, the end point of the polishing process. Therefore, as shown in FIGS. 35A and 35B, the color filters of the first to third colors are arranged within the effective pixel area, and the color filters are partitioned by the partition walls 112 formed from a low-refractive index material. Therefore, the color filters having the upper faces that become the same plane as the upper face of the peripheral light shielding layer 113 serving as the polishing stopper are formed.

As in the example described above, in a case where a red color filter (R), a green color filter (G), a blue color filter (B), and partition walls 112 arranged between the pixels are formed in accordance with the Bayer array shown in FIG. 34 The sequence in which the material of the partition wall is formed as a film after the red color filter, and the blue color filter are formed, and the green color filter is finally formed is preferable from the viewpoint of the manufacturing cost. The reason is that an opening portion I formed in the etching process (FIGS. 50A and 50B) before film-formation with the material of the partition wall and an opening portion II formed in the etching process (FIGS. 56A and 56B) before film-formation with the material of the green color filter have the same center viewed from the surface in the plan view, and sizes of the opening portions are different from each other only by the width of the partition wall 112. For example, in a case where a partition wall having a pixel size of 1.0 μm and a width of 0.1 μm is formed, when the size of the opening portion I is assumed to be 1.1 μm and the size of the opening portion II is assumed to be 0.9 μm with the centers of the opening portions I and II to be the same, the width of the partition wall 112 becomes 0.1 μm. In a case where the partition wall is formed after all the color filters formed, a patterning technology of high resolution is needed for forming an opening portion having a width of 0.1 μm, whereby the manufacturing cost is increased. On the other hand, in the example described above, the minimum size of the opening portion is 0.9 μm. Accordingly, general photolithographic technology may be applied, whereby the manufacturing cost is suppressed. Furthermore, the shapes and the centers of the opening portions I and II are the same. Accordingly, in the photoresist pattern forming process before formation of the opening portions, only the size of the opening portion may be changed by adjusting the exposure conditions, the developing conditions, and the etching conditions with an exposure photo mask being commonly used. In other words, the number of high-priced photo masks may be decreased, which is advantageous.

In addition, in the planarization process described above, the color filters are planarized by performing the polishing (CMP) process. However, the present invention is not limited thereto. Thus, the color filters may be planariazed by etching the entire face of the color filters (etch back process) by using the same method as used in the dry etching process described above.

[Coloring Composition]

The coloring composition forming the color filter will be described as below. The light-curable component of the coloring composition may be eliminated by being patterned through dry etching. In a coloring composition having a little light-curable component or preferably in a coloring composition of which the light-curable component is excluded, the density of the coloring agent may be raised. Accordingly, a color filter layer having a thickness smaller than a general color filter may be formed with the transmission spectroscopy thereof being maintained, which is difficult to be implemented. Therefore, the coloring composition is preferably a non-photoresistive curable composition that does not contain a light-curable component, and is more preferably a thermosetting composition.

Hereinafter, the thermosetting composition will be described. The thermosetting composition contains a coloring agent and a thermosetting compound. The density of the coloring agent in the total dissolved solid is preferably equal to or higher than 50 mass % and lower than 100 mass %. By increasing the density of the coloring agent, a color filter having a deceased thickness may be formed.

[Coloring Agent]

The coloring agent is not particularly limited. Thus, as the coloring agent, a mixture of one, two, or more types of known dyes and pigments may be used.

As the pigment, various inorganic pigments or organic pigments, which are known, may be used. It is preferable that the transmittance of a pigment is high, regardless of the pigment being an inorganic pigment or an organic pigment. Thus, a pigment having a decreased average particle diameter as much as is possible may be preferably used. In addition, in consideration of handling together, the average particle diameter of the pigment is preferably in the range of 0.01 μm to 0.1 μm, and is more preferably in the range of 0.01 μm to 0.05 μm.

As preferred pigments, there are pigments described below. However, the present invention is not limited thereto.

There are C.I. Pigment Yellow 11, 24, 108, 109, 110, 138, 139, 150, 151, 154, 167, 180, and 185; C.I. Pigment Orange 36 and 71; C.I. Pigment Red 122, 150, 171, 175, 177, 209, 224, 242, 254, 255, and 264; C.I. Pigment Violet 19, 23, and 32; C.I. Pigment Blue 15:1, 15:3, 15:6, 16, 22, 60, and 66; C.I. Pigment Green 7, 36, and 58. When the coloring agent is a dye, a non-photoresistive thermosetting coloring resin composition may be acquired by uniformly dissolving the dye in the composition.

A dye that may be used as the coloring agent is not particularly limited. Thus, as the coloring agent, a known dye used for a general color filter may be used. Regarding the chemical structure of the dye, dyes such as pyrazolazo, anilinoazo, tryphenylmethane, anthraquinone, anthrapyridone, benzylidene, oxonol, pyrazolonetriazorazo, pyridoneazo, cyanine, phenothiazine, pyroropyrazolazomethine, xanthane, phthalocyanine, benzopyran, and indigo may be used.

The content of the coloring agent in the total dissolved solid of the coloring thermosetting composition is not particularly limited but is preferably in the range of 30 to 60 mass %. By allowing the content to be equal to or higher than 30 mass %, chromaticity that is appropriate as a color filter may be acquired. In addition, by allowing the content to be equal to or lower than 60 mass %, light curing may be sufficiently performed, and thereby a decrease in the strength as a film may be suppressed.

[Thermosetting Compound]

The thermosetting compound is not particularly limited as long as the film-curing of the thermosetting compound may be performed through heating. For example, as the thermosetting compound, a compound having a thermosetting functional group may be used. For example, the thermosetting compound is preferably a compound having at least one group selected from among an expoxy group, a methylol group, an alkoxymethyl group, and an acyloxymethyl group.

As a more preferable thermosetting compound, there are: (a) an epoxy compound; (b) a melamine compound, a guanamine compound, a glycol urile compound, or an urea compound that is substituted by at least one substituent group selected from among a methylol group, an alkoxymethyl group, and an acyloxymethyl group; and (c) a phenol compound, a naphthol compound, or a hydroxyanthracene compound that is substituted by at least one substituent group selected from among a methylol group, an alkoxymethyl group, and an acyloxymethyl group. Among the compounds described above, as the thermosetting compound, an epoxy compound having multiple functional groups is further more preferably used.

Although a total content of the thermosetting compound in the coloring thermosetting composition differs based on the material, the total content with respect to the total dissolved solid (mass) of the thermosetting composition is preferably 0.1 to 50 mass %, is more preferably 0.2 to 40 mass %, and is further more preferably 1 to 35 mass %.

[Various Additives]

In the coloring thermosetting composition, in the range not diminishing the effect of the present invention, as is necessary, various additives, for example, a binder, a curing agent, a curing catalyzer, a solvent, a filler, other polymer compounds, surfactant, an adherence agent, antioxidant, ultraviolet absorber, a deflocculating agent, dispersant, or the like may be compounded.

[Photoresist]

As described above, in a case where the color filters of the first to third colors are formed by using the dry etching method, a resist pattern is formed by using a photoresist. In addition, also in a removal process, it is preferable that a resist pattern is formed by using a photoresist.

As a positive-type photosensitive resin composition, a positive resist composition that is very appropriate as a positive-type photoresist that is sensitive to radioactive rays such as ultraviolet rays (mercury lamp g line, h line, and i line), far-ultraviolet rays including excimer laser, electron rays, ion beams, and X rays may be used. Among the radioactive rays, the g line, the h line, and the i line are preferably used for exposing the photosensitive resin layer, and the i line is the more preferably used.

In particular, as the positive-type photosensitive resin composition, a composition that contains a quinone diazide compound and alkali-soluble resin is preferably used. The positive-type photosensitive resin composition containing a quinone diazide compound and alkali-soluble resin is used as a positive-type photoresist by using a phenomenon in which a quinon diazide group is decomposed by irradiation of light having a wavelength of 500 nm or less so as to generate a carboxyl group, so that the resin composition is changed from the alkali-non-soluble state to the alkali-soluble state. Since this positive-type photoresist has superior resolving power, the photoresist is widely used in a semiconductor manufacturing process. As the quinon diazide compound, there is a naphto quinone diazide compound.

Any type of a developing solution may be used as long as the developing solution does not have influence on the peripheral light shielding layer and dissolves the exposed portion of the photoresist and an uncured portion of the negative resist. In particular, a combination of various organic solvents or alkali water solution may be used.

In the description presented in the process of forming the color filter, an example in which the color filters of primary colors including red (R), green (G), and blue (B) are generated has been described. However, the colors are not limited thereto. Thus, such a process may be used in a case where color filters of complementary colors using magenta, yellow, and green are manufactured.

[Overcoat]

An overcoat layer is a layer that is formed on a color filter so as to protect the color filter from the following processes. Thus, the overcoat layer is also referred to as a protection layer. As the material of the overcoat layer, a polymer material such as acrylic resin, polysiloxan resin, polystylene resin, or fluorine resin or an inorganic material such as silicon oxide or silicon nitride may be appropriately used. In a case where photosensitive resin such as polystylene resin is used, the overcoat layer may be patterned by using a photolithographic method. Accordingly, in such a case, the overcoat layer may be used as a photoresist when the peripheral light shielding layer 113, the sealing layer 110, the insulating layer 102, and the like that are disposed on a bonding pad are formed to be open, and the overcoat layer may be processed into a micro lens in an easy manner, which are advantageous. On the other hand, the overcoat layer may be used as a reflection preventing layer, and various low-refractive index materials used for the partition wall of the color filters are preferably formed as a film. In addition, in order to improve the function as the protection layer for the following processes or the function of the reflection preventing layer, the overcoat layer may be configured to have two or more layers formed from the materials described above.

[Micro Lens]

By forming the overcoat layer as a micro lens or forming a micro lens on the overcoat layer, the light collecting efficiency may be further improved, and the crosstalk may be further suppressed. In the example described above, a configuration in which a micro lens is omitted is used. However, by partitioning the color filters by using a low-refractive index partition wall, the light collecting efficiency is sufficiently improved, and the crosstalk is sufficiently suppressed. The formation of the micro lens may be appropriately determined in consideration of the manufacturing cost and the level of difficulty in optical design.

<Another Configuration Example of Solid-State Image Pickup Apparatus>

Another configuration example of the solid-state image pickup apparatus will be described. In the configuration example described below, to each member or the like that has a configuration and a reaction that are equivalent to those of the above-described member or the like, a same reference sign or a corresponding reference sign is attached in the figure. Thus, the description thereof will be simplified or omitted.

Figure 59:
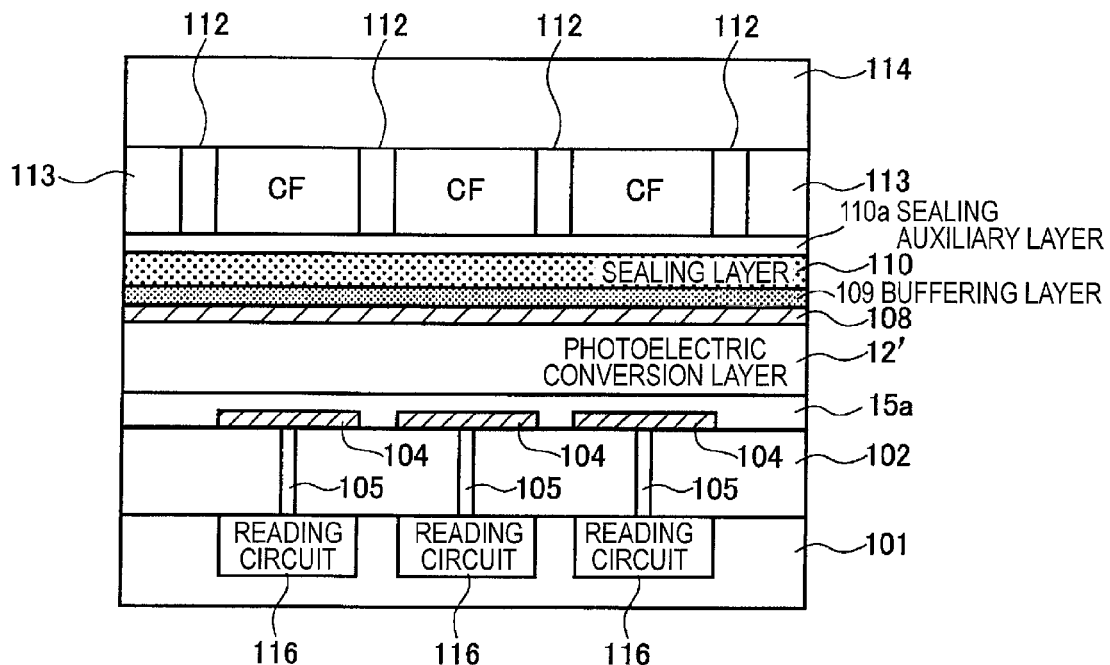
FIG. 59 is a cross-sectional view of another configuration example of the solid-state image pickup apparatus.

FIG. 59 is a schematic cross-sectional view of another configuration example of the solid-state image pickup apparatus. In the solid-state image pickup apparatus of this configuration example, pixel electrodes 104 are disposed on the surface of the insulating layer 102. In addition, an electric charge blocking layer 15a is disposed so as to cover the insulating layer 102 and the pixel electrodes 104. The electric charge blocking layer 15a has a function of suppressing injection of electrons from the pixel electrodes 104 to the photoelectric conversion layer 12'. In this configuration example, a configuration in which the electric potential of the opposing electrode 108 is set to be higher than that of the source of the reset transistor included in the reading circuit 116, and an electric current flows from the opposing electrode toward the pixel electrodes 104 (in other words, holes are collected in the pixel electrodes 104) is used.

The reading circuit 116, as shown in FIG. 3 as an example, is configured by an FD, a reset transistor, an output transistor, and a selection transistor. These transistors are configured by nMOS transistors. The reading circuit 116, the wiring layer including the via plug 105, the insulating layer 102 and the pixel electrodes 104 shown in the figure are manufactured through a standard CMOS image sensor process. The pixel electrode 104 is formed from TiN (film thickness 15 nm) by using a CVD method, and the surface roughness thereof is Ra=0.4 nm. In addition, in the dry etching process for the TiN, by applying an isotrophic plasma etching condition, a tilted face is formed in the end portion of the pixel electrode 104, and the pixel electrode is patterned such that the tilted face is tilted by 50 degrees from the substrate.

The electric charge blocking layer 15a is formed by depositing a compound having the following Formula (2) so as to have a film thickness of 100 nm. In addition, by co-depositing a compound having the following Formula (3) and fullerene C60 such that the C60 composition is 80%, the photoelectric conversion layer 12 is formed to have a film thickness of 400 nm. The electron affinity Ea of C60 included in the photoelectric conversion layer is Ea=4.2 eV, and the ionization potential Ip of the compound of Formula (2) that forms the electric charge blocking layer 15a is Ip=5.2 eV. Accordingly, $\Delta 1$=1.0 eV, and the photoelectric conversion device having this configuration may effectively suppress a dark current. Furthermore, the electron affinity Ea of the compound having Formula (2) that forms the electric charge blocking layer 15a is Ea=1.9 eV, and the work function of TiN that forms the pixel electrode 104 is 4.5 eV. Accordingly, $\Delta 2$=2.6 eV. Therefore, in the photoelectric conversion device having this configuration, injection of electrons from the pixel electrode 104 to the photoelectric conversion layer 12' is suppressed. In the deposition process described above, the degree of vacuum is equal to or lower than $1 \times 10^{-4}$ pa, and the electric charge blocking layer 15a and the photoelectric conversion layer 12' are formed in the first area (see FIG. 1) with the first metal mask arranged on the upper side of the substrate. In addition, the work function and Ip of each layer are measured by using an atmospheric photoelectron spectrometer (AC-2 manufactured by Riken Keiki Co., Ltd.). In addition, Ea of each layer is calculated by acquiring energy Eg of the absorption edge from the spectrum absorption of the corresponding layer and subtracting the value of Eg from the value of Ip of the corresponding layer (Ea=Ip−Eg).

[Chemical Formula 2]

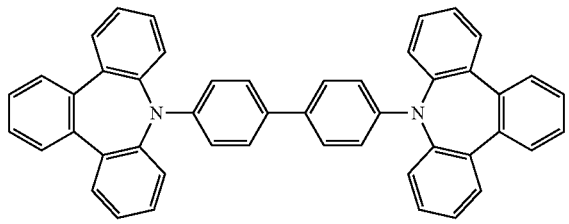

[Chemical Formula 3]

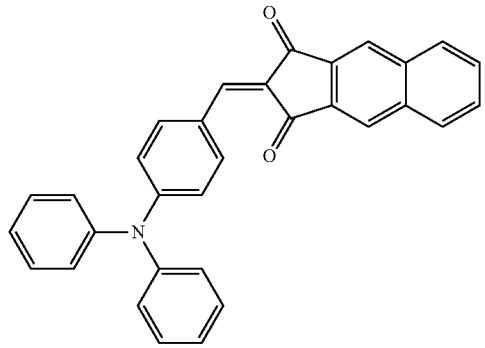

The opposing electrode 108 is formed from ITO to have a film thickness of 10 nm under an atmosphere of introduction of Ar gas and $O_2$ gas and the degree of vacuum of 0.1 Pa by using a high-frequency magnetron sputter using an ITO target. In addition, the second metal master is arranged on the upper side of the substrate, and the opposing electrode is formed in the second area.

As the buffering layer 109, silicon monoxide is vacuum-deposited to have a film thickness of 100 nm. In this deposition process, the degree of vacuum is set to be equal to or lower than $1 \times 10^{-4}$ Pa, and the buffering layer 109 is formed in the third area with the third metal master arranged on the upper side of the substrate.

An organic EL manufacturing apparatus is used in which a vacuum deposition device, which forms the electric charge blocking layer 15a, the photoelectric conversion layer 12', the opposing electrode 108, and the buffering layer 109 as films, and a sputtering device, which forms the opposing electrode 108 as a film, are directly connected to a clustering-type vacuum transport system having a degree of vacuum of $1 \times 10^{-4}$ Pa or less.

As the sealing layer 110, aluminum oxide having a film thickness of 0.2 μm is formed by using trimethyl aluminum and water by an atomic layer deposition device at the temperature of the substrate equal to or lower than 150° C. under an atmosphere of a degree of vacuum of 0.5 kPa with Ar used as a carrier gas.

In addition, on the sealing layer 110, a sealing auxiliary layer 110a formed from silicon nitride having a film thickness of 0.1 μm is formed. The sealing auxiliary layer 110a is formed under an atmosphere of introduction of Ar gas and $N_2$ gas and the degree of vacuum of 0.1 Pa by using a high-frequency magnetron sputter using a silicon nitride target.

The color filer CF, the partition wall 112, the light shielding layer 113, and the overcoat layer 114 are formed in the same order as that of the configuration example described above.

Figure 60:
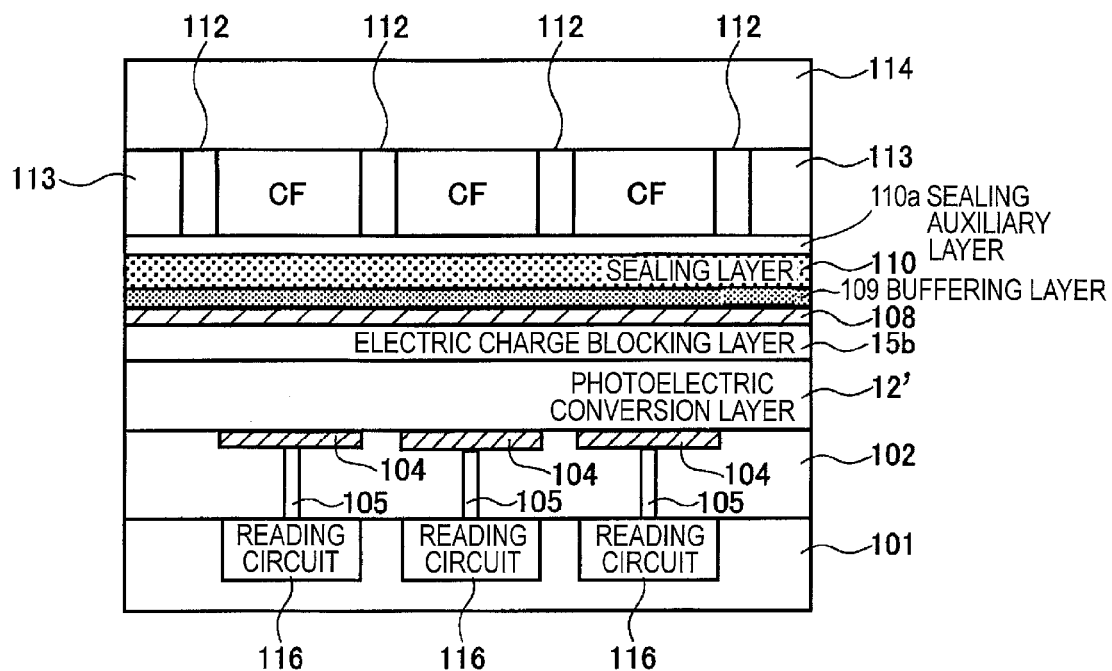
FIG. 60 is a cross-sectional view of another configuration example of the solid-state image pickup apparatus.
Figure 61:
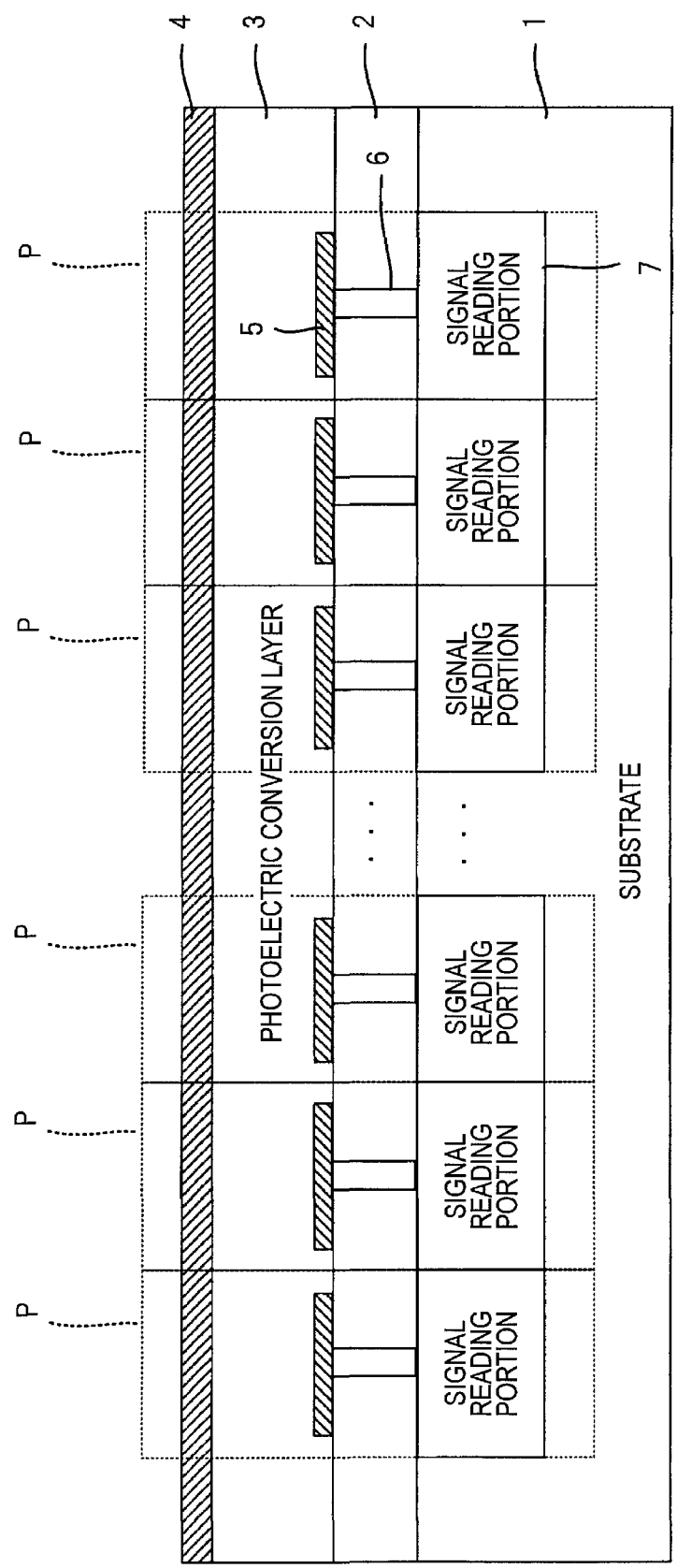
FIG. 61 is a schematic diagram showing the cross-section of a conventional stacked-type image pickup device.
Figure 62:
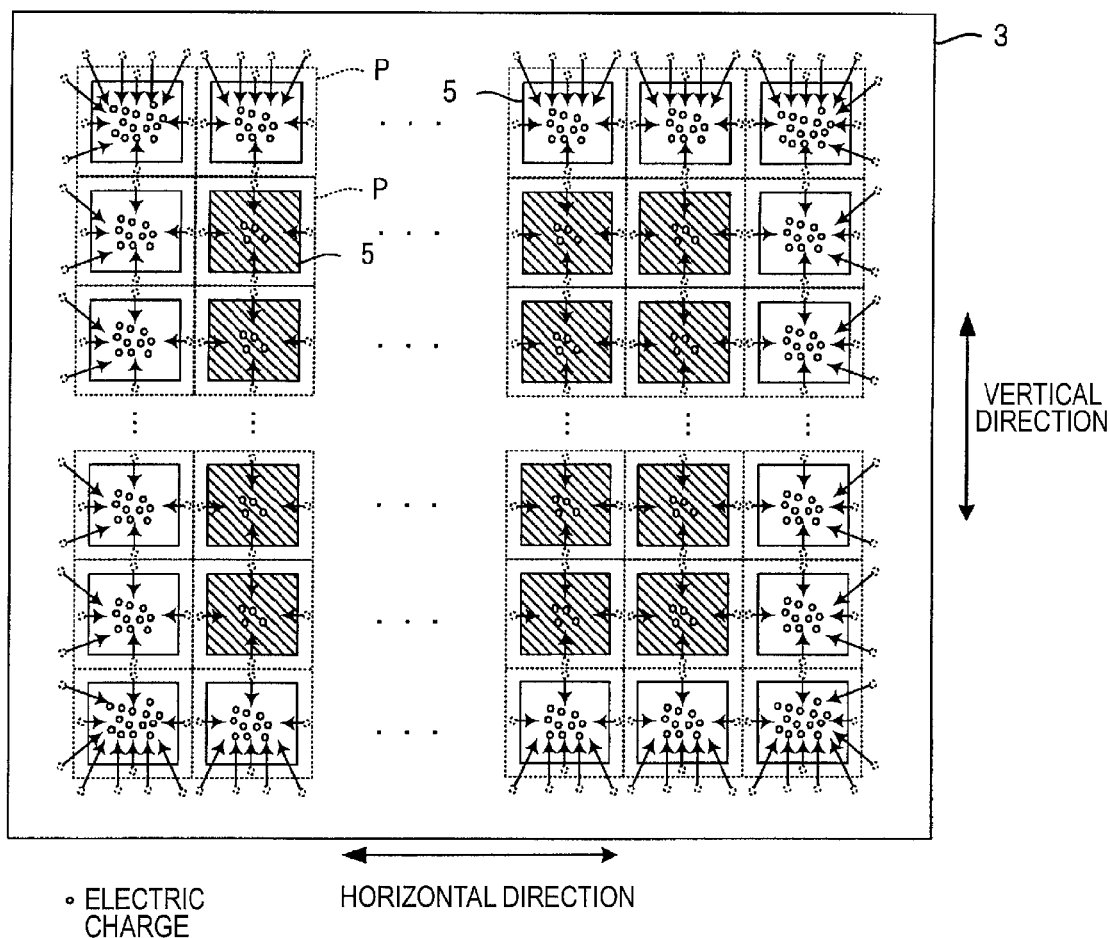
FIG. 62 is a schematic plan view of a conventional stacked-type image pickup device.
Figure 63:
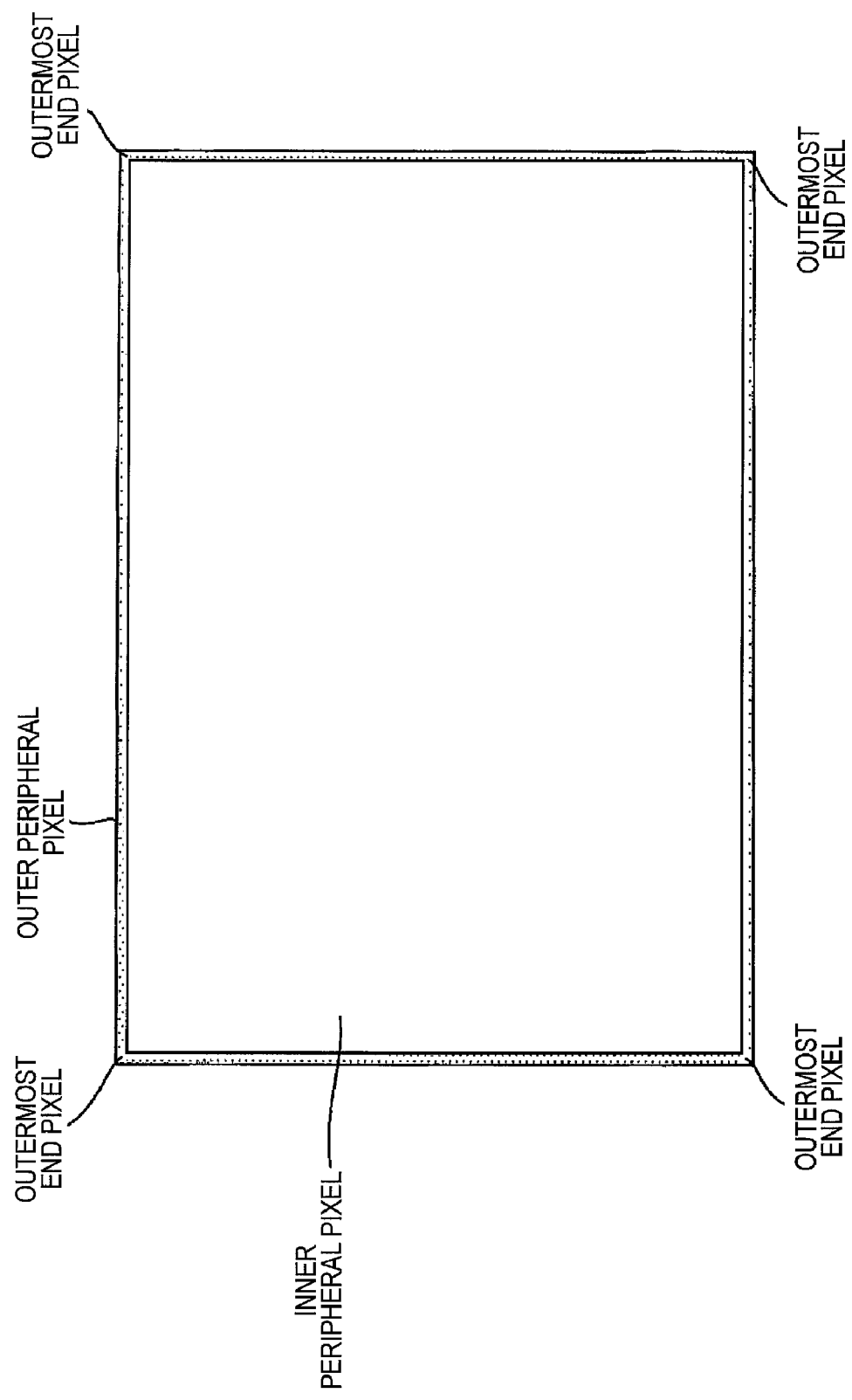
FIG. 63 is a diagram representing an example of a picked-up image that may be acquired when an image pickup operation is performed at a constant amount of light by using the image pickup device shown in FIGS. 61 and 62.

FIG. 60 is a schematic cross-sectional view of another configuration example of the solid-state image pickup apparatus. The solid-state image pickup apparatus of this configuration example is configured such that the surface of the insulating layer 102 and the surface of the pixel electrode 104 are formed on the same plane, and the pixel electrodes are completely planarized. In addition, the photoelectric conversion layer 12' is disposed so as to cover the insulating layer 102 and the pixel electrodes 104. On the photoelectric conversion layer 12', the electric charge blocking layer 15b is disposed. The electric charge blocking layer 15b has a function of suppressing injection of electrons from the opposing electrode 108 to the photoelectric conversion layer 12'. In this configuration, a configuration in which the electric potential of the opposing electrode 108 is set to be lower than that of the source of the reset transistor included in the reading circuit 116, and an electric current flows from the pixel electrode 104 toward the opposing electrode 108 (in other words, electrons are collected in the pixel electrode 104) is used.

The reading circuit 116 includes an FD, a reset transistor, an output transistor, and a selection transistor. These transistors are configured by pMOS transistors. The pixel electrode 104 is configured by a low-resistance layer that is brought into contact with the via plug 105 connected to the FD and is formed from Al and a surface layer that is formed from TiN. The pixel electrode 104 is formed by using the groove separating method described above. A multiple-layer wiring including the insulating layer 102, the pixel electrodes 104, and the via plug 105 and the reading circuit 116 are manufactured by a standard CMOS image sensor process.

As the photoelectric conversion layer 12', a compound having Formula (3) and C60 are co-deposited so as to have a film thickness of 400 nm such that the composition of C60 is 80%. As the electric charge blocking layer 15b, the compound having Formula (3) is deposited to have a film thickness of 20 nm, and then, a compound having the following Formula (4) is deposited to have a film thickness of 300 nm. The electron affinity of C60 included in the photoelectric conversion layer is Ea=4.2 eV, and the ionization potential of the compound having Formula (3) that is brought into contact with the photoelectric conversion layer in the electric charge blocking layer 15b is Ip=5.4 eV. Thus, Δ1=1.2 eV. Furthermore, since the photoelectric conversion layer and the electric charge blocking layer adjacent thereto contain the compounds having the same Formula (3), generation of an intermediate electric potential is prevented. According to the effects described above, the photoelectric conversion device having this configuration may effectively suppress a dark current. In addition, in the electric charge blocking layer 15b, the electron affinity of a compound having Formula (4) that is brought into contact with the opposing electrode 108 is Ea=1.9 eV, and the work function of ITO forming the opposing electrode 108 is 4.5 eV. Accordingly, Δ2=2.6 eV. Thus, according to the photoelectric conversion device having this configuration, injection of electrons from the opposing electrode 108 to the photoelectric conversion layer 12' is suppressed. In such a deposition process, the degree of vacuum is equal to or lower than $1 \times 10^{-4}$ Pa, and the photoelectric conversion layer 12' and the electric charge blocking layer 15b are formed in the first area by arranging the first metal mask arranged on the upper side of the substrate.

[Chemical Formula 4]

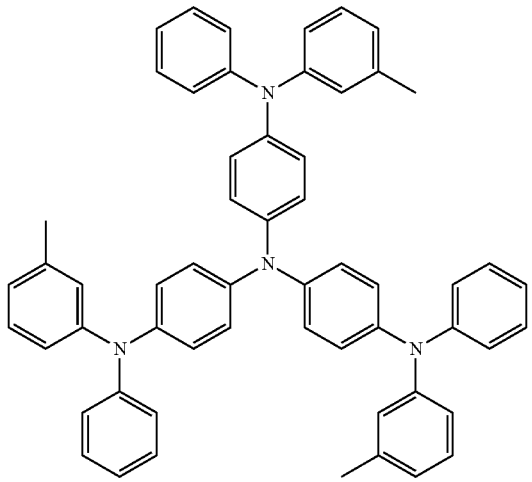

In the example of this configuration, the process of forming the opposing electrode 108, the buffering layer 109, the sealing layer 110, the sealing auxiliary layer 110a, the CF, the partition wall 112, the peripheral light shielding layer 113, and the overcoat layer 114 is the same as the configuration example of FIG. 59.

<Advantages and Uses of Stacked-type Solid Image Pickup Device>

Next, the advantages and uses of the solid-state image pickup apparatus described above will be described.
(Forming as Camera Module)

The solid-state image pickup apparatus uses one pair of electrodes and an organic layer interposed therebetween as the light sensing unit by replacing a general Si photo diode, and any other input or output is not necessary. Accordingly, in a case where the solid-state image pickup apparatus is built in as a camera module, a general module may be used. Therefore, a camera may be formed as a module in an easy manner.
(Chip Size)

The organic layer 107 and the opposing electrode 108 may be collectively formed for all the pixel portions. Accordingly, the solid-state image pickup apparatus according to the present invention may form a tiny chip to a large area chip in an easy manner by combining manufacturing technologies and manufacturing methods of the reading circuit 116, the multiple layer wiring including the via plug 105, and the pixel electrode 104 in accordance with the purpose. In the case of a tiny chip, the latest microscopic technology may be applied without any limitation by using a standard semiconductor manufacturing process. Accordingly, the minimization of the pixel size/maximization of the number of pixels and mass production may be achieved in an easy manner. On the other hand, in the case of a large area chip, low-cost mass production may be achieved by using a TFT process of a liquid crystal-type display device or the like.
(Pixel Size)

In an image sensor, the request for an increase in the number of pixels and a decrease in the cost is strong, and a decrease in the pixel size is ongoing now. As a result, it is difficult for a general image sensor using a Si photodiode to effectively guide light to the photodiode serving as a light sensing unit. In particular, the disadvantage is remarkable in a case where the pixel size is less than 2 μm. In the solid-state image pickup apparatus according to the present invention, the organic layer 107 is positioned on the upper side of the reading circuit. Accordingly, a fill factor may be large, whereby such a disadvantage may be avoided. Accordingly, even in a case where the microscopic process progresses further, and the pixel size is less than 2 μm, particularly about 1 μm, there is no practical disadvantage.

(Superiority in Cost)

According to the solid-state image pickup apparatus of the present invention, a micro lens and an infrared ray shielding filter that are necessary in a general image sensor may be omitted due to the configuration described above, and accordingly, the cost may be reduced. In other words, since the aperture ratio of the pixel exceeds 80%, the micro lens is not essential. In addition, since the photoelectric conversion layer may be configured with organic pigment that does not have sensitivity for infrared rays, an infrared cutoff filter may not be necessary.

(Superiority in Performance)

According to the solid-state image pickup apparatus of the present invention, an excellent picked up image may be acquired, compared to a general image sensor, through the configuration described above. First, since the aperture ratio of the pixel exceeds 80%, the amount of incident light is increased, and thereby high sensitivity may be implemented in an easy manner. In other words, an image may be picked up well even in a dark scene. In addition, since the amplitude of the reading circuit increases, the number of saturated electric charges may be increased. Furthermore, since high sensitivity and the increase in the number of saturated electric charges may be acquired together, the dynamic range may be widened. Accordingly, even in a scene having strong contrast, an image may be picked up well without halation or dark-area-grayscale deterioration.

(Use)

According to the solid-state image pickup apparatus of the present invention, high performance of a digital still camera or a digital video camera may be realized based on the above-described advantages. In addition, the solid-state image pickup apparatus is appropriate for the use as an endoscope that simultaneously requires high performance and miniaturization of the solid-state image pickup apparatus. Furthermore, in a cellular phone camera that strongly requires high performance, miniaturization, low costs of the solid-state image pickup apparatus, the configuration of the present invention is markedly superior to a general image sensor. In addition, the configuration of the present invention is not limited to the above-described uses, and may be used in a monitoring camera, a vehicle built-in camera, a robot camera, and the like.

As described above, in this specification, the followings are disclosed.

A disclosed image pickup device includes: a plurality of first electrodes that is arranged on an upper side of a substrate in two dimensions with a predetermined gap interposed therebetween; a second electrode that is arranged next to the first electrode, which is arranged on the outermost side, out of the plurality of first electrodes with the predetermined gap interposed therebetween; a third electrode that faces the plurality of first electrodes and the second electrode; a photoelectric conversion layer that is arranged between the plurality of first electrodes and the second electrode and the third electrode; signal reading portions that are connected to the plurality of first electrodes and read out signals corresponding to electric charge that is generated in the photoelectric conversion layer and move to the plurality of first electrodes; and an electric potential adjusting portion that is connected only to the second electrode and adjusts an electric potential of the second electrode such that the electric potential of the second electrode determined in accordance with electric charge that is generated in the photoelectric conversion layer and move to the second electrode does not exceed a predetermined range.

According to such a configuration, near each of the plurality of first electrodes, at least one of the first electrode and the second electrode is arranged with a predetermined gap interposed therebetween. Accordingly, for example, when an image is picked up at a constant amount of light, the amounts of electric charge moving to the first electrodes are almost the same, and thereby the electric potentials of all the first electrodes may be set to be almost the same. In addition, since the electric potential of the second electrode does not exceed a predetermined range, the influence of electric charge moving to the second electrode on the first electrodes may be prevented. As a result, when an image is picked up at a constant amount of light, the levels of signals corresponding to the electric charge accumulated in all the first electrodes may be uniformized, and thereby high image quality may be realized.

In the disclosed image pickup device, a reading portion that is used for reading out a signal corresponding to electric charge that is generated in the photoelectric conversion layer and move to the second electrode is not connected to the second electrode.

According to such a configuration, a signal corresponding to the electric charge moving to the second electrode is not externally read out. Accordingly, occurrence of unevenness in an image that is acquired by picking up the image may be prevented.

In the disclosed image pickup device, each of the signal reading portions is configured by a MOS transistor circuit that includes: a reset transistor used for resetting an electric potential of the first electrode; and an output transistor used for outputting a voltage signal corresponding to holes that are generated in the photoelectric conversion layer and move to the first electrode, each transistor of the MOS transistor circuit is an n-channel MOS transistor, and the electric potential adjusting portion adjusts an electric potential of the second electrode such that the electric potential of the second electrode determined in accordance with holes that are generated in the photoelectric conversion layer and move to the second electrode does not exceed a threshold value.

According to such a configuration, the influence of holes moving to the second electrode on the electric potential of the first electrode may be prevented.

In the disclosed image pickup device, each of the signal reading portions is configured by a MOS transistor circuit that includes: a reset transistor used for resetting an electric potential of the first electrode; and an output transistor used for outputting a voltage signal corresponding to electrons that are generated in the photoelectric conversion layer and move to the first electrode, each transistor of the MOS transistor circuit is a p-channel MOS transistor, and the electric potential adjusting portion adjusts an electric potential of the second electrode such that the electric potential of the second electrode determined in accordance with electrons that are generated in the photoelectric conversion layer and move to the second electrode is not below a threshold value.

According to such a configuration, the influence of electrons moving to the second electrode on the electric potential of the first electrode may be prevented.

In the disclosed image pickup device, the electric potential adjusting portion is a wiring that directly connects the second electrode and a power source to each other.

According to such a configuration, since the electric potential of the second electrode may be formed as a constant source electric potential, the electric potential of the second electrode may be prevented from exceeding a predetermined range.

In the disclosed image pickup device, the electric potential adjusting portion is a diode-connected transistor that is connected to the second electrode.

According to such a configuration, the electric potential of the second electrode may be prevented from exceeding a predetermined range.

In the disclosed image pickup device, the electric potential adjusting portion is a diode connected to the second electrode.

According to such a configuration, the electric potential of the second electrode may be prevented from exceeding a predetermined range.

In the disclosed image pickup device, the first electrodes and the second electrodes are arranged in a tetragonal lattice shape, and the electrodes, which are positioned on the outermost side, out of the electrodes arranged in the tetragonal lattice shape are configured as the second electrodes, and the other electrodes are configured as the first electrodes.

According to such a configuration, only the outermost periphery of the electrodes arranged in a tetragonal lattice shape need to be set as the second electrode, and thereby the configuration may be implemented without markedly changing the design of a general configuration.

In the disclosed image pickup device, the second electrode is configured by one electrode that is continuously formed so as to surround the plurality of first electrodes.

According to such a configuration, the degree of freedom of wiring layout under the second electrode is increased, and accordingly, the design of the electric potential adjusting portion may be performed in an easy manner.

In the disclosed image pickup device, the photoelectric conversion layer contains an organic material, and the predetermined gap is equal to or smaller than 3 μm.

According to such a configuration, generation of a lag may be suppressed.

A disclosed image pickup apparatus includes the image pickup device described above.

What is claimed is:

1. An image pickup device comprising:
   a plurality of first electrodes that is arranged on an upper side of a substrate in two dimensions with a predetermined gap interposed between one of the first electrodes and another first electrode adjacent to the one of the first electrode;
   a second electrode that is arranged next to the first electrodes arranged on an outermost side of the first electrodes with the predetermined gap interposed between the first electrodes arranged on the outermost side and the second electrode;
   a third electrode that faces both of the plurality of first electrodes and the second electrode;
   a photoelectric conversion layer that is disposed between the plurality of first electrodes and the second electrode and the third electrode;
   a plurality of signal reading portions that is connected to the plurality of first electrodes and reads out signals corresponding to electric charge that is generated in the photoelectric conversion layer and moved to the plurality of first electrodes; and
   at least one electric potential adjusting portion that is connected to the second electrode and adjusts electric potential of the second electrode such that the electric potential of the second electrode determined in accordance with electric charge that is generated in the photoelectric conversion layer and moved to the second electrode is not beyond a predetermined range.

2. The image pickup device according to claim 1, wherein a reading portion that is used for reading out a signal corresponding to the electric charge that is generated in the photoelectric conversion layer and moved to the second electrode is not connected to the second electrode.

3. The image pickup device according to claim 1, wherein each of the signal reading portions includes a MOS transistor circuit that includes: a reset transistor configured to reset an electric potential of the first electrode; and an output transistor configured to output a voltage signal corresponding to holes that are generated in the photoelectric conversion layer and moved to the first electrode,
   wherein each transistor of the MOS transistor circuit is an n-channel MOS transistor, and
   wherein the at least one electric potential adjusting portion adjusts an electric potential of the second electrode such that the electric potential of the second electrode determined in accordance with holes that are generated in the photoelectric conversion layer and moved to the second electrode does not exceed a threshold value.

4. The image pickup device according to claim 1,
   wherein each of the signal reading portions includes a MOS transistor circuit that includes: a reset transistor configured to reset an electric potential of the first electrode; and an output transistor configured to output a voltage signal corresponding to electrons that are generated in the photoelectric conversion layer and moved to the first electrode,
   wherein each transistor of the MOS transistor circuit is a p-channel MOS transistor, and
   wherein the at least one electric potential adjusting portion adjusts an electric potential of the second electrode such that the electric potential of the second electrode determined in accordance with electrons that are generated in the photoelectric conversion layer and moved to the second electrode is not below a threshold value.

5. The image pickup device according to claim 1, wherein the at least one electric potential adjusting portion is a wiring that directly connects the second electrode and a power source.

6. The image pickup device according to claim 1, wherein the at least one electric potential adjusting portion is a diode-connected transistor that is connected to the second electrode.

7. The image pickup device according to claim 1, wherein the at least one electric potential adjusting portion is a diode connected to the second electrode.

8. The image pickup device according to claim 1, wherein the first electrodes and the second electrode are arranged in a tetragonal lattice shape, and
   wherein the electrodes, which are positioned on the outermost side, out of the electrodes arranged in the tetragonal lattice shape are configured as the second electrode, and the other electrodes are configured as the first electrodes.

9. The image pickup device according to claim 1, wherein the second electrode is configured by one electrode that is continuously formed so as to surround the plurality of first electrodes.

10. The image pickup device according to claim 1,
   wherein the photoelectric conversion layer contains an organic material, and
   wherein the predetermined gap is equal to or smaller than 3 μm.

* * * * *